United States Patent [19]

Yamamoto et al.

[11] Patent Number: 5,600,757
[45] Date of Patent: Feb. 4, 1997

[54] FUZZY RULE-BASED SYSTEM FORMED ON A SINGLE SEMICONDUCTOR CHIP

[75] Inventors: Akiyasu Yamamoto, Yokohama; Takeo Arafune, Kamakura; Tadatoshi Ishii, Matsudo; Tetsuya Kitamura, Tokyo; Toshiaki Shirasuna; Yuichi Sekizawa, both of Yokohama, all of Japan

[73] Assignee: Kabushiki Kaisha Toshiba, Kawasaki, Japan

[21] Appl. No.: 421,024

[22] Filed: Apr. 13, 1995

Related U.S. Application Data

[63] Continuation of Ser. No. 891,165, May 29, 1992, abandoned.

[30] Foreign Application Priority Data

| May 31, 1991 | [JP] | Japan | 3-129870 |
| May 31, 1991 | [JP] | Japan | 3-129871 |
| May 31, 1991 | [JP] | Japan | 3-129876 |
| May 31, 1991 | [JP] | Japan | 3-129877 |
| May 31, 1991 | [JP] | Japan | 3-130015 |
| May 31, 1991 | [JP] | Japan | 3-130016 |
| Aug. 19, 1991 | [JP] | Japan | 3-206768 |
| Sep. 4, 1991 | [JP] | Japan | 3-223847 |
| Apr. 17, 1992 | [JP] | Japan | 4-98096 |

[51] Int. Cl.⁶ ............................. G06F 9/44; G06F 7/00
[52] U.S. Cl. ............................................. 395/3; 395/900
[58] Field of Search ............................. 395/3, 61

[56] References Cited

U.S. PATENT DOCUMENTS

| 4,837,725 | 6/1989 | Yamakawa | 395/3 |
| 4,875,184 | 10/1989 | Yamakawa | 395/3 |
| 5,179,629 | 1/1993 | Nakamura | 395/3 |

FOREIGN PATENT DOCUMENTS

| 0360256 | 3/1990 | European Pat. Off. . |
| 0361403 | 4/1990 | European Pat. Off. . |
| 0514879 | 11/1992 | European Pat. Off. . |
| 3927343 | 3/1990 | Germany . |
| 2-308334 | 12/1990 | Japan . |
| 6-90668 | 11/1994 | Japan . |

OTHER PUBLICATIONS

VLSI Fuzzy Chip and Inference Accelerator Board Systems; Watanabe et al; Proc. 21st Inter Sym Multiple–Valued Logic; 26–29 May 1991; pp. 120–127.

A Fuzzy Logic Controller with Reconfigurable Cascadable Architecture; Dentoff et al; Proc. 1989 IEEE Conf On Computer Design; 1989; pp. 474–478.

(List continued on next page.)

*Primary Examiner*—Robert W. Downs
*Attorney, Agent, or Firm*—Oblon, Spivak, McClelland, Maier & Neustadt, P.C.

[57] ABSTRACT

A one-chip fuzzy processing apparatus is constituted by integrating a grade calculation circuit for obtaining the grades of IF part membership functions corresponding to a variable value, a THEN part membership function generator for generating THEN part membership functions, a combining circuit for modifying the THEN part membership functions, and combining the modified membership functions, and a defuzzify circuit for defuzzifying the output from the combining circuit. The combining circuit includes a circuit for obtaining a minimum value of grades of the IF part membership functions for each fuzzy rule, a circuit for comparing an obtained minimum value with a THEN part membership function for each fuzzy rule to cut a peak of the THEN part membership function, and a maximum processor for combining the THEN part membership functions by obtaining a maximum value of the modified THEN part membership functions. The defuzzify circuit includes a circuit for obtaining a center of gravity of the membership function combined by the combining circuit. The THEN part membership function generator is constituted by a counter, and a circuit for sequentially outputting the grades of the THEN part membership functions using the count values from the counter as x-coordinate values.

10 Claims, 36 Drawing Sheets

OTHER PUBLICATIONS

Electronic Engineering, vol. 61, No. 750, Jun. 1989, pp. 75–77, "Fuzzy Logic Processor For Real–Time Control".

Proceedings of the 27th International Symposium on Multiple–Valued Logic, May 26–28, 1987, pp. 25–29, M. Togai, et al., "A Fuzzy Logic Chip and A Fuzzy Inference Accelerator For Real–Time Approximate Reasoning".

IEEE Journal of Solid–State Circuits, vol. 25, No. 2, Apr. 1990, pp. 376–382, H. Watanabe, et al., "A VLSI Fuzzy Logic Controller with Reconfigurable, Cascadable Architecture".

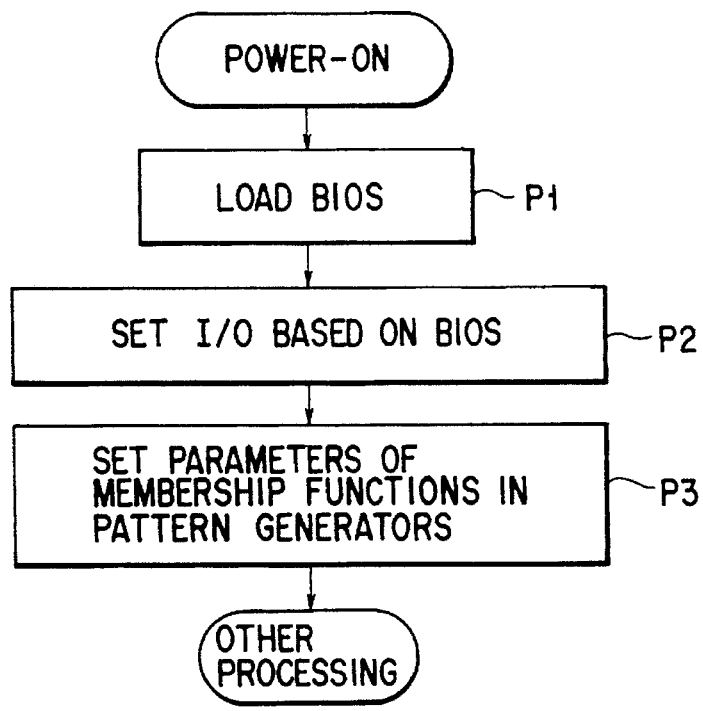
F I G. 4A
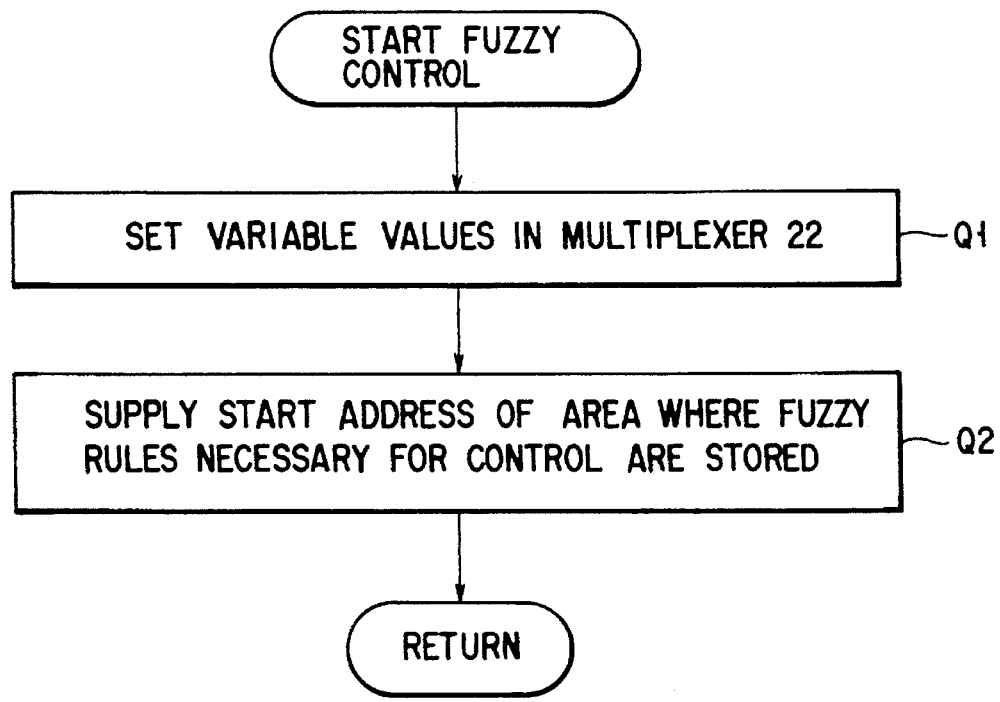
F I G. 4B

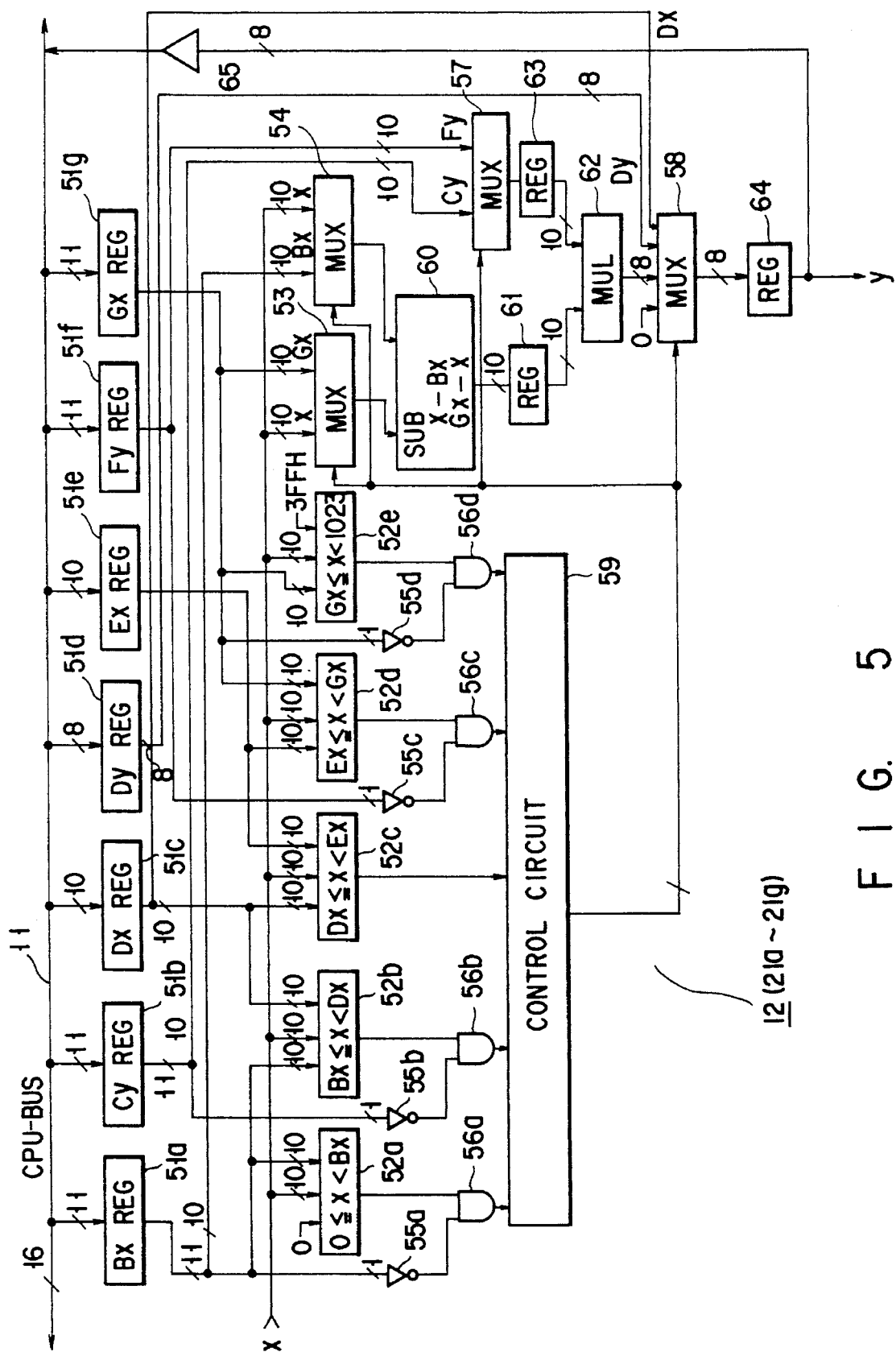
F I G. 5

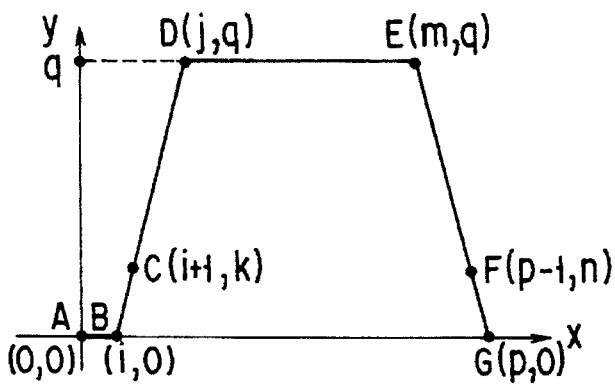
F I G. 6
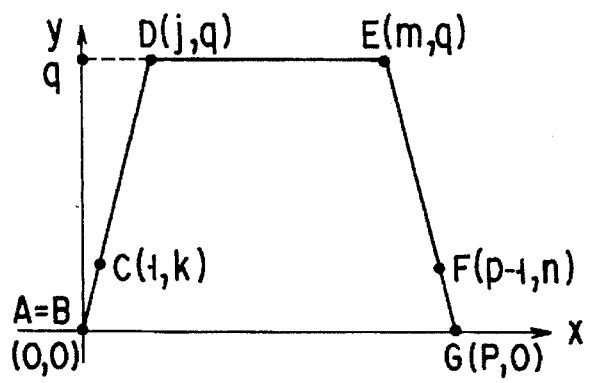
F I G. 7
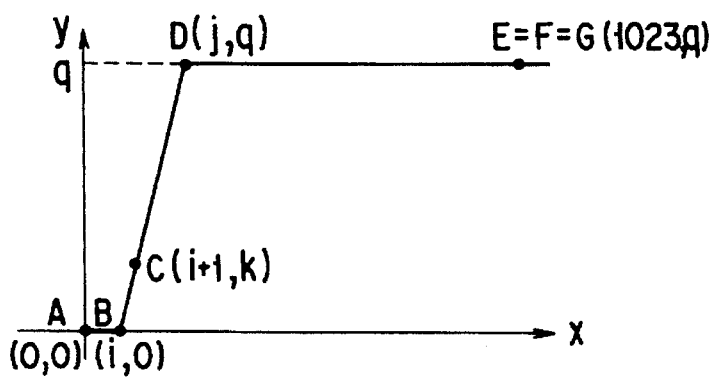
F I G. 8

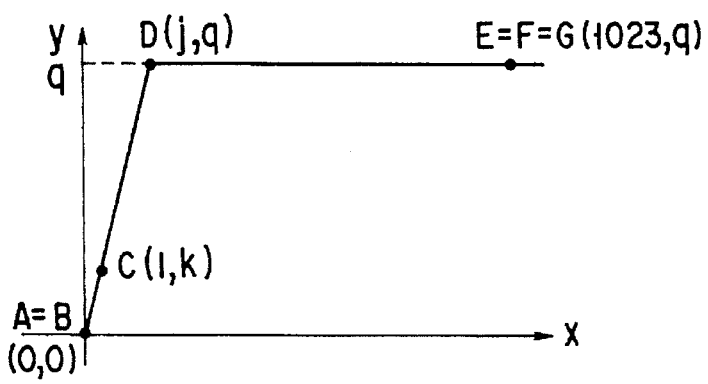
F I G. 9
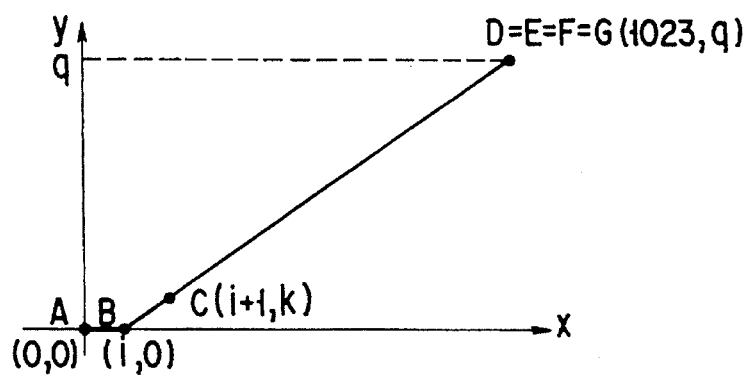
F I G. 10
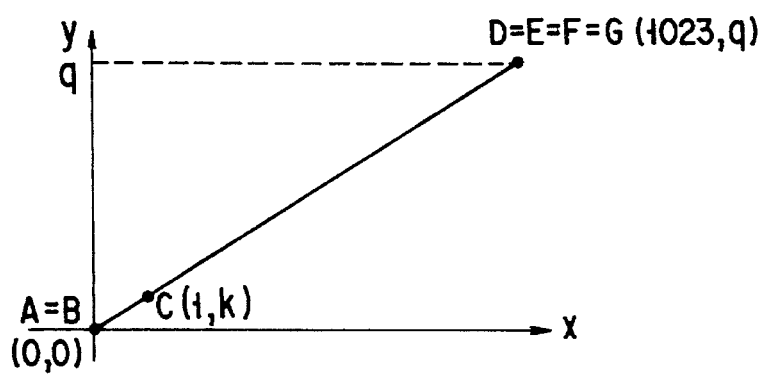
F I G. 11

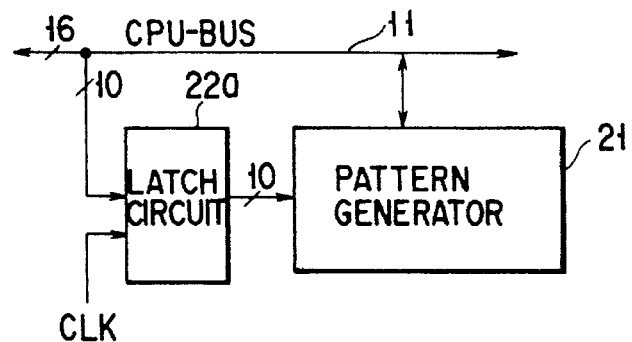
F I G. 18
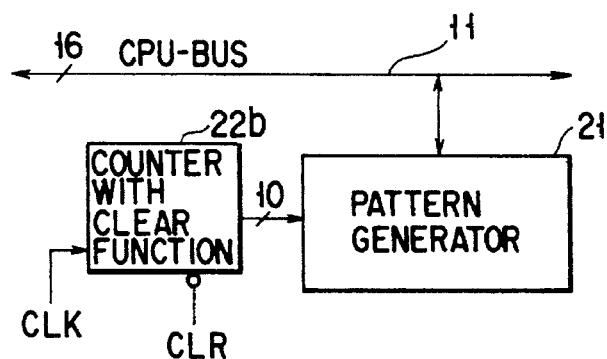
F I G. 19
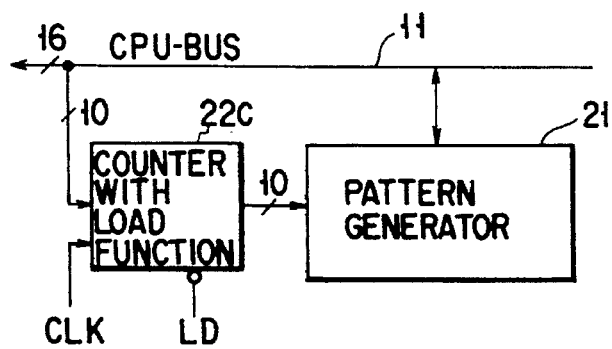
F I G. 20

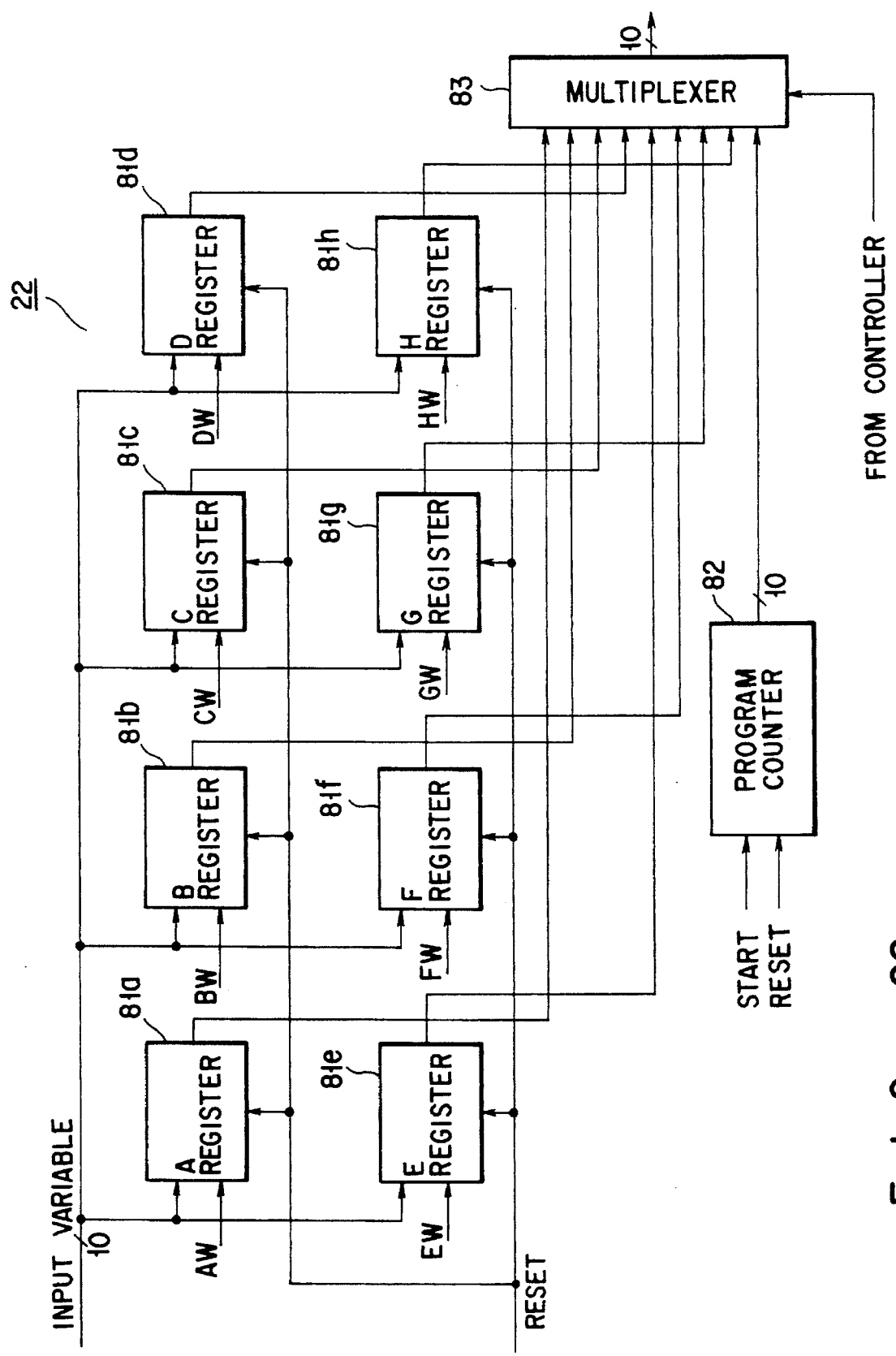
F I G. 22

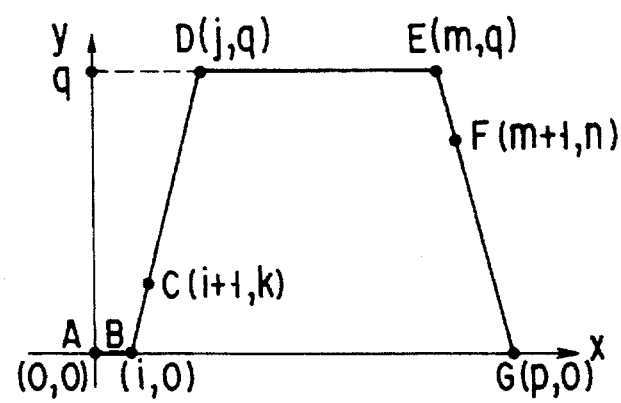
F I G. 25
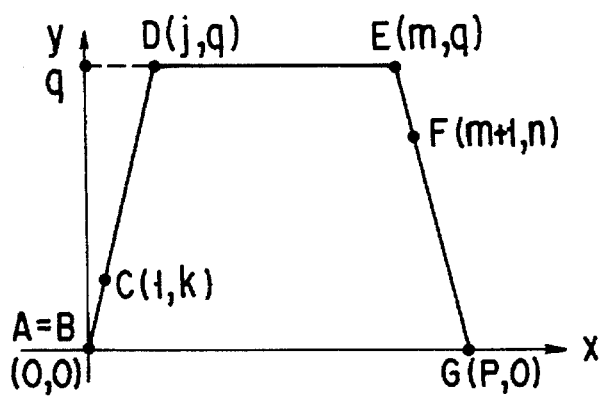
F I G. 26
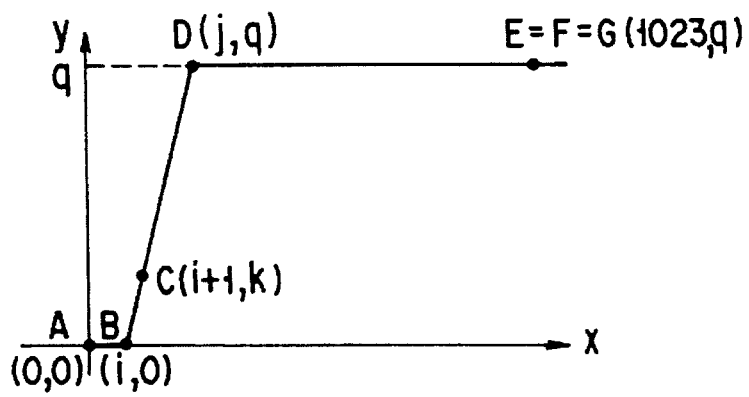
F I G. 27

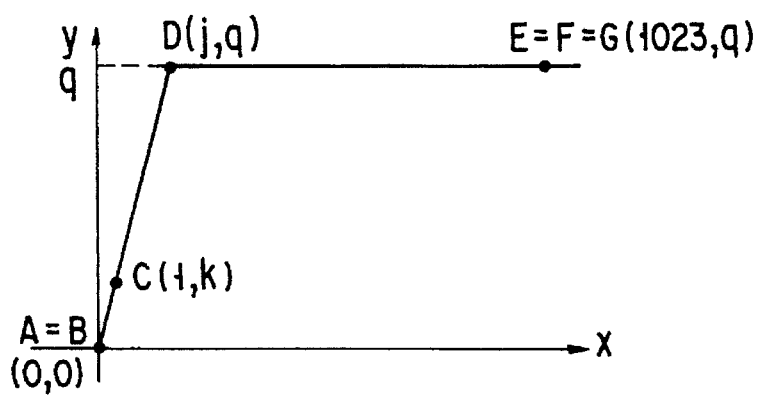
F I G. 28
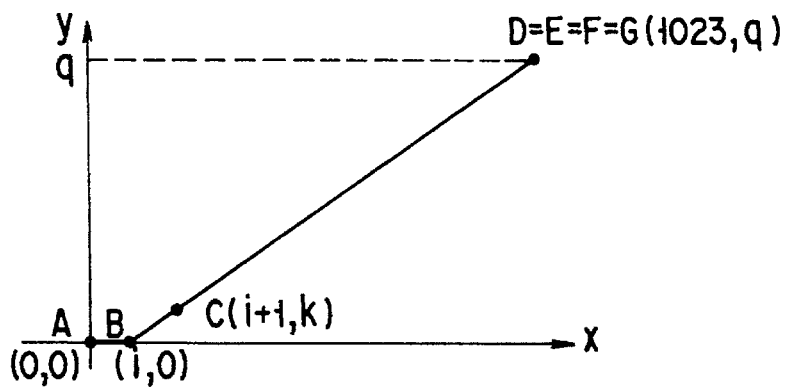
F I G. 29
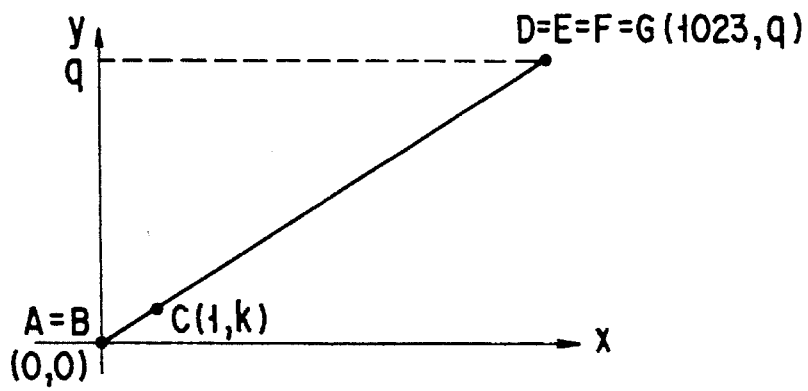
F I G. 30

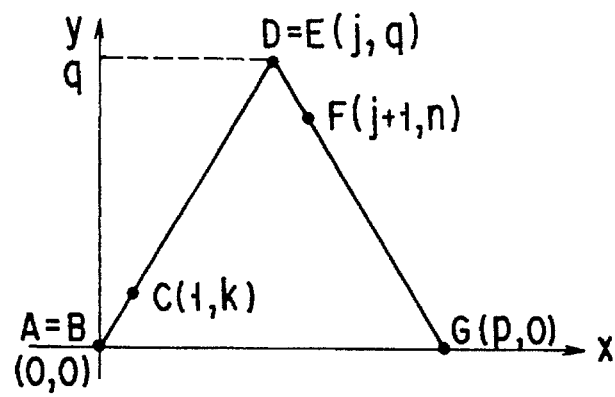
F I G. 34
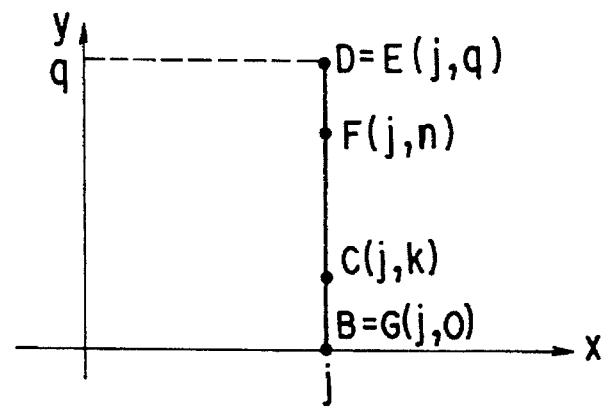
F I G. 35
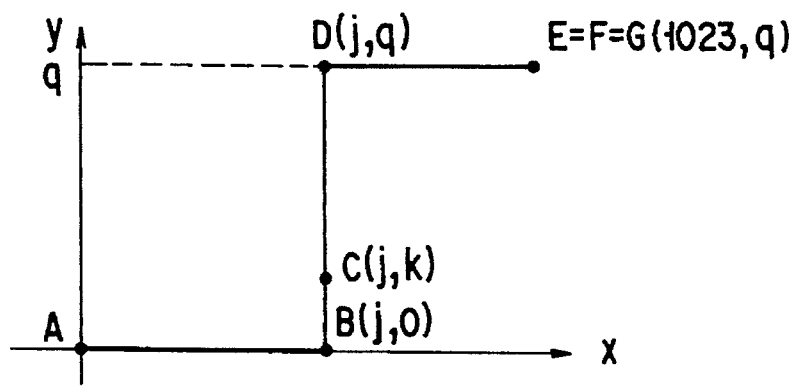
F I G. 36

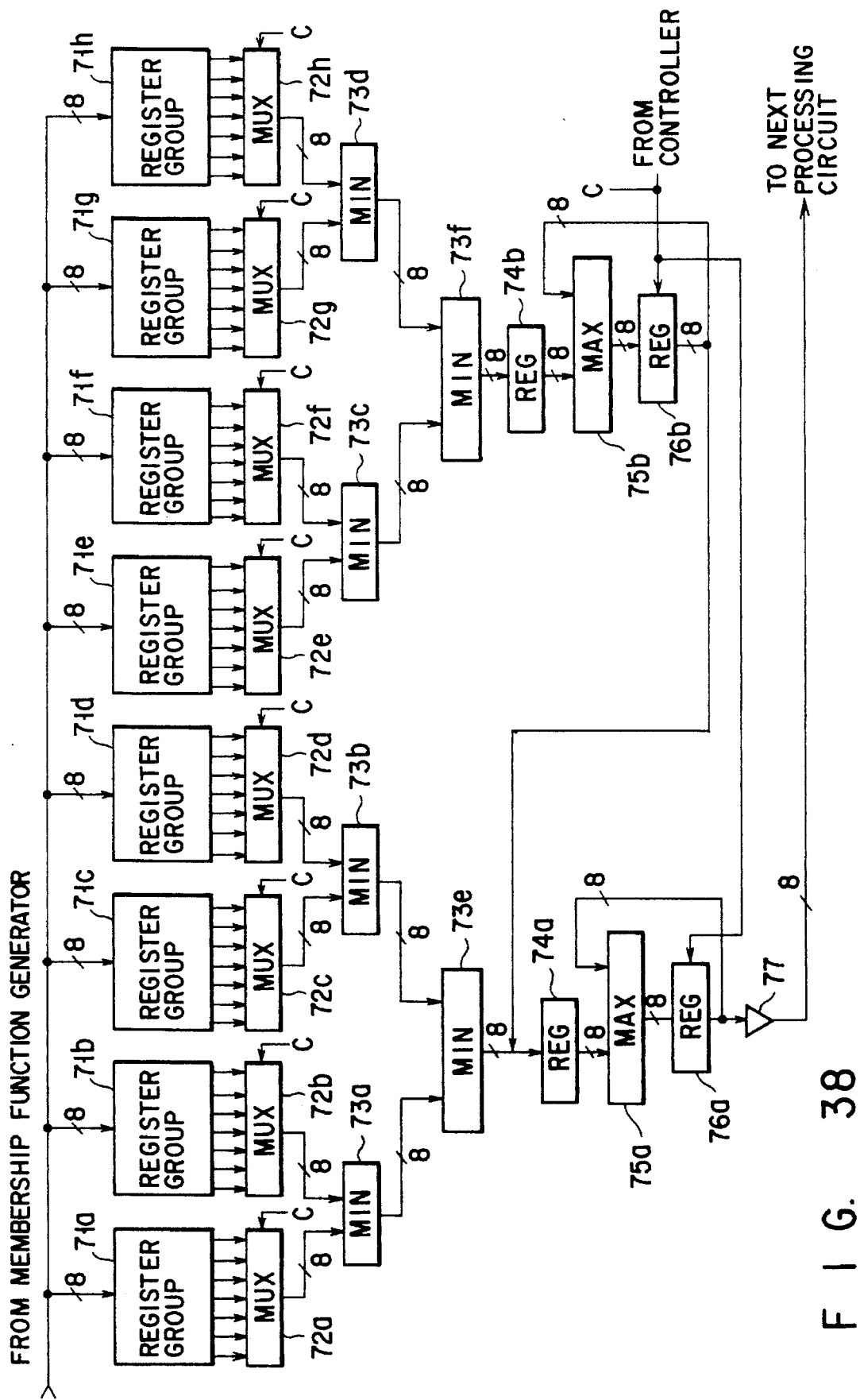
F I G. 38

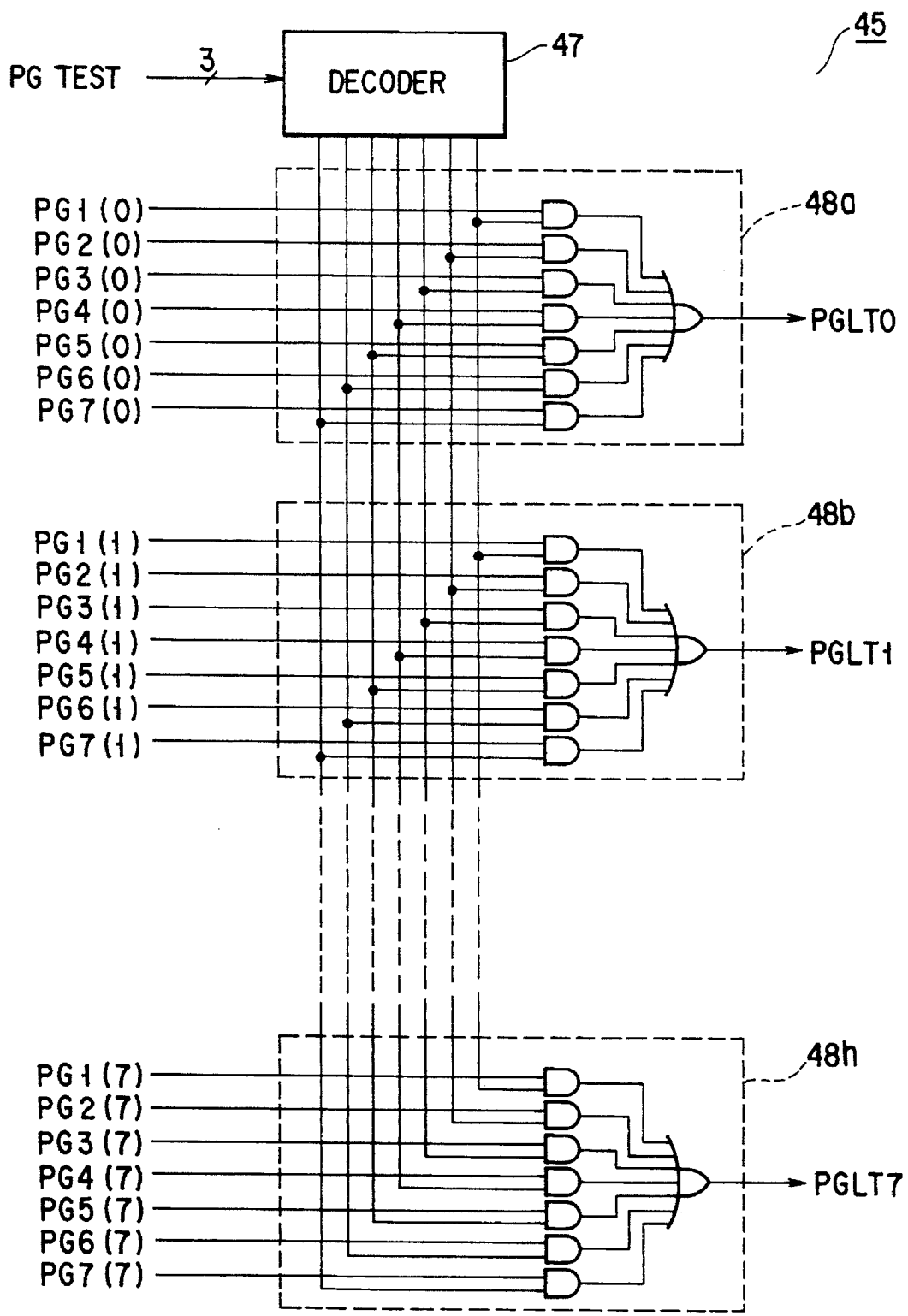
F I G. 42

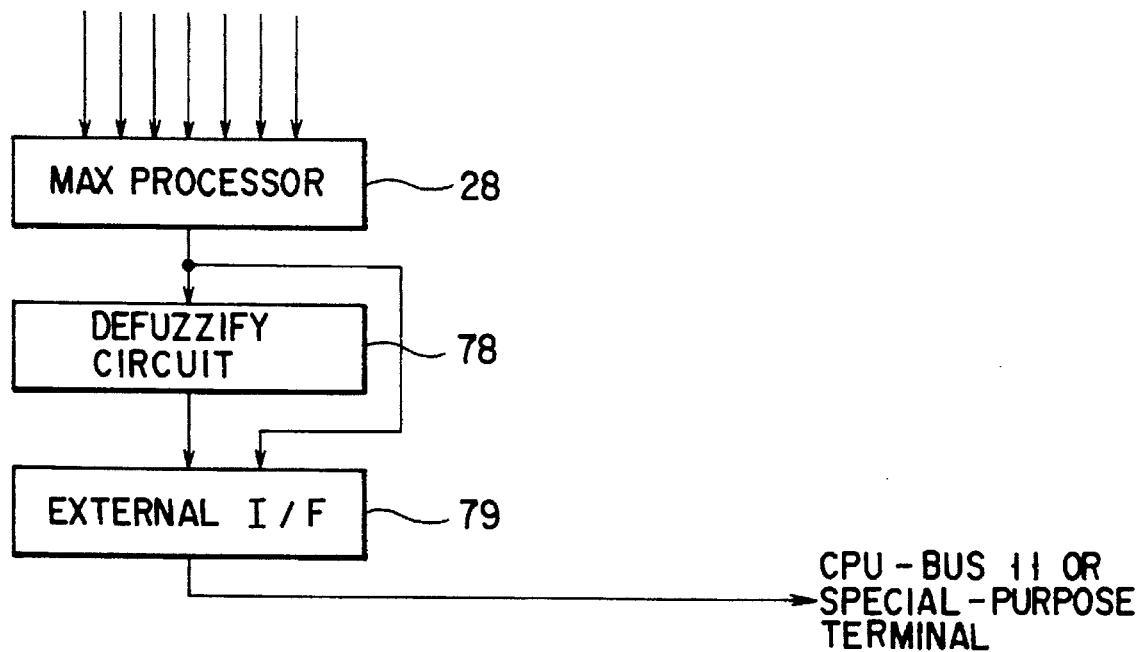
F I G. 43

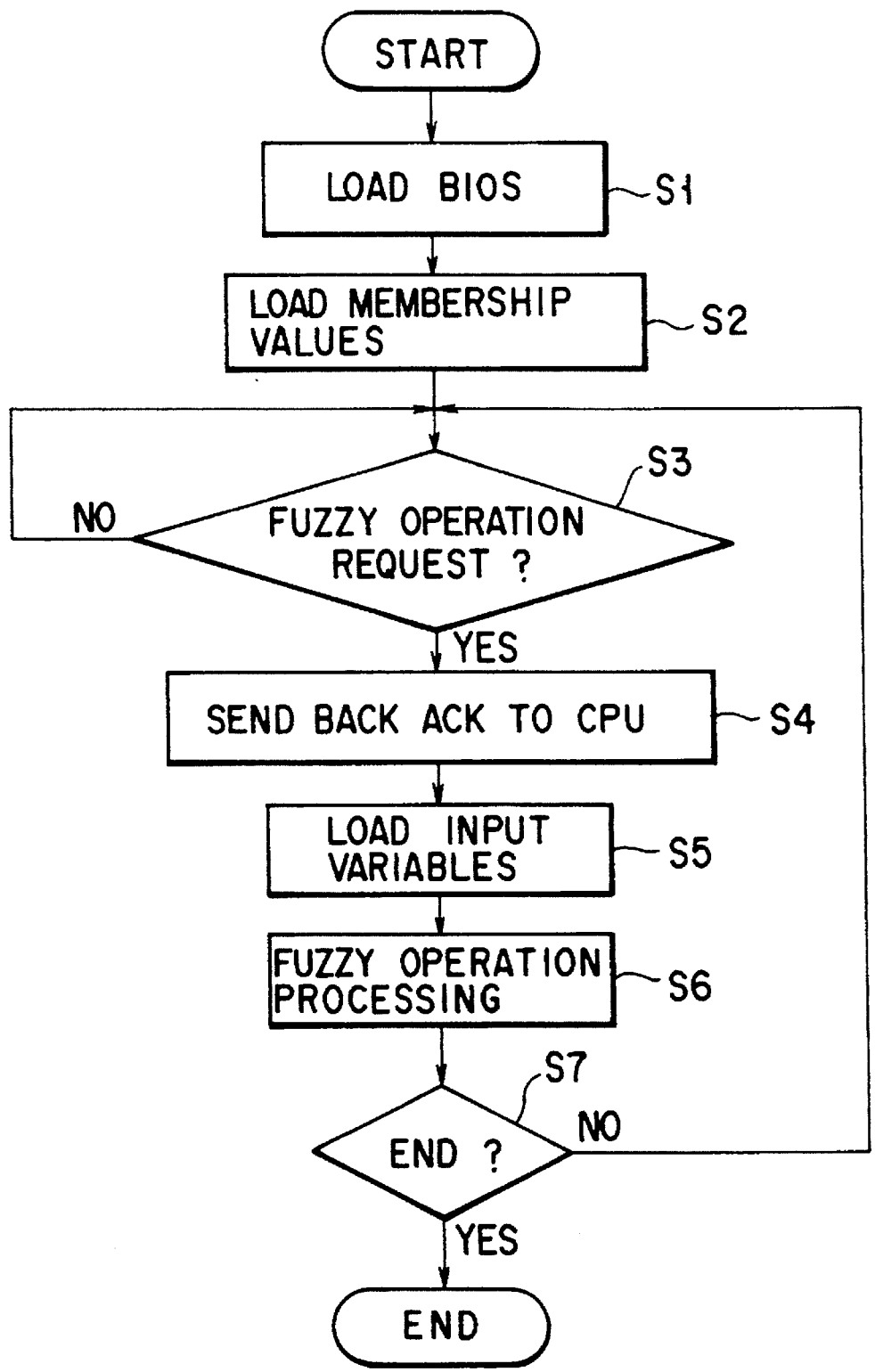
F I G. 47

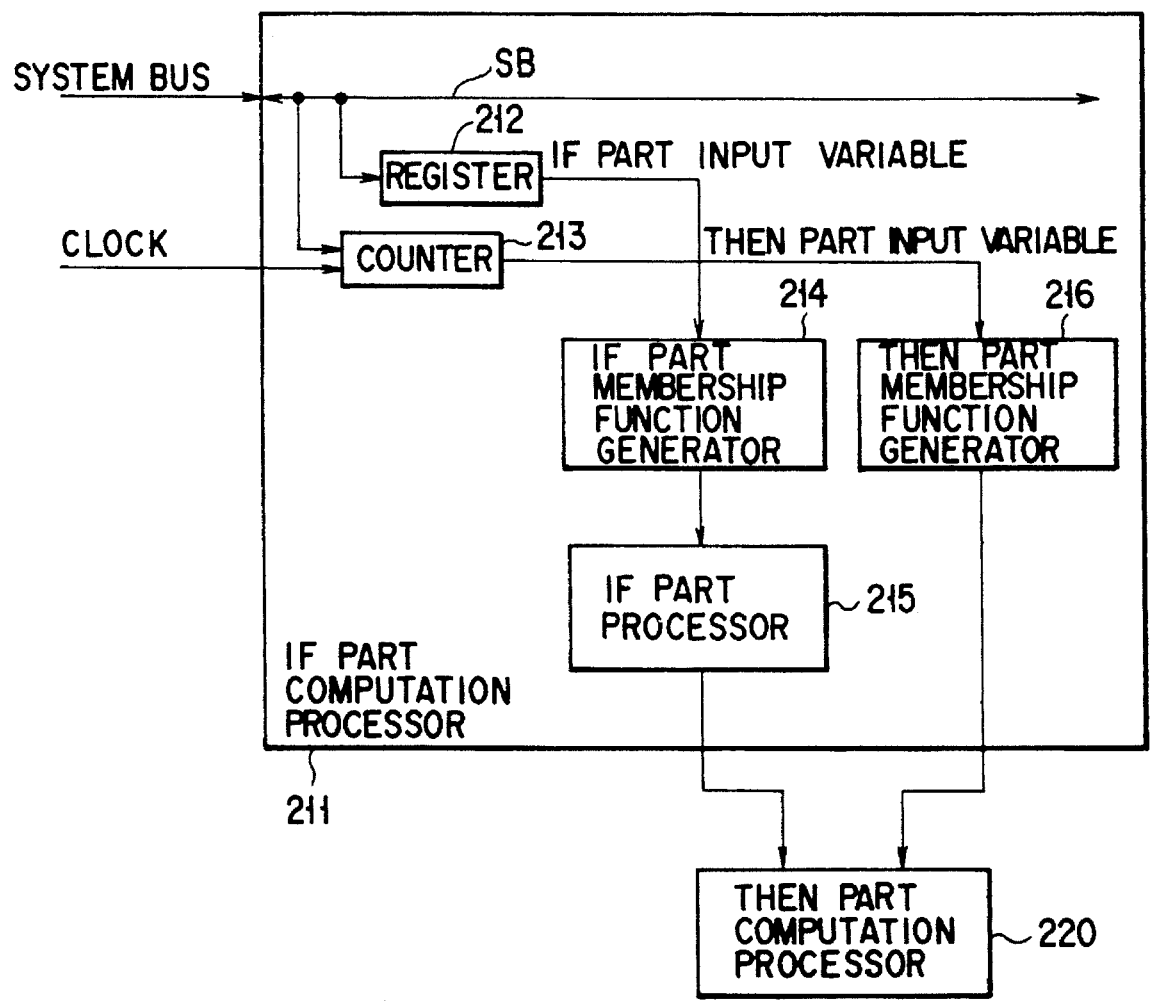
F I G. 48

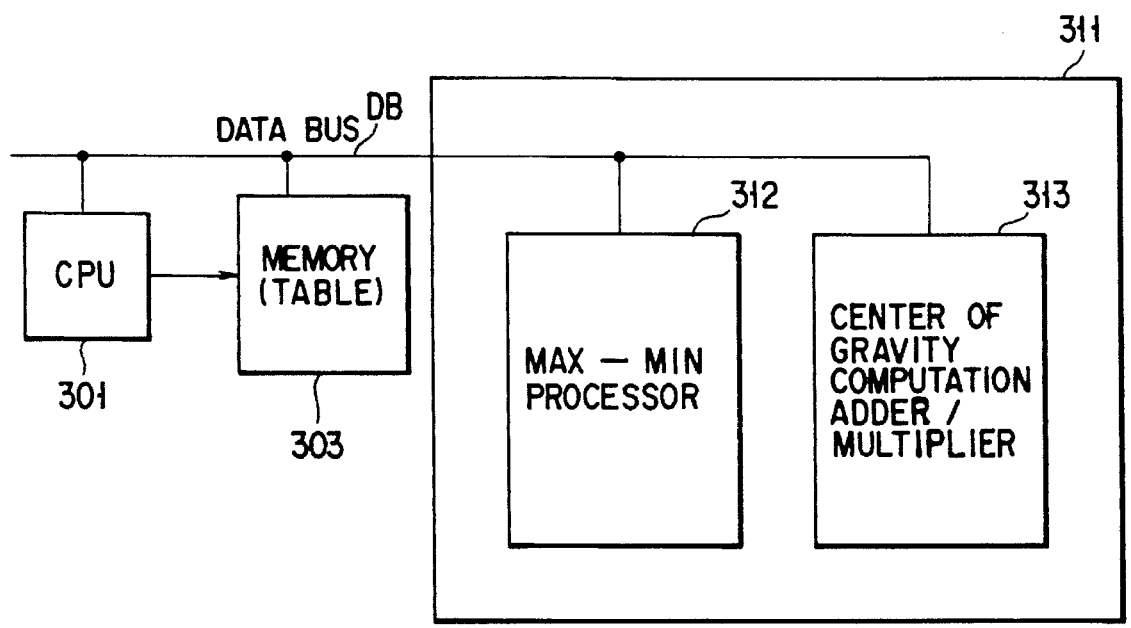
F I G. 50

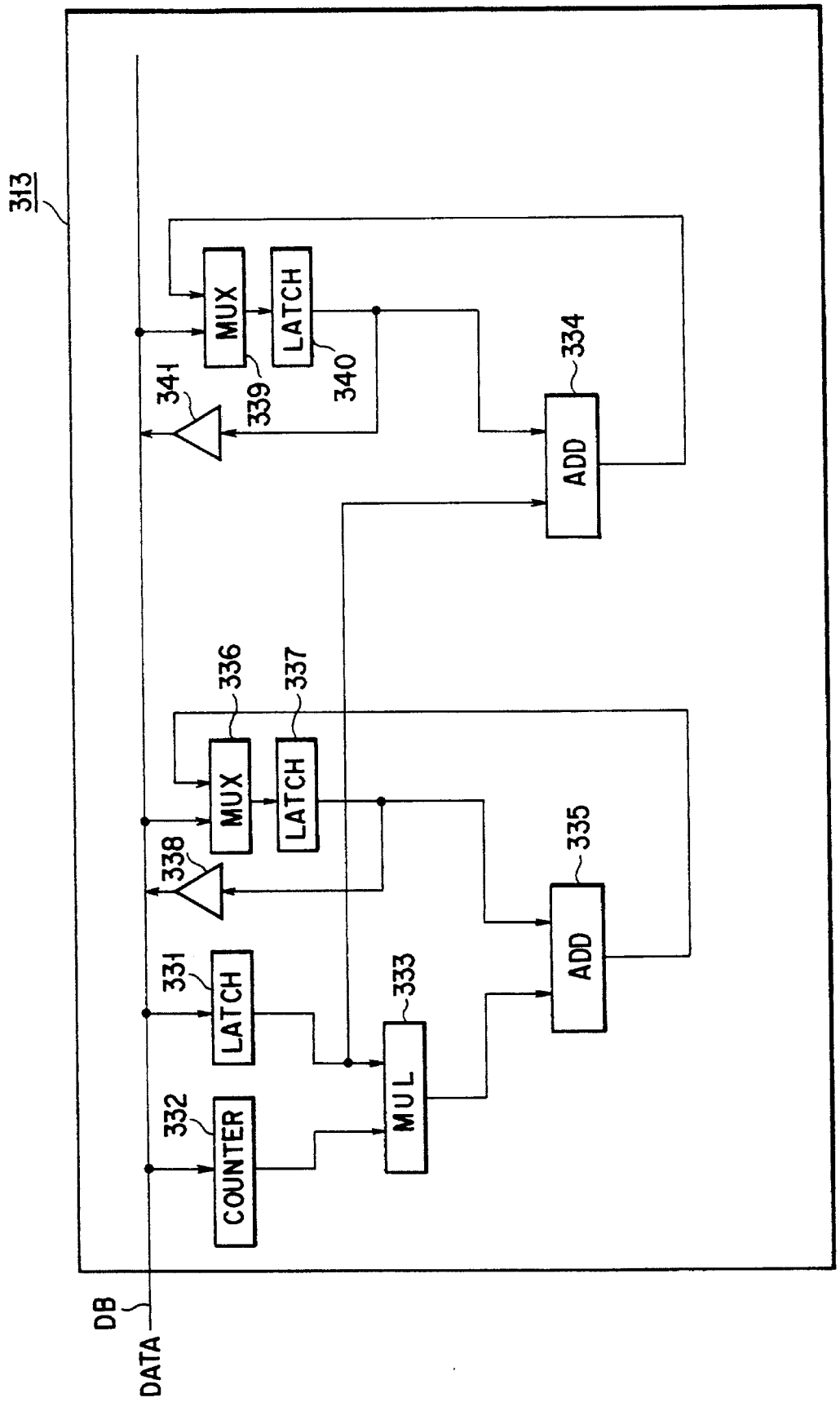
F I G. 52

FUZZY RULE-BASED SYSTEM FORMED ON A SINGLE SEMICONDUCTOR CHIP

This application is a Continuation of application Ser. No. 07/891,165, filed on May, 29, 1992, now abandoned.

BACKGROUND OF THE INVENTION

1. Field of the Invention

The present invention relates to a fuzzy rule-based system used in various controllers.

2. Description of the Related Art

FIGS. 1A to 1D show examples of general fuzzy logic. FIGS. 1A to 1C show membership functions of IF parts (or IF logics) and THEN parts (or THEN logics) of Fuzzy Rules 1 to 3, and define the relationship between input variables X and Y, and an output variable C.

More specifically, FIG. 1A represents Fuzzy Rule 1 "if X=BIG and Y=BIG then C=SMALL (If an input variable X is large, and an input variable Y is large, then set an output variable C to be small)". With reference to the values of the input variables and the membership functions of the IF part, a membership value or grade is calculated based on an input value. If the IF part includes a plurality of input variables, the minimum grade is obtained by minimum processing (to be referred to as "MIN processing" hereinafter). Using the obtained min value, the membership function of the THEN part is modified (to cut a peak). Since Rule 1 includes two IF part membership functions "X=BIG" and "Y=BIG", the grade of the variable Y is selected by the MIN processing, and the membership function α of the THEN part is modified according to the selected grade, thereby obtaining a membership function α' indicated by hatching.

FIG. 1B represents Fuzzy Rule 2 "if X=SMALL and Y=MEDIUM then C=MEDIUM (If an input variable X is small and an input variable Y is medium, then set an output variable C to be medium)". FIG. 1C represents Fuzzy Rule 3 "if X=SMALL and Y=SMALL then C=BIG (If an input variable X is small and an input variable Y is small, then set an output variable C to be big)". Since each of Rules 2 and 3 includes two IF part membership functions, a membership function β' or γ' indicated by hatching in FIG. 1B or 1C is obtained by MIN processing.

The membership functions of the THEN parts obtained by the MIN processing according to Fuzzy Rules 1 to 3 are combined to obtain a combined inference result, and the combined inference result is utilized in various types of control. The membership functions of the THEN parts are combined, as shown in, e.g., FIG. 1D. More specifically, the maximum values of the modified membership functions α', β', and 65 ' of the THEN parts of Rules 1 to 3 are extracted to form a new membership function.

The combined inference result is defuzzified to obtain a conclusive value. For example, the value of the center of gravity G of the combined new membership function is calculated, and the calculated center of gravity value G serves as an output.

Conventionally, there was no general-purpose LSI chip for fuzzy inference. Therefore, when an arbitrary system is controlled using the Fuzzy inference, the arithmetic operation for the fuzzy inference is executed by software. However, the arithmetic operation consumes much time. In recent years, various LSI chips for the fuzzy inference have been developed, and the ratio of hardware in a fuzzy logic system is increased accordingly. When the hardware ratio increases, fuzzy rules are partially fixed, and flexibility of fuzzy inference is lost. For this reason, in general, a fuzzy inference LSI chip incorporates a special-purpose memory storing fuzzy rules to assure the flexibility of fuzzy inference. In a relatively small-scale fuzzy inference system used in, e.g., home electrical appliances, membership functions are stored in advance in a special-purpose external memory in the form of a table, and the table is accessed to generate membership functions.

In order to improve accuracy of fuzzy inference, the number of fuzzy rules, the resolution of membership functions, and the number of I/O variables must be increased. However, when the number of fuzzy rules, the resolution of membership functions, and the number of I/O variables are increased, the capacity of a memory, and the number of accesses to the memory are increased. For this reason, the fuzzy operation processing speed is decreased, the memory capacity is increased, and the number of I/O gates of the memory is increased.

When all components such as a circuit for generating membership functions of IF and THEN parts, a processor for processing the membership functions of IF and THEN parts, a defuzzify circuit, and fuzzy rules are realized by hardware, the circuit scale can be reduced, and the computation speed can be increased. However, the number of fuzzy rules which can be set is limited. Furthermore, since fuzzy operation algorithm depends on hardware, only a limited processing method can be executed, thus resulting in a low degree of freedom. In particular, as for the defuzzification, algorithms such as a height method, an area method, a center of gravity method, and the like are known. These algorithms have unique features, i.e., respectively place importance on different points such as speed, accuracy, and the like. Thus, different defuzzification algorithms must be employed according to objects to be controlled. For this reason, when an inference circuit and a defuzzify circuit are arranged in a hardware arrangement together with other circuits, the application of the system is limited.

The hardware fuzzy rule-based system can only output a defuzzified output, e.g., the above-mentioned center of gravity value, and no intermediate data until the output is obtained can be derived outside the system. For this reason, it is difficult to test, evaluate, and debug chips. Similarly, when a fuzzy inference chip is tested by a CPU, the load on the CPU is heavy.

A conventional membership function generator and an IF part processor have a large circuit scale, and are not suitable for a one-chip configuration.

SUMMARY OF THE INVENTION

The present invention has been made in consideration of the above situation, and has as its object to provide an improved fuzzy rule-based system.

It is another object of the present invention to provide a fuzzy rule-based system, which can decrease the number of I/O gates of a memory, while improving accuracy and speed of fuzzy inference.

It is still another object of the present invention to provide a fuzzy rule-based system, which can provide a high degree of freedom to the number of fuzzy rules which can be set, and the range of selection of inference methods.

It is still another object of the present invention to provide a circuit for generating membership functions of IF and THEN parts, a circuit for generating a grade of a membership function of an IF part, an IF part processing circuit, a THEN part processing circuit, defuzzify circuit and the like, which are suitable for a one-chip configuration.

It is still another object of the present invention to provide a fuzzy rule-based system, which allows an easy test.

It is still another object of the present invention to provide a fuzzy rule-based system, which can read out intermediate data to a circuit outside a chip.

In order to achieve the above objects, a fuzzy processing apparatus according to the first aspect of the present invention comprises: a one-chip fuzzy processing apparatus integrated on a one-chip semiconductor device, including reception means for receiving values of variables of IF part membership functions supplied from an external circuit, IF part grade calculation means for calculating grades of the IF part membership functions corresponding to the variable values received by the reception means, THEN part membership function generation means for generating THEN part membership functions, combining means for modifying the THEN part membership functions using the IF part grades calculated by the IF part grade calculation means, and combining the modified membership functions, and defuzzify means for defuzzifying an output from the combining means.

In the above arrangement, membership functions need not be transferred between an external apparatus and a one-chip fuzzy rule-based system, and a fuzzy operation can be performed at high speed.

If a rule memory for storing fuzzy rules is arranged outside the one-chip fuzzy rule-based system, the degree of freedom of fuzzy inference can be assured.

The combining means comprises, e.g., a processor for performing MAX/MIN processing, and the defuzzify means obtains the area, center of gravity, moment, average height, and the like of the membership function combined by the combining means.

In order to achieve the above objects, a fuzzy processing apparatus according to the second aspect of the present invention comprises: a one-chip fuzzy processing apparatus integrated on a one-chip semiconductor device, including a first circuit for performing computations for fuzzy inference on the basis of a center of gravity method, the first circuit including first holding means for holding values of variables, IF part grade calculation means for calculating grades of IF part membership functions corresponding to the values of the variables held in the first holding means, first IF part processing means for obtaining minimum values of the grades of the IF part membership functions in units of fuzzy rules, means for generating THEN part membership functions, means for performing minimum processing by comparing an obtained minimum value with a THEN part membership function for each fuzzy rule to cut a peak of the THEN part membership function, maximum value processing means for performing maximum processing for combining the modified THEN part membership functions by calculating a maximum value of the modified THEN part membership functions, first multiplying means for multiplying the maximum value output from the maximum value processing means with a corresponding x-coordinate value, first moment calculation means for calculating a moment by accumulating outputs from the first multiplying means, first area calculation means for calculating an area by accumulating outputs from the first IF part processing means, and first dividing means for calculating a center of gravity by dividing the moment calculated by the first moment calculation means with the area calculated by the first area calculation means to obtain a quotient, a second circuit for performing computations for fuzzy inference based on an average height method, the second circuit including second holding means for holding values of variables supplied from an external circuit, IF part grade calculation means for calculating grades of IF part membership functions corresponding to the values of the variables held in the second holding means, second IF part processing means for obtaining minimum values of the grades of the IF part membership functions in units of fuzzy rules, THEN part membership function generation means for outputting x-coordinate values when values of THEN part membership functions reach predetermined values, second multiplying means for multiplying the minimum values obtained by the second IF part processing means with the x-coordinate values of the corresponding THEN part membership functions, second moment calculation means for calculating a moment by accumulating outputs from the second multiplying means, second area calculation means for calculating an area by accumulating outputs from the second IF part processing means, and second dividing means for calculating an average height by dividing the moment calculated by the second moment calculation means with the area calculated by the second area calculation means to obtain a quotient, and control means for selectively operating one of the first and second circuits.

In the above arrangement, membership functions need not be transferred between an external apparatus and a one-chip fuzzy rule-based system, and a fuzzy operation can be performed at high speed. In addition, a fuzzy operation can be performed while arbitrarily switching between a center of gravity method and an average height method by a single chip.

In order to achieve the above objects, a fuzzy processing apparatus according to the third aspect of the present invention comprises: a one-chip fuzzy processing apparatus including fuzzy processing means for executing computations for fuzzy inference, input/output control means for controlling data input/output operations with an external circuit, first memory means for storing a system program, second memory means for storing data for defining fuzzy rules and/or membership functions, control means for controlling operations of other circuits according to the system program stored in the first memory means, and connection means for allowing communications among the input/output control means, the first and second memory means, and the control means, wherein the fuzzy processing means, the input/output control means, the first and second memory means, the control means, and the connection means are integrated in a single integrated circuit.

In the above arrangement, since the entire fuzzy rule-based system including a CPU is integrated in one chip, membership functions and fuzzy rules need not be transferred between the integrated circuit and an external apparatus, and a fuzzy operation can be performed at high speed.

In order to achieve the above objects, a fuzzy processing apparatus according to the fourth aspect of the present invention comprises: a one-chip fuzzy processing apparatus integrated on a one-chip semiconductor device, including maximum-minimum processing means for executing maximum-minimum processing in fuzzy inference using grades of IF and THEN part membership functions supplied from an external circuit, and defuzzify processing means for performing calculations necessary for defuzzify processing using outputs from the maximum-minimum processing means.

In the above arrangement, a MAX/MIN processing circuit and a circuit for performing a computation necessary for defuzzification are integrated in a single chip. Therefore, when fuzzy rules and membership functions are changed, other computations are performed outside the chip, e.g., by software, thus allowing a high-speed computation while assuring a desired degree of freedom.

In order to achieve the above objects, a fuzzy processing apparatus according to the fifth aspect of the present invention comprises: a one-chip fuzzy processing apparatus integrated on a one-chip semiconductor device, including holding means for holding x-coordinate values of IF part membership functions, count means for performing a count operation using externally supplied numerical value data as an initial value, IF part membership function generation means for generating grades of IF part membership functions using the values held in the holding means as input variables, THEN part membership function generation means for generating grades of THEN part membership functions in response to outputs from the count means, and output means for outputting the grades of the IF and THEN part membership functions outside the one-chip semiconductor device.

In the above arrangement, the grades of membership functions of IF and THEN parts can be arbitrarily processed outside the chip, e.g., by software. Therefore, a high-speed computation can be performed while assuring a desired degree of freedom of the fuzzy operation.

In order to achieve the above objects, a fuzzy processing apparatus according to the sixth aspect of the present invention comprises: a membership function generator for fuzzy operations, including coordinate data holding means for holding coordinate data for defining membership functions, variable holding means for holding x-coordinate values as input variable values, and a computation circuit, the computation circuit including comparison means for comparing the x-coordinates held in the coordinate data holding means with coordinate data held in the variable holding means, detection means for detecting based on comparison results from the comparison means whether the x-coordinate value belongs to a region where the membership function assumes a predetermined value or a region where the membership function has an inclination, and output means for, when the x-coordinate value belongs to the region where the membership function assumes the predetermined value, outputting the predetermined value as a membership function value, and for, when the x-coordinate value belongs to the region where the membership function has the inclination, obtaining a corresponding membership function value on the basis of the coordinate data held in the coordinate data holding means and the x-coordinate value held in the variable holding means, and outputting the obtained membership function value.

In the above arrangement, a membership function can be defined by only supplying a plurality of coordinates from an external apparatus without transferring the entire membership function, and a necessary grade can be generated. Therefore, the transfer time of a membership function can be shortened, and a fuzzy operation can be performed at high speed.

In order to achieve the above objects, a fuzzy processing apparatus according to the seventh aspect of the present invention comprises: an IF part computation circuit including register groups for holding membership values obtained as a result of grade computations of IF part membership functions, selection means for selecting the grades of the membership functions held in the register groups according to a fuzzy rule, and minimum processing means for obtaining a minimum value of a plurality of membership values obtained by the selection means.

In the above arrangement, after a necessary grade is temporarily stored in a register group, the necessary grade is read out, and MIN processing is performed. Thus, a fuzzy operation can be performed at high speed.

If the fuzzy processing apparatus further comprises means for obtaining a maximum value of the grades in order to process IF parts of fuzzy rules including THEN parts whose labels are equal to each other, since processing for combining membership functions of THEN parts is partially processed in advance in processing of IF parts, the processing of THEN parts can be performed at high speed.

If the selection means comprises means for simultaneously supplying, to the minimum processing means, grades of IF part membership functions of a plurality of fuzzy rules for computations of IF parts of the plurality of fuzzy rules including THEN parts having the same label, and executes parallel processing of the IF parts of the plurality of fuzzy rules, since IF parts of a plurality of fuzzy rules can be simultaneously (parallelly) processed, the processing of IF parts can be performed at high speed.

In order to achieve the above objects, a fuzzy processing apparatus according to the eighth aspect of the present invention comprises: a fuzzy rule-based system integrated in a single integrated circuit, including fuzzy processing means for executing computations for fuzzy inference, means for supplying predetermined self diagnosis processing data for self diagnosis processing to the fuzzy processing means, and causing the fuzzy processing means to execute fuzzy operations for diagnosis, holding means for holding an expectation of a computation result to be obtained by the fuzzy processing means, and comparison means for comparing a diagnosis computation result obtained by the fuzzy processing means with the expectation held in the holding means.

In the above arrangement, since a fuzzy rule-based system has a self test function, a test can be easily performed.

In order to achieve the above objects, a fuzzy processing apparatus according to the ninth aspect of the present invention comprises:

a fuzzy rule-based system integrated in a single integrated circuit, including membership function generators for generating membership functions, and an output circuit for outputting the membership functions output from the membership function generators to an external output terminal; or a fuzzy rule-based system integrated in a single integrated circuit, including IF part membership function generation means for generating grades of IF part membership functions, THEN part membership function generation means for generating THEN part membership functions, THEN part processing means for combining the THEN part membership functions generated by the THEN part membership function generation means on the basis of the grades obtained by the IF part membership function generation means, and generating a combined membership function, defuzzify means for converting the membership function combined by the THEN part processing means into a conclusive value, and output means for outputting the conclusive value obtained by the defuzzify means and the combined membership function obtained by the THEN part processing means outside the integrated circuit.

In the above arrangement, since internal signals of a one-chip fuzzy rule-based system can be read out, as needed, debugging of the fuzzy rule-based system, confirmation and evaluation of operations, and the like can be easily performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a flow chart for explaining an operation of a CPU upon power-ON;

FIG. 4B is a flow chart for explaining an operation of the CPU at the beginning of fuzzy inference;

FIG. 5 is a block diagram showing a circuit arrangement of a pattern generator shown in FIG. 3;

FIGS. 6 to 17 are views showing examples of membership functions;

FIGS. 18 to 20 are block diagrams showing modifications of the pattern generator;

FIG. 22 is a block diagram showing an arrangement of a multiplexer 22;

FIGS. 25 to 36 are views showing examples of membership functions;

FIG. 38 is a block diagram showing another arrangement of the IF part processor;

FIG. 42 is a circuit diagram showing an arrangement of a multiplexer shown in FIG. 41;

FIG. 43 is a diagram for explaining an arrangement for selectively outputting one of an output from a MAX processor and an output from a defuzzify circuit;

FIG. 47 is a flow chart for explaining an operation of the fuzzy rule-based system shown in FIGS. 45 and 46;

FIG. 48 is a block diagram showing an arrangement of a fuzzy rule-based system according to the third embodiment of the present invention;

FIG. 50 is a block diagram showing an arrangement of a fuzzy rule-based system according to the fourth embodiment of the present invention;

FIG. 52 is a block diagram showing an arrangement of an adder/multiplier for calculating the center of gravity shown in FIG. 50.

DETAILED DESCRIPTION OF THE PREFERRED EMBODIMENTS

Fuzzy rule-based systems according to embodiments of the present invention will be described hereinafter with reference to the accompanying drawings. For the sake of easy understanding, a description will be made in the following order.

Figure 1A:
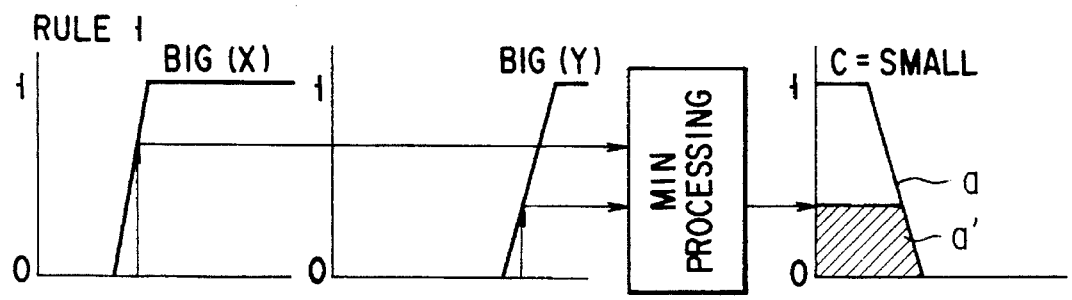
FIGS. 1A to 1C are views for explaining MIN processing in fuzzy inference.
Figure 1B:
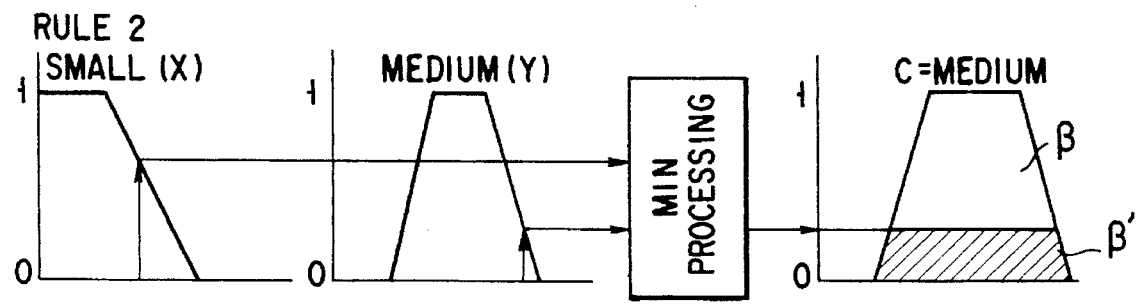
Figure 1C:
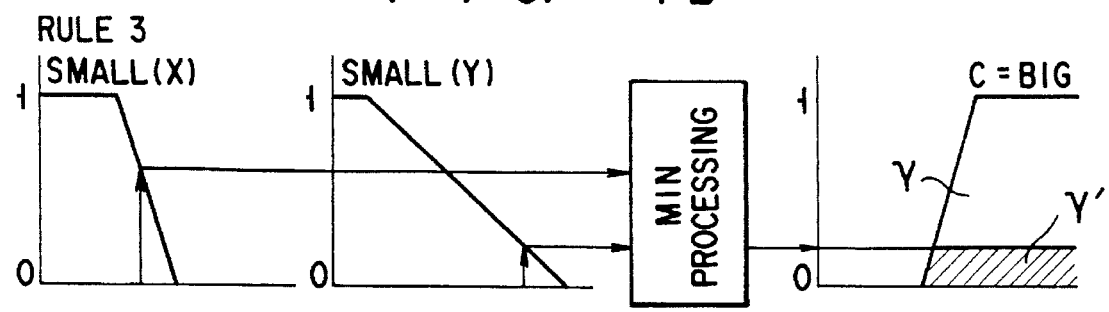
Figure 1D:
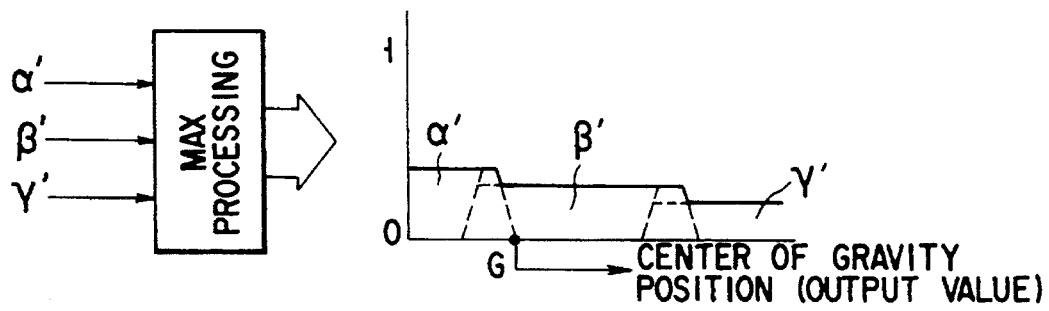
FIG. 1D is a view for explaining MAX processing in fuzzy inference and defuzzify.
Figure 2:
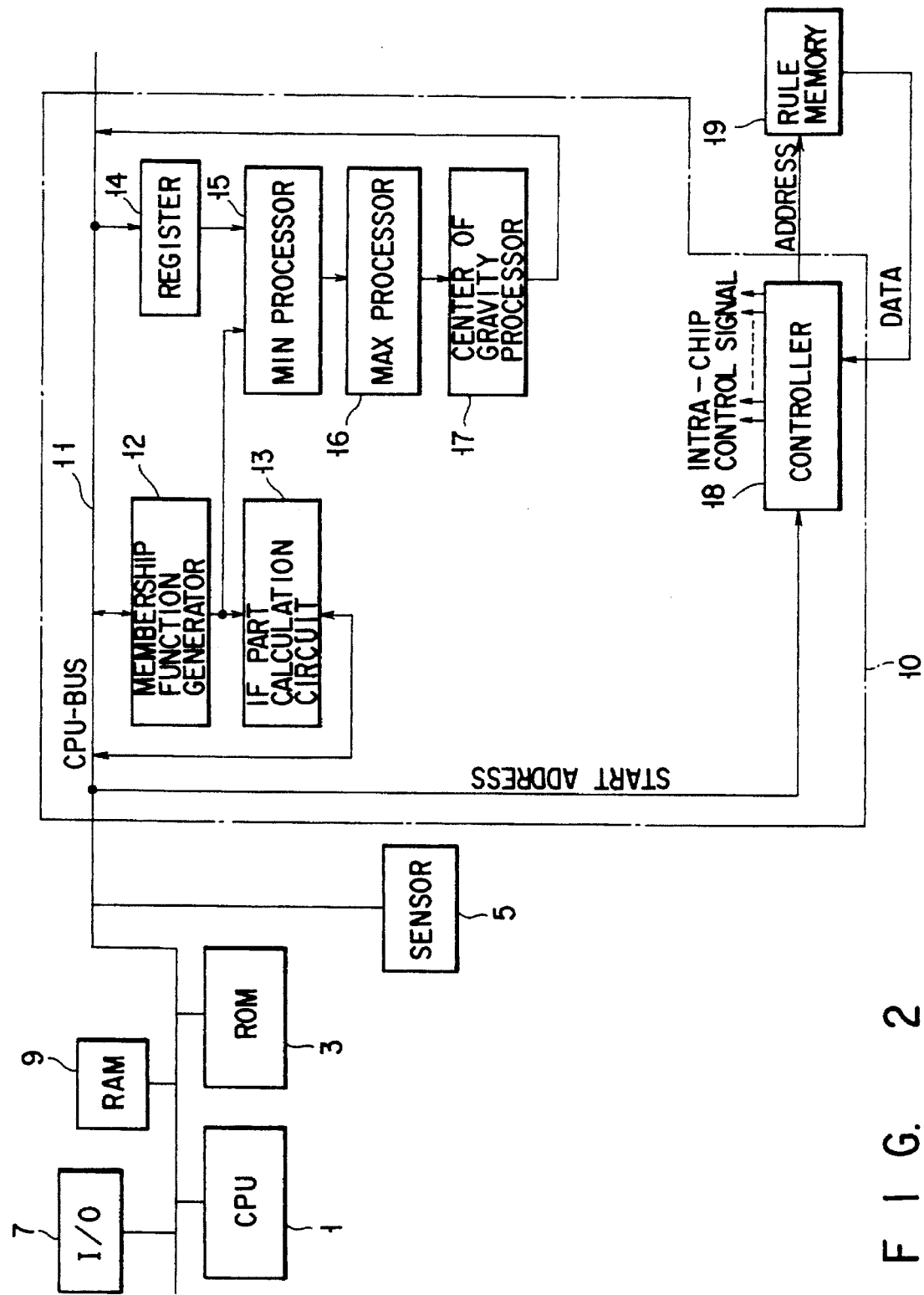
FIG. 2 is a block diagram showing the arrangement of a fuzzy logic chip and its peripheral circuits according to an embodiment of the present invention.

(1) Schematic arrangement and operation of fuzzy rule-based system according to the first embodiment of the present invention (FIG. 2)

Figure 3:
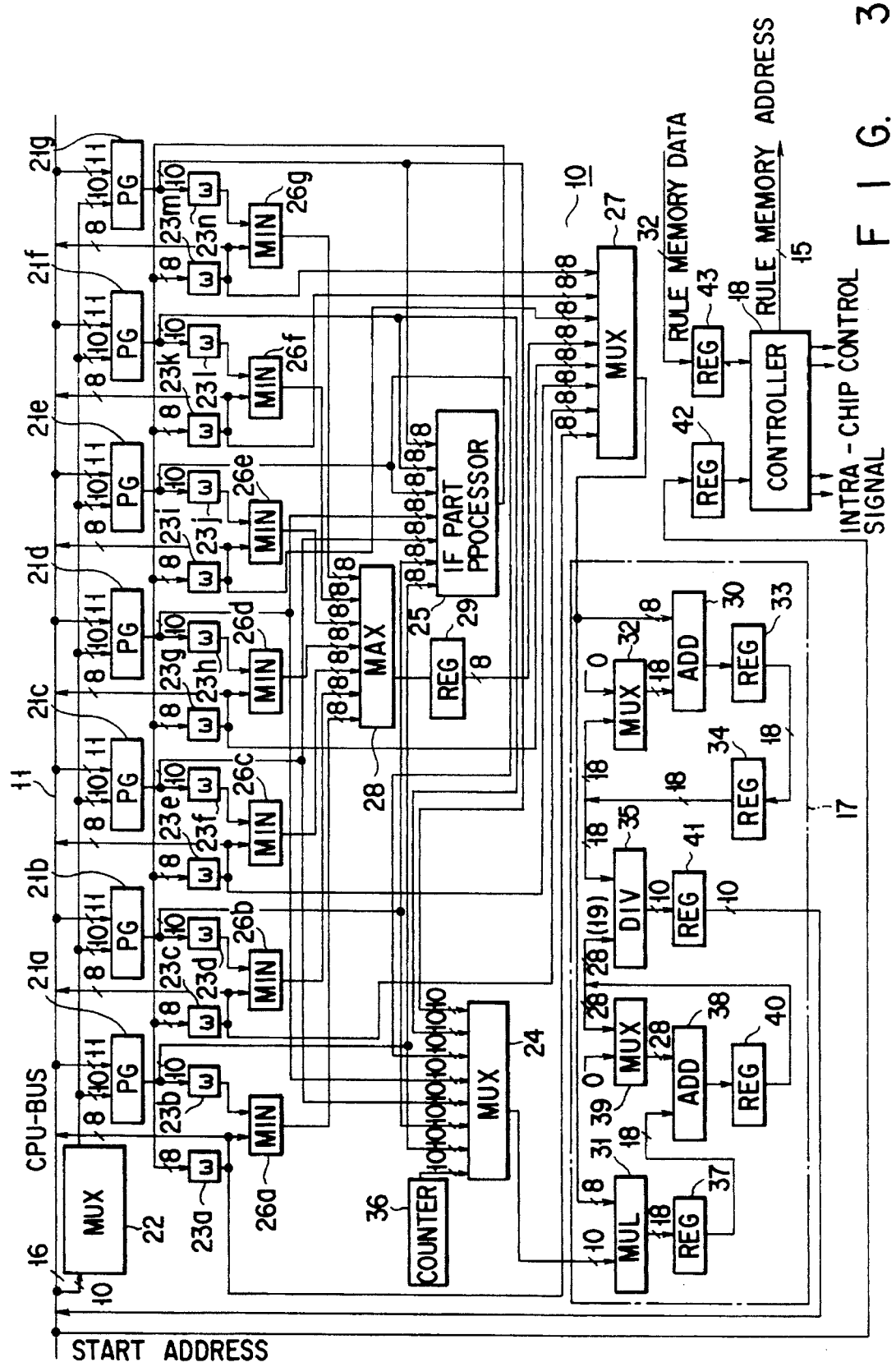
FIG. 3 is a block diagram showing the detailed arrangement of internal circuits of the fuzzy logic chip shown in FIG. 2.

(2) Detailed arrangement of overall fuzzy rule-based system according to the first embodiment of the present invention (FIG. 3)

(3) Detailed operations of overall fuzzy rule-based system according to the first embodiment of the present invention (FIGS. 2 to 4D)

(3-1) Fuzzy inference operation based on a center of gravity method (3-2) Fuzzy inference operation based on an averaged height method (4) Detailed arrangement of respective sections of circuit shown in FIG. 3

(4-1) Details of pattern generators 21a to 21g (FIGS. 5 to 20)

Figure 21:
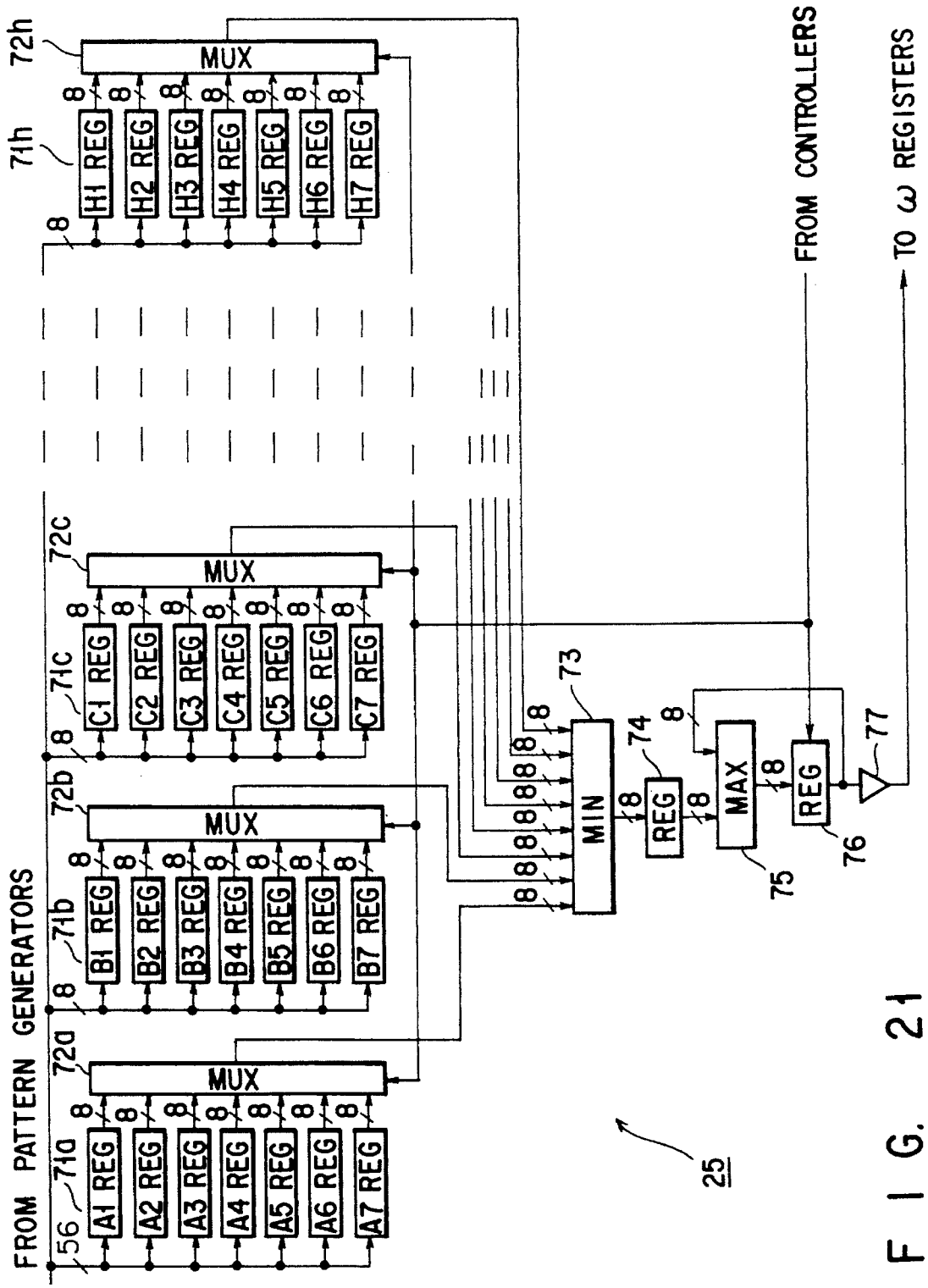
FIG. 21 is a block diagram showing an arrangement of an IF part processor.

(4-1-A) Arrangement (4-1-B) Operation (4-2) Detailed arrangement of IF part processor 25 (FIG. 21)

(4-2-A) Arrangement (4-2-B) Operation (4-3) Details of multiplexer 22 (FIG. 22)

(4-3-A) Arrangement (4-3-B) Operation (5) Modifications (5-1) Modifications of pattern generator (FIGS. 23 to 36)

Figure 37:
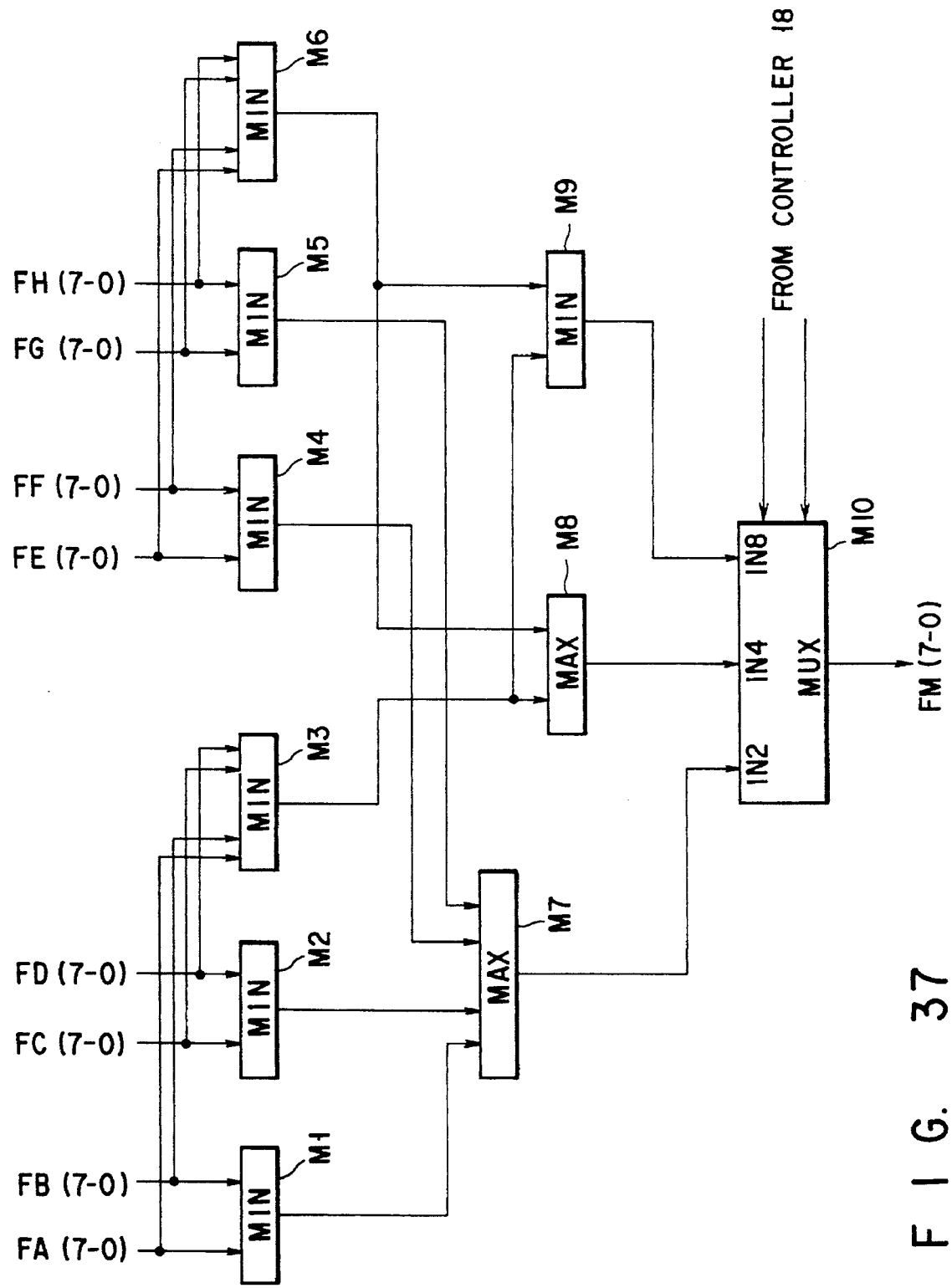
FIG. 37 is a block diagram showing an arrangement of a MIN processor in the IF part processor.

(5-1-A) Arrangement (5-1-B) Operation (5-2) Modification of MIN processor in IF part processor (FIG. 37)

Figure 44:
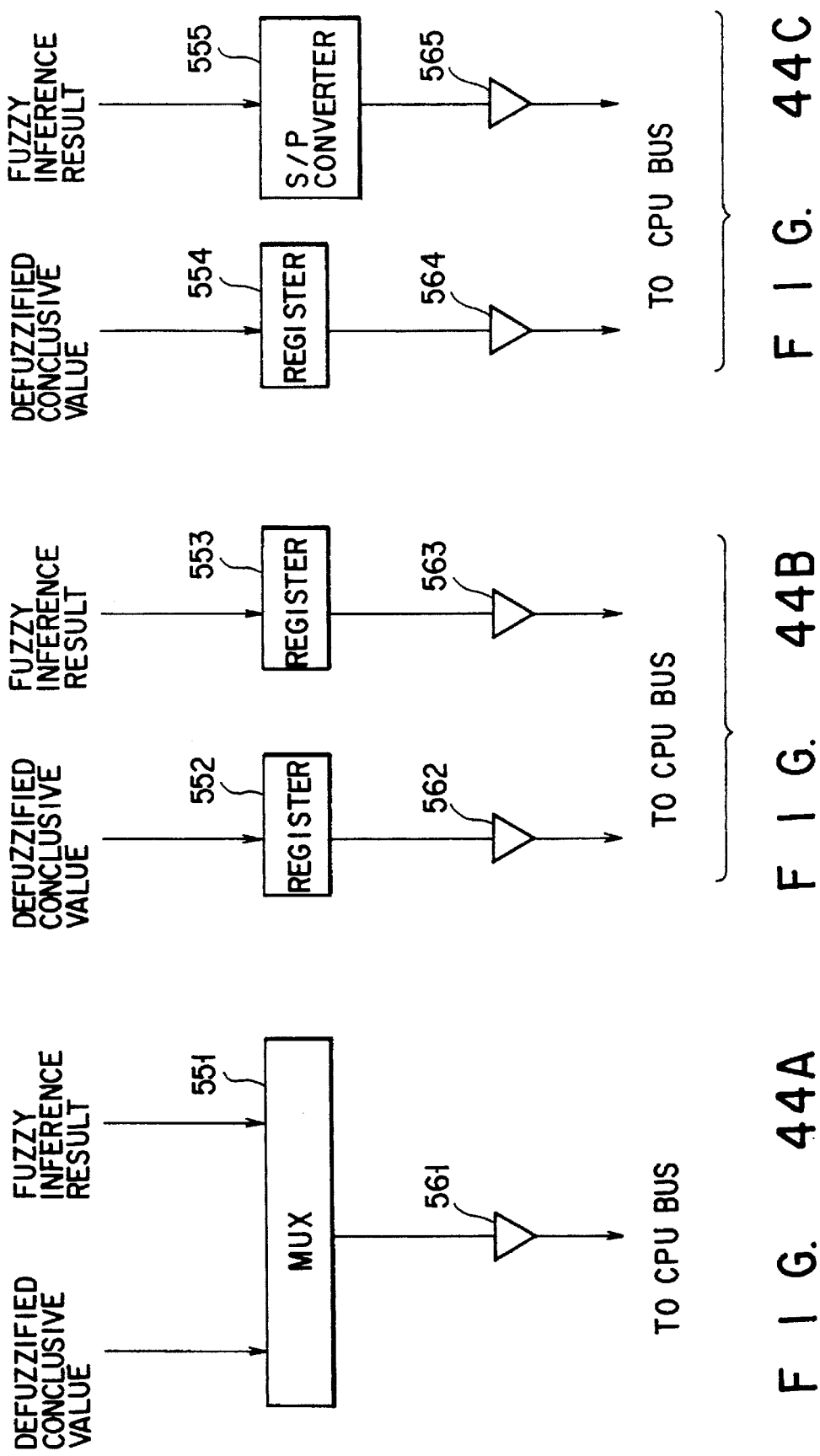
FIGS. 44A to 44C are block diagrams showing arrangements of an external interface shown in FIG. 43.

(5-2-A) Arrangement (5-2-B) Operation
(5-3) Modification of IF part processor (FIG. 38)
(5-3-A) Arrangement
(5-3-B) Operation
(5-4) Modification having self test function (FIGS. 39 and 40)
(5-4-A) Arrangement
(5-4-B) Operation
(5-5) Modification capable of outputting output from pattern generator outside chip (FIGS. 41 and 42)
(5-5-A) Arrangement
(5-5-B) Operation
(5-6) Modification capable of outputting output from THEN part processor and output from center of gravity processor outside chip (FIGS. 43 to 44C)
(6) Fuzzy rule-based system according to the second embodiment, in which all circuits are integrated on one chip (FIGS. 45 to 47)
(6-A) Arrangement
(6-B) Operation
(7) Fuzzy rule-based system according to the third embodiment, in which only IF part processor and THEN part membership function generator are integrated on one chip (FIGS. 48 and 49)
(7-A) Arrangement
(7-B) Operation
(8) Fuzzy rule-based system according to the fourth embodiment, in which MAX-MIN processor, and center of gravity computation adder/multiplier are integrated on one chip (FIGS. 50 to 52)
(8-A) Arrangement
(8-B) Operation (1) Schematic arrangement and operation of fuzzy rule-based system according to the first embodiment FIG. 2 is a block diagram showing the circuit arrangement of the overall fuzzy rule-based system according to this embodiment. As shown in FIG. 2, the system comprises a fuzzy logic chip 10, a CPU 1 for controlling the overall system, a ROM 3 for storing a basic input/output system (BIOS), coordinate data for defining membership functions (to be described later), and the like, a sensor 5 for detecting the values of various variables (e.g., temperature, humidity, and the like) for fuzzy control, an I/O device 7, a RAM 9 for storing various programs and data, and a rule memory 19 storing fuzzy rules.

The fuzzy logic chip 10 is constituted by an ASIC (application specified integrated circuit) or gate arrays, and includes a CPU bus 11, a membership function generator 12, an IF part calculation circuit 13, a register 14, a minimum value (MIN) processor 15, a maximum value (MAX) processor 16, a center of gravity processor 17, and a controller 18 in one chip. The CPU bus 11 is connected to the CPU 1 through a bus arranged outside the chip 10.

The membership function generator 12 generates membership functions of IF parts, and outputs them to the IF part calculation circuit 13. The membership function generator 12 also generates membership functions of THEN parts, and outputs them to the MIN processor 15.

The IF part calculation circuit 13 calculates the grades (or membership values) of the IF part membership functions on the basis of the IF part membership functions supplied from the membership function generator 12 and input variables supplied from the CPU 1. Furthermore, the IF part calculation circuit 13 obtains minimum values of the grades in units of fuzzy rules, and sets them in the register 14 through the CPU bus 11.

The MIN processor 15 compares the THEN part membership functions supplied from the membership function generator 12 with the minimum values of the IF part membership function values held in the register 14, and outputs smaller ones to the MAX processor 16. In other words, the MIN processor 15 cuts peaks of the THEN part membership functions supplied from the membership function generator 12, and outputs the obtained membership functions to the MAX processor 16.

The MAX processor 16 obtains a maximum value of the THEN part membership functions supplied from the MIN processor 15 to combine the THEN part membership functions, thus obtaining a new membership function. The MAX processor 16 outputs the combined THEN part membership function to the center of gravity processor 17.

The center of gravity processor 17 calculates the center of gravity value of the membership function obtained by the MAX processor 16, and outputs the calculated center of gravity value as an inference result onto the CPU bus 11.

The controller 18 is triggered by a start address (the start address of an area for storing fuzzy rules necessary for control) supplied through the CPU bus 11. The controller 18 reads out rule data from an area of an external rule memory 19 designated by the start address. The controller 18 outputs control signals to the above-mentioned circuits in the chip 10 on the basis of the readout rule data, thus controlling the circuits.

(2) Detailed arrangement of overall system

The detailed arrangement of the fuzzy logic chip 10 shown in FIG. 2 will be described below with reference to FIG. 3. FIG. 3 shows the internal architecture of the fuzzy logic chip 10, which can selectively execute defuzzification based on a center of gravity method, and defuzzification based on an average height method. The overall chip is constituted by an ASIC or gate arrays.

In FIG. 3, the CPU bus 11 has a 16-bit bus width. The CPU bus 11 is connected to pattern generators (PGs) 21a to 21g, and a multiplexer (MUX) 22, in which an initial value can be set. The details of the arrangements of the pattern generators 21a to 21g and the multiplexer 22 will be described later.

The pattern generators 21a to 21g are circuits for generating function values of arbitrary membership functions, and the membership functions are set by the CPU 1 through the CPU bus 11 when the power supply is turned on. More specifically, coordinate data of points A to G defining shapes of the membership functions are set to the pattern generators 21a to 21g. Each of the pattern generators 21a to 21g includes nine banks, and can generate function values of nine membership functions, i.e., eight IF part membership functions and one THEN part membership function.

Each of the pattern generators 21a to 21g is supplied with 10-bit coordinate data as a variable of an IF part membership function through the CPU bus 11 and the multiplexer 22. Furthermore, in order to generate a THEN part membership function, each of the pattern generators 21a to 21g receives a 10-bit count value from the multiplexer 22 as coordinate data.

The pattern generators 21a to 21g generate 10-bit membership function values corresponding to input coordinate data, and output the generated membership function values to registers ω 23b, 23d, 23f, 23h, 23j, 23l, and 23n, a multiplexer 24, and an IF part processor 25.

The multiplexer 22 holds 10-bit variables supplied from the CPU 1 through the CPU bus 11, and supplies these variables to the pattern generators 21a to 21g for IF part computations. The multiplexer 22 includes a counter, and supplies a 10-bit count value as a variable to the pattern generators 21a to 21g for THEN part computations.

The IF part processor 25 obtains minimum values of membership function values from, e.g., upper 8 bits of the 10-bit IF part membership function values supplied from the pattern generators 21a to 21g. The IF part processor 25 outputs the obtained 8-bit IF part computation results to ω registers 23a, 23c, 23e, 23g, 23i, 23k, and 23m.

The ω registers 23a, 23c, 23e, 23g, 23i, 23k, and 23m temporarily store the input 8-bit IF part computation results, and then output them to MIN processors 26a to 26g, the CPU bus 11 through gates (not shown), and a multiplexer 27. The CPU 1 can read out the contents of the ω registers 23a, 23c, 23e, 23g, 23i, 23k, and 23m through the CPU bus 11 by controlling the gates, if necessary. Further, the CPU 1 can supply the results of the arithmetic operation for the IF parts obtained, for example, by software outside the LSI chip 10, to the minimum processing circuits 26a to 26g through the CPU-bus 11 by controlling the gates.

The ω registers 23b, 23d, 23f, 23h, 23j, 23l, and 23n temporarily store the THEN part membership functions supplied from the pattern generators 21a to 21g, and output them to the MIN processors 26a to 26g.

The MIN processors 26a to 26g respectively compare the IF part computation results and the THEN part membership function values stored in the ω registers 23a and 23b, 23c and 23d, 23e and 23f, 23g and 23h, 23i and 23j, 23k and 23l, and 23m and 23n to obtain minimum values. This operation corresponds to processing for cutting the peak of a THEN part membership function based on the IF part computation result. The MIN processors 26a to 26g output 8-bit minimum value data to a MAX processor 28.

The MAX processor 28 obtains a maximum value of the data supplied from the MIN processors 26a to 26g, thus combining the THEN part membership functions. The MAX processor 28 outputs the 8-bit maximum value to the multiplexer 27 through a register (REG) 29.

The multiplexer 27 selects one of the maximum value data from the MAX processor 28, and the IF part computation results from the ω registers 23a, 23c, 23e, 23g, 23i, 23k, and 23m, and outputs it to an adder (ADD) 30 and a multiplier (MUL) 31 under the control of the controller 18. More specifically, when defuzzification based on the center of gravity method is executed, the multiplexer 27 selects and outputs the maximum value data from the MAX processor 28 when defuzzification inference based on the average height method is executed, the multiplexer 27 outputs the outputs from the ω registers 23a, 23c, 23e, 23g, 23i, 23k, and 23m in turn.

A counter 36 is used when defuzzification inference based on the center of gravity method is executed. The counter included in the multiplexer 22 and the counter 36 count the same clock signals. In this case, the counter 36 starts counting at a timing delayed from the counter included in the multiplexer 22 by a time (e.g., an 8-clock period) required from when the output from the counter included in the multiplexer 22 is supplied to the pattern generators 21a to 21g, and to when corresponding data is output from the register 29. In place of the counter 36, the output from the counter included in the multiplexer 22 may be delayed and used.

The multiplexer 24 selects one of the count value of the counter 36 and the membership function values from the pattern generators 21a to 21g, and outputs it to the multiplier 31 under the control of the controller 18. More specifically, when defuzzification based on the center of gravity method is executed, the multiplexer 24 outputs the count value from the counter 36; when defuzzification based on the average height method is executed, the multiplexer 24 outputs the membership function values from the pattern generators 21a to 21g in turn.

The adder 30 adds 8-bit data input from the multiplexer 27 and 18-bit data input from a multiplexer 32 to obtain 18-bit sum data, and outputs the sum data as area data to the multiplexer 32 and a divider (DIV) 35 through registers 33 and 34.

The multiplexer 32 selects one of the 18-bit area data input from the adder 30 through the registers 33 and 34, and data "0", and outputs the selected data to the adder 30.

The multiplier 31 multiplies 10-bit data from the multiplexer 24 with 8-bit data from the multiplexer 27 to obtain 18-bit data, and outputs the product data to an adder 38 through a register 37. The adder 38 adds 18-bit data from the multiplier 31 and 28-bit data input from a multiplexer 39 to obtain 28-bit data, and outputs the sum data as moment data to the multiplexer 39 and the divider 35 through a register 40. The multiplexer 39 selects one of the 28-bit moment data input from the adder 38 through the register 40 and data "0", and outputs the selected data to the adder 38.

The divider 35 divides the 28-bit moment data supplied from the adder 38 through the register 40 with the 18-bit area data supplied from the adder 30 through the registers 33 and 34 to obtain 10-bit quotient data, and outputs the quotient data as center of gravity data onto the CPU bus 11 through a register 41.

In other words, the center of gravity processor 17 shown in FIG. 2 is constituted by the adder 30, the multiplexer 32, the registers 33 and 34, the multiplier 31, the register 37, the multiplexer 39, the adder 38, the register 40, the divider 35, and the register 41.

The controller 18 is triggered by the start address sent from the CPU bus 11 through a register 42. The controller 18 addresses the external rule memory 19 by input 15-bit start address data to read out 32-bit rule data from the rule memory 19 through a register 43. The controller 18 outputs control signals to the respective circuits in the fuzzy logic chip 10 on the basis of the readout rule data. The controller 18 is a kind of co-processor, and can be operated independently of the CPU 1.

(3) Operations of circuit shown in FIG. 3

The operations of the circuit shown in FIG. 3 will be described below.

(3-1) operation based on center of gravity method

Figure 4C:
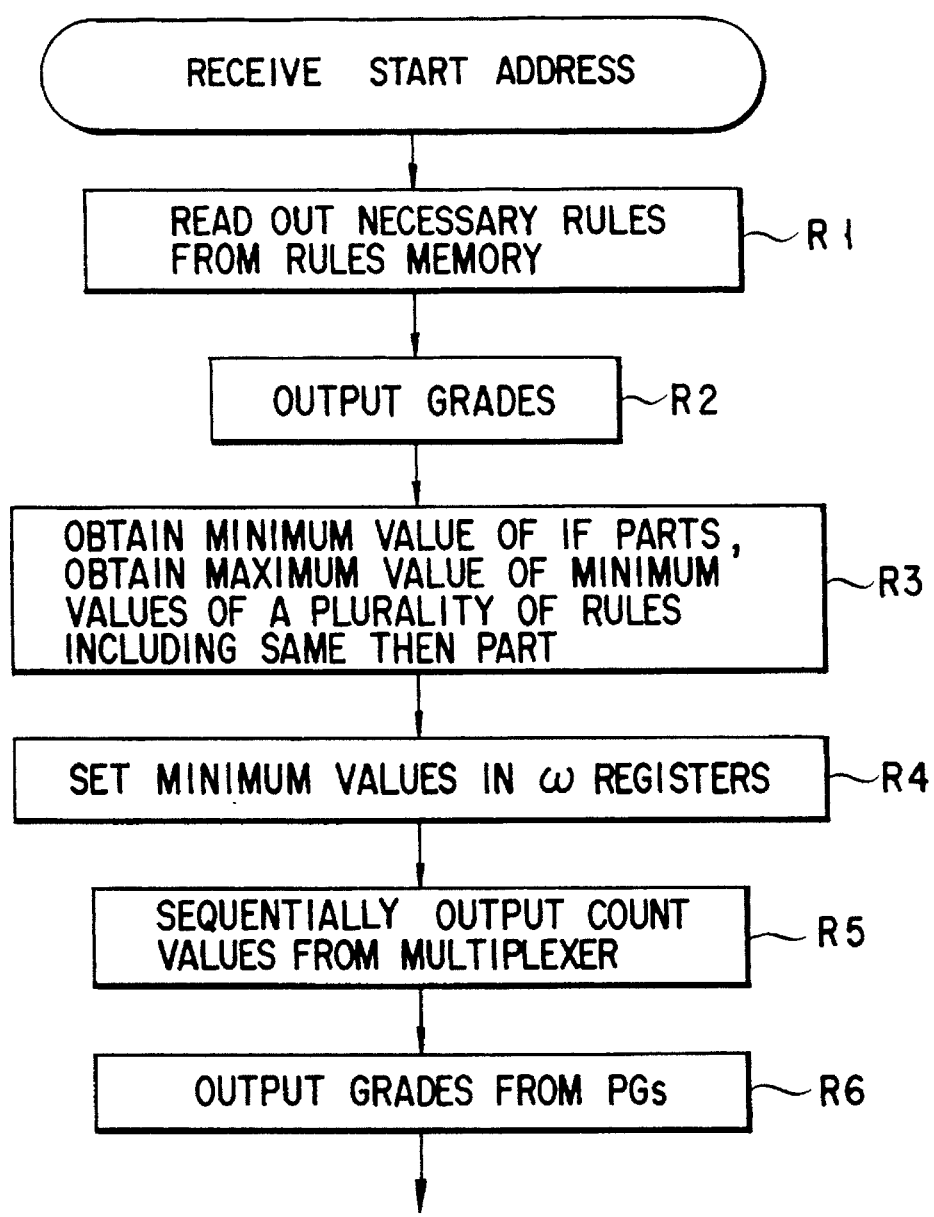
FIGS. 4C and 4D are flow charts for explaining operations of internal circuits in the fuzzy logic chip.
Figure 4D:
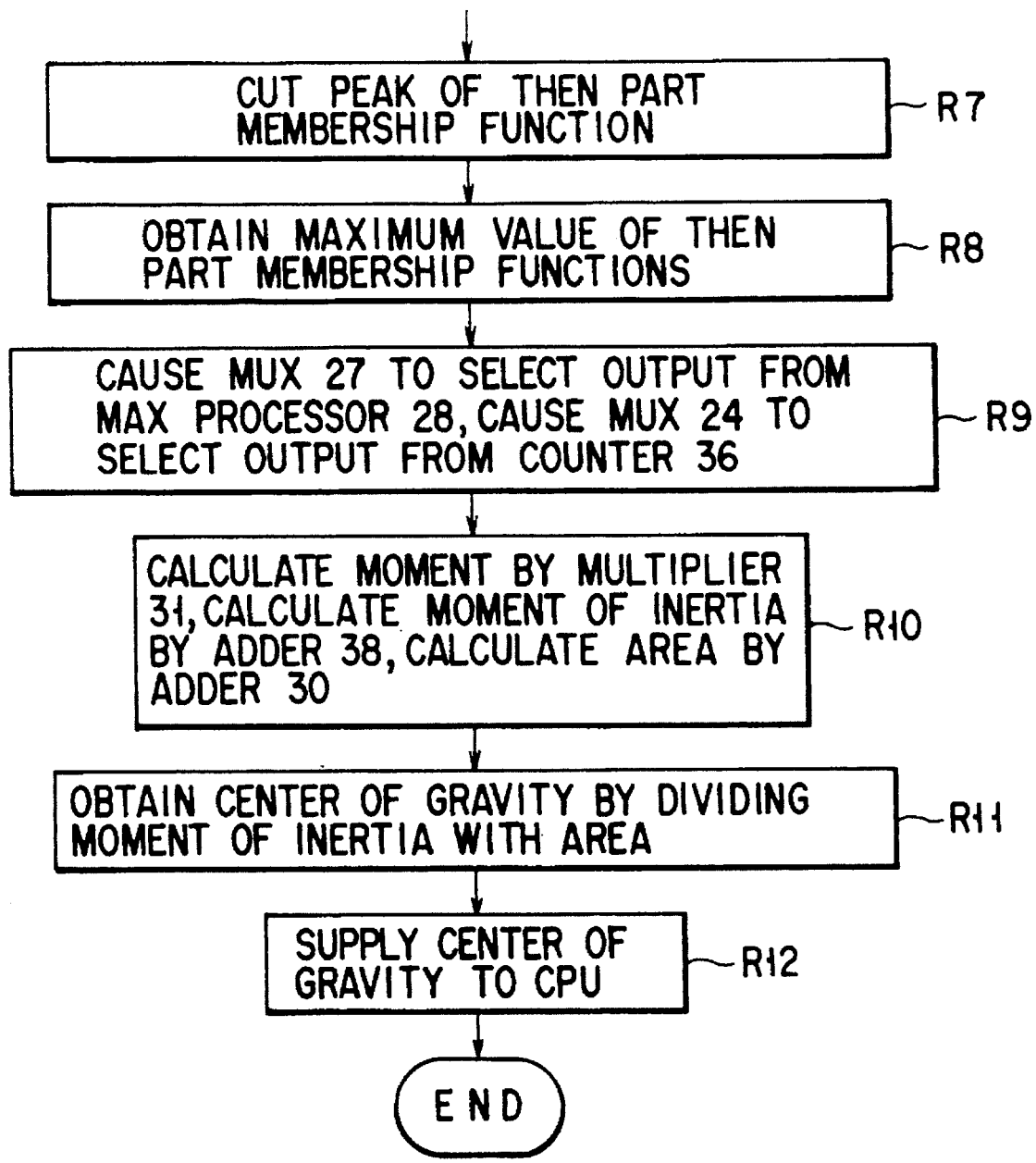
Figure 12:
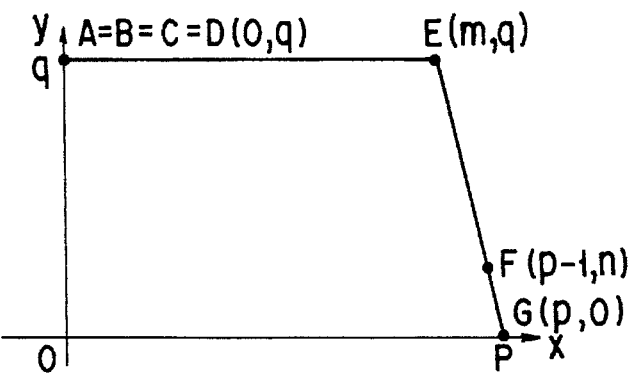
Figure 13:
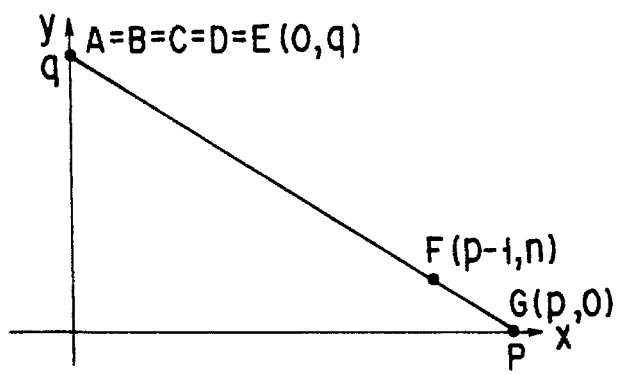
Figure 14:
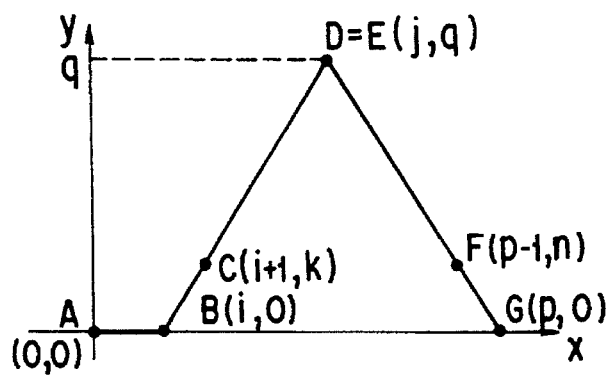
Figure 15:
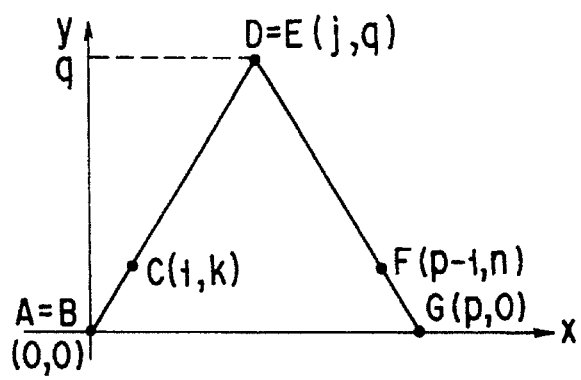
Figure 16:
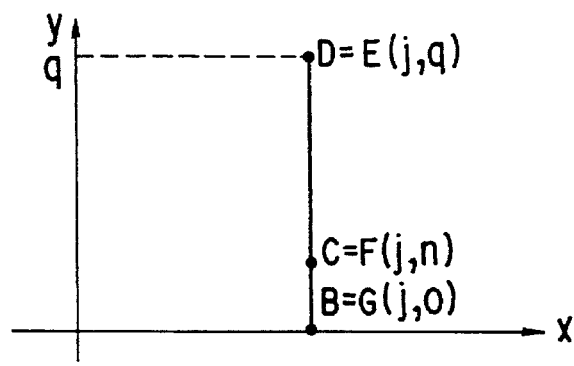

The operation of the system based on the center of gravity method will be described below with reference to FIGS. 4A to 4D. FIG. 4A is a flow chart showing an operation of the CPU 1 upon power-ON, FIG. 4B is a flow chart showing an operation of the CPU 1 upon execution of fuzzy inference, and FIGS. 4C and 4D are flow charts showing operations of the circuits in the chip 10.

Upon power-ON, the CPU 1 loads the BIOS from the ROM 3 (step P1), and sets the I/O device 7 based on the BIOS (step P2). Furthermore, the CPU 1 sets membership functions in the pattern generators 21a to 21g on the basis of data stored in the ROM 3 (step P3).

For example, the CPU 1 sets a membership function when variable A1 is very small in the first bank of the pattern generator 21a; a membership function when A1 is small in the first bank of the pattern generator 21b; a membership function when A1 is medium small in the first bank of the pattern generator 21c; a membership function when A1 is medium in the first bank of the pattern generator 21d; a membership function when A1 is medium large in the first bank of the pattern generator 21e; a membership function when A1 is large in the first bank of the pattern generator 21f; and a membership function when A1 is very large in the first bank of the pattern generator 21g. Similarly, in step P3, the CPU 1 sets, for example, a membership function when A2 is very small in the second bank of the pattern generator 21a, . . . , a membership function when A2 is very large in the second bank of the pattern generator 21g, . . . , a membership function when A8 is very small in the eighth bank of the pattern generator 21a, . . . , a membership function when A8 is very large in the eighth bank of the pattern generator 21g, a membership function when B is very small in the ninth bank of the pattern generator 21a, . . . , a membership function when B is very large in the ninth bank of the pattern generator 21g. The variables A1 to A8 are for the IF parts and the variable B is for THEN part.

When fuzzy inference is executed, the CPU 1 sets the values of control variables (temperature, humidity, and the like) detected by the sensor 5 in the multiplexer 22 as coordinate values of IF part membership functions through a predetermined I/O port and the CPU bus 11 (step Q1). The multiplexer 22 holds input variable values A1 to A8 supplied from the CPU 1 in its internal registers.

The CPU 1 supplies the start address of a predetermined storage area of the rule memory 19 to the controller 18 through another I/O port, the CPU bus 11, and the register 42 (step Q2). This start address is the start address of an area where fuzzy rules necessary for control are stored.

Thereafter, the CPU 1 executes other processing operations until an interrupt signal indicating the end of fuzzy inference is supplied from the chip 10.

Note that signals supplied from the CPU 1 to the chip 10 are supplied to special-purpose I/O ports of the chip 10 in units of signals. For this reason, the controller 18 need not discriminate the types of signals supplied from the CPU 1.

The controller 18 is triggered by the start address supplied from the CPU 1, and reads out fuzzy rules stored in the area designated by the start address (step R1).

For example, assume fuzzy rules as follows:

if A1 is very large, A2 is small, . . . , and A8 is large, then B is small (Rule 1)

if A1 is small, A2 is large, . . . , and A8 is small, then B is large (Rule 2)

if A1 is medium, A2 is large, . . . , and A8 is very small, then B is small (Rule 3)

The multiplexer 22 then supplies the value of the variable A1 to the pattern generators 21a to 21g (i.e., their first banks) under the control of the controller 18. The pattern generators 21a to 21g calculate the grades (membership function values), and output them to the IF part processor 25. The IF part processor 25 stores the input seven grades corresponding to the variable A1 in its internal registers (step R2).

Thereafter, similarly, the multiplexer 22 sequentially supplies the values of the variables A2 to A8 to the pattern generators 21a to 21g (i.e., their corresponding banks). The pattern generators 21a to 21g calculate the grades for the supplied variable values, and sequentially output them to the IF part processor 25. The IF part processor 25 holds the supplied grades in the internal registers (step R2).

After the grades are calculated for all the IF part membership functions, the controller 18 performs MIN processing. More specifically, the IF part processor 25 reads out the grade of the membership function when A1 is very large, the grade of the membership function when A2 is small, . . . , and the grade of the membership function when A8 is large from the internal registers according to Fuzzy Rule 1, and selects and outputs the minimum value.

Then, the IF part processor 25 reads out the grade of the membership function when A1 is small, the grade of the membership function when A2 is large, . . . , and the grade of the membership function when A8 is small from the internal registers according to Fuzzy Rule 2, and selects the minimum value.

Finally, the IF part processor 25 reads out the grade of the membership function when A1 is medium, the grade of the membership function when A2 is large, . . . , and the grade of the membership function when A7 is very small from the internal register according to Fuzzy Rule 3, and selects the minimum value.

For the sake of easy understanding, the description has been made in the order of rule numbers, but the execution order is not particularly limited.

Furthermore, the IF part processor 25 obtains the maximum value of the obtained minimum values for the rules including the same THEN part (this processing corresponds to processing for combining a plurality of membership functions by obtaining the maximum value of THEN part membership functions). In the above-mentioned fuzzy rules, Rules 1 and 3 include the same THEN part. Thus, the IF part processor 25 obtains the maximum value of the minimum values obtained for Rules 1 and 3 (step R3).

The IF part computation results obtained as described above are held in the ω registers $23a$, $23c$, $23e$, $23g$, $23i$, $23k$, and $23m$ (step R4). In this case, for example, the ω register $23a$ stores a larger value of the minimum values of the grades of the IF part membership functions of Rules 1 and 3, and the ω register $23c$ stores the minimum value of the grades of the IF membership functions of Rule 2.

Thus, the computations associated with IF parts are completed.

The controller 18 starts the counter in the multiplexer 22, and causes the counter to sequentially output the count value. In this embodiment, the count value is a 10-bit value, and output data from the multiplexer 22 is sequentially incremented like 0 ($2^0$-1), 1, 2, . . . , 1,023 ($2^{10}$-1) (step R5).

The outputs from the multiplexer 22 are supplied to the ninth banks of the pattern generators $21a$ to $21g$. The pattern generators $21a$ to $21g$ output the grades of corresponding THEN part membership functions at respective coordinate values (step R6). In other words, the pattern generators $21a$ to $21g$ output the THEN part membership functions. The output grades are temporarily stored in the ω registers $23b$, $23d$, $23f$, $23h$, $23j$, $23l$, and $23n$.

The MIN processors $26a$ to $26g$ respectively compare the IF part computation results and the grades of the THEN part membership functions stored in the ω registers $23a$ and $23b$, $23c$ and $23d$, $23e$ and $23f$, $23g$ and $23h$, $23i$ and $23j$, $23k$ and $23l$, and $23m$ and $23n$ to obtain minimum values, and output the obtained minimum value data to the MAX processor 28 (step R7). This operation corresponds to processing for cutting the peak of a THEN part membership function, i.e., modifying the THEN part membership function according to the IF part computation result.

The MAX processor 28 obtains a maximum value of the minimum value data (modified THEN part membership functions) supplied from the MIN processors $26a$ to $26g$ (step R8). The MAX processor 28 outputs the obtained maximum value data to the multiplexer 27 through the register 29. This operation corresponds to processing for combining a plurality of modified THEN part membership functions.

Thus, the computations associated with the THEN parts are completed.

The controller 18 causes the multiplexer 27 to select the maximum value data from the MAX processor 28, and to supply it to the adder 30 and the multiplier 31. The controller 18 also causes the multiplexer 24 to select the count value of the counter 36, and to output it to the multiplier 31 (step R9).

The multiplier 31 multiplies the outputs from the multiplexers 24 and 27. More specifically, the multiplier 31 sequentially calculates the product of the count value "0" of the counter 36 and the grade of the THEN part membership function when the output from the multiplexer 27 is "0", the product of the count value "1" of the counter 36 and the grade of the THEN part membership function when the output from the multiplexer 27 is "1", . . . . . The multiplexer 39 initially selects "0", and thereafter, selects the output from the register 40. For this reason, the adder 38 accumulates the outputs from the multiplier 31. The final output from the adder 38 corresponds to a moment of the combined THEN part membership function (step R10).

The multiplexer 32 initially selects "0", and thereafter, selects the outputs from the register 34. For this reason, the adder 30 accumulates the grades of the THEN part membership functions supplied from the multiplexer 27. Therefore, the final output from the adder 30 corresponds to an area of the combined THEN part membership function (step R10).

The divider 35 divides the moment finally obtained in the register 40 with the area obtained in the register 34 to calculate a center of gravity value (step R11).

After the center of gravity value is obtained, the controller 18 interrupts the CPU 1 through the CPU bus 11 to inform to the CPU 1 that the computations are completed. Furthermore, the controller 18 supplies the obtained center of gravity value to the CPU 1 through the CPU bus 11 (step R12).

Thus, the operations of the circuits in the chip 10 are completed.

The CPU 1 fetches the obtained center of gravity value, and uses it in a control operation. When this center of gravity data is used, fuzzy control can be executed with high accuracy.

The flow charts shown in FIGS. 4C and 4D sequentially describe steps R4 to R10. However, the processing operations in steps R4 to R10 are parallelly executed in turn based on the count values output from the multiplexer 22.

(3-2) operation of the system based on average height method

The fuzzy inference operation based on the average height method will be described below.

The operation of the CPU and the IF part computation of the chip 10 upon execution of the operation based on the average height method are the same as those in the above-mentioned operation based on the center of gravity method, and only THEN part computations will be described below.

In the case of the average height method, in each THEN part membership function, when the x-coordinate has a given value, the y value assumes "1"; when the x-coordinate has another value, the y value assumes "0". The pattern generators 21a to 21g output x-coordinate values when the y value assumes "1".

The THEN part membership functions output from the pattern generators 21a to 21g are supplied to the multiplexer 27.

The multiplexers 24 and 27 sequentially and selectively output the x-coordinate values from the corresponding pattern generators 21a to 21g, and the outputs from the ω registers 23a, 23c, 23e, 23g, 23i, 23k, and 23m. For example, the multiplexers 24 and 27 output the output from the pattern generator 21a and the value held in the ω register 23a, then, the output from the generator 21b and the value held in the register 23c, then, the output from the generator 21c and the value held in the ω register 23e, . . . .

The operation of the center of gravity processor 17 is the same as the above-mentioned operation. However, computations in the multiplier 31, and the adders 38 and 30 are completed upon some cycles. The average height method is effective when the importance is placed on the inference speed rather than control accuracy.

In this embodiment, the chip 10 executes the IF and THEN part computations. The present invention is not limited to this. For example, the CPU 1 may perform IF part computations and set the computation results in the ω registers 23a to 23m, and the chip 10 may perform only THEN part computations. The intermediate results of fuzzy operations can be confirmed by reading out the contents of the ω registers 23a to 23m, thus facilitating debugging and evaluation of the chip.

(4) Detailed arrangement and operation of circuit shown in FIG. 3

(4-1) Detailed circuit arrangement of pattern generators 21a to 21g (4-1-A) The detailed circuit arrangement of the pattern generators 21a to 21g will be described below with reference to FIG. 5.

Each of the pattern generators 21a to 21g has nine banks. FIG. 5 shows the arrangement of one bank.

In FIG. 5, data from the CPU bus 11 is input to one of a Bx register 51a, a Cy register 51b, a Dx register 51c, a Dy register 51d, an Ex register 51e, an Fy register 51f, and a Gx register 51g. The registers 51a to 51f hold x- or y-coordinates of a membership function, and designate the pattern of the membership function according to their holding contents. The Bx register 51a, the Cy register 51b, the Fy register 51f, and the Gx register 51g hold 11-bit coordinate data including one most significant bit (MSB) representing the pattern of the membership function, the Dx register 51c and the Ex register 51e hold 10-bit coordinate data, and the Dy register 51d holds 8-bit coordinate data.

Lower 10-bit data of x-coordinate data Bx held in the Bx register 51a is supplied to comparators 52a and 52b, and a multiplexer 54, and the MSB representing the pattern of the membership function is supplied to an AND gate 56a through an inverter 55a. Lower 10-bit data of y-coordinate data Cy held in the Cy register 51b is supplied to a multiplexer 57, and the MSB is supplied to an AND gate 56b through an inverter 55b. X-coordinate data Dx held in the Dx register 51c is supplied to the comparator 52b and a comparator 52c, and a multiplexer 58. Y-coordinate data Dy held in the Dy register 51d is supplied to the multiplexer 58, and x-coordinate data Ex held in the Ex register 51e is supplied to the comparator 52c and a comparator 52d. The MSB of y-coordinate data Fy held in the Fy register 51f is supplied to an AND gate 56c through an inverter 55c, and lower 10-bit data is supplied to the multiplexer 57. The MSB of x-coordinate data Gx held in the Gx register 51g is supplied to an AND gate 56d through an inverter 55d, and lower 10-bit data is supplied to comparators 52d, 52e and a multiplexer 53.

The comparators 52a to 52e and the multiplexers 53 and 54 receive a 10-bit input value x (coordinate value, e.g., a temperature detected by the sensor 5) supplied from the multiplexer 22.

The comparator 52a is supplied with a constant "0" as a minimum value of the 10-bit input value x. The comparator 52a checks if the input value x is equal to or larger than "0", and is smaller than the held value Bx in the Bx register 51a, and outputs the check result to the AND gate 56a. The comparator 52b checks if the input value x is equal to or larger than the held value Bx in the Bx register 51a, and is smaller than the held value Dx in the Dx register 51c, and outputs the check result to the AND gate 56b. The comparator 52c checks if the input value x is equal to or larger than the held value Dx in the Dx register 51c, and is smaller than the held value Ex in the Ex register 51e, and outputs the check result to a control circuit 59. The comparator 52d checks if the input value x is equal to or larger than the held value Ex in the Ex register 51e, and is smaller than the held value Gx in the Gx register 51g, and outputs the check result to the AND gate 56c. The comparator 52e is supplied with a constant "3FFH (=1,023)" as a maximum value of the 10-bit input value x. The comparator 52e checks if the input value x is equal to or larger than the held value Gx in the Gx register 51g, and is smaller than "1,023", and outputs the check result to the AND gate 56d. The outputs from the AND gates 56a to 56d are input to the control circuit 59.

The control circuit 59 supplies a control signal to the multiplexers 53, 54, 57, and 58 according to the outputs from the AND gates 56a to 56d and the check result from the comparator 52c. The multiplexer 53 selects one of the input value x and the held value Gx in the Gx register 51g according to the control signal from the control circuit 59, and outputs the selected value to a subtracter (SUB) 60. The multiplexer 54 selects one of the held value Bx in the Bx register 51a and the input value x according to the control signal from the control circuit 59, and outputs the selected value to the subtracter 60.

The subtracter 60 performs a subtraction "x–Bx" or "Gx–x", and outputs the difference as 10-bit data to a register 61. The register 61 temporarily holds the difference, and then outputs it to a multiplier (MUL) 62. The multiplexer 57 selects one of the held value Cy in the Cy register 51b and the held value Fy in the Fy register 51f according to the control signal from the control circuit 59, and outputs the selected value to a register 63. The register 63 temporarily holds the supplied data, and then outputs it to the multiplier 62. The multiplier 62 multiplies the held value in the register 61 with the held value in the register 63 to obtain 8-bit data, and outputs the product data to the multiplexer 58. The multiplexer 58 selects one of the constant "0", the product data output from the multiplier 62, and the held value Dy in the Dy register 51d according to the control signal from the control circuit 59, and outputs the selected data as 8-bit data. The output data from the multiplexer 58 is output as an output value y of this membership function generator 12, and is also supplied onto the CPU bus 11 through a tristate buffer 65.

As described above, each of the pattern generators 21a to 21g comprises nine banks. For this reason, although not shown, nine sets of registers 51a to 51g are arranged in correspondence with nine variables. The outputs from the nine sets of registers are switched by multiplexers (not shown), and are supplied to the comparators 52a to 52e, the inverters 55a to 55d, and the multiplexers 53 and 54.

Note that the arrangement shown in FIG. 5 may be arranged in one pattern generator, the output from this arrangement may be selected by a multiplexer, and the selected output may be output as an output signal from the pattern generators 21a to 21g.

(4-1-B) The operation of the pattern generator shown in FIG. 5 will be described below.

In general, a membership function has a pattern shown in FIG. 6. The pattern is determined by points A to G in FIG. 6. The point A corresponds to the start point of the membership function, and its x-coordinate is "0". The point B is a rising start point of the membership function. The point C is a point having an x-coordinate larger than that of the point B by "1", and its y-coordinate value represents the inclination of the membership function. The point D is a point where the membership function reaches a maximum value. The point E is a falling start point from the maximum value of the membership function, and its y-coordinate is the same as that of the point D. The point G is the end point of the membership function. The point F is a point having an x-coordinate smaller than that of the point G by "1", and its y-coordinate value represents the inclination of the membership function.

The x-coordinate of the point A is a fixed value, and the points D and E have the same y-coordinate. Therefore, when a coincidence or non-coincidence of a plurality of points can be specified, the pattern of the membership function can be defined by the x-coordinate data of the point B, the y-coordinate data of the point C, the x- and y-coordinate data of the point D, the x-coordinate data of the point E, the y-coordinate data of the point F, and the x-coordinate data of the point G.

Thus, in this embodiment, the above-mentioned seven coordinate data are set in advance in the ROM 3 in units of membership functions. The CPU 1 reads out the above-mentioned coordinate data from the ROM 3 upon power-ON, and sets them in the Bx register 51a to Gx register 51g through the CPU bus 11. The Bx register 51a to Gx register 51g hold the corresponding coordinate data (step P3 in FIG. 4A).

FIGS. 6 to 17 show examples of membership functions. A detailed description will be made below with reference to FIGS. 6 to 17. For example, in the case of a membership function shown in FIG. 6, x-coordinate data i of the point B in FIG. 6 is held in the Bx register 51a; y-coordinate data k of the point C is held in the Cy register 51b; x-coordinate data j and y-coordinate data q of the point D are respectively held in the Dx and Dy registers 51c and 51d; x-coordinate data m of the point E is held in the Ex register 51e; y-coordinate data n of the point F is held in the Fy register 51f; and x-coordinate data p of the point G is held in the Gx register 51g.

For example, when a plurality of points have the same coordinates like the points A and B in FIG. 7, and the points E, F, and G in FIG. 8, the same coordinate data are respectively held in the corresponding registers. In this case, bit data "1" indicating that the two coordinates are equal to each other is set in the MSB of a coordinate value in advance (the bit data "1" is set when parameters (coordinate data) for defining membership functions are stored in the ROM 3).

The comparators 52a to 52e judge, based on the coordinate data held in the Bx register 51a to the Gx register 51g, the coordinate range of a membership function in which the input value x is included.

For the sake of easy understanding, assume that the coordinate data of the membership function shown in FIG. 6 are stored in the Bx register 51a to the Gx register 51g. In this case, when the input value x falls within a range of "0≦x <Bx", only the comparator 52a sets its output to be "1". The MSB (11th bit) of the x-coordinate data of the point B held in the Bx register 51a is data "0" indicating that the points A and B are not common to each other. This MSB is inverted by the inverter 55a, and the inverted data is supplied to the AND gate 56a. For this reason, both the two inputs of the AND gate 56a go to "1", and the output signal from the AND gate 56a to the control circuit 59 goes to "1". Based on this output signal, the control circuit 59 recognizes that in this membership function, the point B is not common to the point A, and the input value x falls within the range of "0≦x<Bx", and causes the multiplexer 58 to select and output a numerical value "0". Therefore, the output value y corresponding to the input value x, and output through a register 64 becomes "0".

When the input value x falls within a range of "Bx≦x<Dx", the output from the comparator 52b goes to "1". At this time, the MSB of the y-coordinate data of the point C held in the Cy register 51b is "0" indicating that the point D is not common to the point B. This MSB is inverted by the inverter 55b, and the inverted data is supplied to the AND gate 56b. For this reason, the two inputs of the AND gate 56b go to "1", and the output signal from the AND gate 56b to the control circuit 59 goes to "1". Based on this output signal, the control circuit 59 recognizes that in this membership function, the point D is not common to the point B, and the input value x falls within the range of "Bx≦x<Dx". Thus, the control circuit 59 causes the multiplexer 53 to select the input value x, and causes the multiplexer 54 to select the x-coordinate data Bx of the point B. Furthermore, the control circuit 59 causes the subtracter 60 to execute a subtraction "x−Bx". This subtraction calculates the difference (distance) between the input coordinate value x and the x-coordinate value of the point B, and the calculated data is held in the register 61. The control circuit 59 causes the multiplexer 57 to select the y-coordinate data Cy of the point C, and causes the multiplier 62 to execute a multiplication "Cy(x−Bx)". The y-coordinate data Cy of the point C represents an increment of the y-coordinate of the membership function with respect to an increment "1" of the x-coordinate data within the range of "Bx≦x<Dx". Therefore, this multiplication obtains the value y of the membership function corresponding to the input value x. The obtained product data, i.e., the value y of the membership function is output to the multiplexer 58. The control circuit 59 causes the multiplexer 58 to select the product data from the multiplier 62. Therefore, the output value y output from the register 64 becomes the product data from the multiplier 62.

When the input value x falls within a range of "Dx≦x<Ex", the comparator 52c sets an output to the control circuit 59 to be "1". Based on this output signal, the control circuit 59 recognizes that the input value x falls within the range of "Dx≦x<Ex", and causes the multiplexer 58 to select the y-coordinate data Dy of the point D held in the Dy register 51d. Therefore, the output value y output from the register 64 becomes the y-coordinate data Dy of the point D held in the Dy register 51d.

When the input value x falls within a range of "Ex≦x<Gx", the outputs from the comparators 52d and the inverter 55c go to "1". The control circuit 59 causes the multiplexer 53 to select and output the x-coordinate data Gx, and causes the multiplexer 54 to select and output the input value x. The control circuit 59 causes the subtracter 60 to execute a subtraction "Gx−x". On the other hand, the control circuit 59 causes the multiplexer 57 to select the y-coordinate data Fy representing a decrement of the y-coordinate corresponding to an increment "1" of the x-coordinate data, and causes the multiplier 62 to execute a multiplication "Fy(Gx−x)". The control circuit 59 outputs the obtained product data as the output value y through the multiplexer 58 and the register 64.

When the input value x falls within a range of "Gx≦x<1, 023", the control circuit 59 causes the multiplexer 58 to select a numerical value "0", and outputs it as the output value y through the register 64.

As described above, the output values y representing the grades of a membership function with respect to the input values x can be obtained by the small-scale circuit arrangement.

Therefore, for example, when coordinate data for defining IF part membership functions are set in the registers 51a to 51g (including the remaining 56 registers, which are not shown), and data detected by the sensor is input, the grades of the IF part membership functions can be obtained. When coordinate data for determining THEN part membership functions are set in the registers 51a to 51g, and a count value, which is sequentially incremented from "0", is input as data x, the THEN part membership function can be output.

Figure 17:
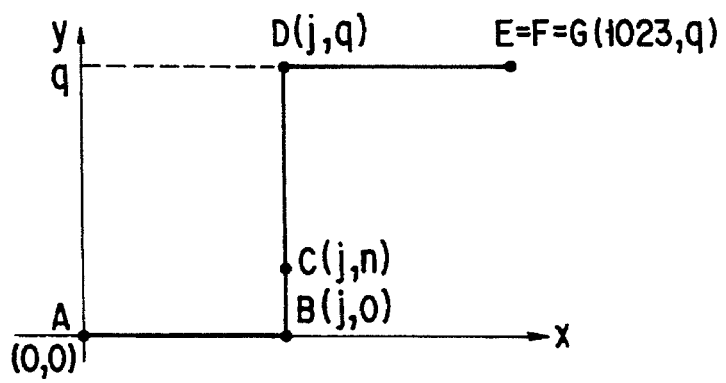

In the case of the average height method or height method, a membership function is defined, as shown in FIG. 17, and in this case, the points B and G, C and F, and D and E are common to each other. The control circuit 59 detects this, and sets the x-coordinate of the point D stored in the Dx register in the multiplexer 58.

The bits for defining the pattern of a membership function are appended as the MSBs of coordinate data Bx, Cy, Fy, and Gx, but another data may be adopted. That is, data for defining the pattern of the membership function may be directly supplied to the control circuit 59, and the control circuit 59 may discriminate the pattern of the membership function on the basis of this data.

The arrangements shown in FIGS. 18 to 20 may be used in place of the multiplexer 22. FIG. 18 shows an arrangement wherein a latch circuit 22a is arranged at the input portion of a pattern generator (membership function generator) 21. The latch circuit 22a latches an input value x from the CPU 1, and the pattern generator 21 outputs an output value y. In this manner, when a membership value y is obtained in correspondence with an input value x, the pattern generator 21 can be used as an IF part membership function generator.

FIG. 19 shows an arrangement wherein a counter 22b with a clear function is arranged at the input portion of the pattern generator 21. The counter 22b is reset by a clear signal CLR, and sequentially performs a count-up or count-down operation in response to clocks CLK. The pattern generator 21 outputs continuous output values y according to the count values from the counter. In this manner, when the continuous membership values y are obtained in correspondence with the continuous count value x, the pattern generator 21 can be used as a THEN part membership function generator.

FIG. 20 shows an arrangement wherein a counter 22c with a load function is arranged at the input portion of the pattern generator 21. The counter 22c loads an input value x from the CPU 1 in response to a load signal LD, and then sequentially performs a count-up or count-down operation in response to clocks CLK using the loaded value as an initial value. Since a membership value y corresponding to an arbitrary input value x and continuous membership values y corresponding to continuous count values x can be obtained, the pattern generator 21 can be used as a membership function generator for IF and THEN parts.

As described above, according to the arrangement shown in FIG. 5, all membership functions need not be stored in a memory, and the volume of transfer data can be greatly decreased. Furthermore, the membership function generator can be constituted by a small-scale circuit, and membership functions for fuzzy inference can be generated at high speed.

Note that the arrangement shown in FIG. 5 need not always be used in the arrangement shown in FIG. 3, and may be used in combination with other fuzzy processors (e.g., circuits which are not integrated in one chip) so as to output membership functions or membership function values.

(4-2) Details of IF part processor 25

(4-2-A) The detailed circuit arrangement of the IF part processor will be described below with reference to FIG. 21. The circuit shown in FIG. 21 exemplifies a case wherein the number of variables for IF parts is 8, and seven membership functions are present for one variable.

8-bit membership function values supplied from the pattern generators 21a to 21g are input to register groups 71a to 71h. Each of the register groups includes seven 8-bit registers. Thus, each register group stores function values of different membership functions for one variable.

The membership function values held in the register groups 71a to 71h are respectively supplied to multiplexers 72a to 72h. The multiplexers 72a to 72h are controlled by a control signal from the controller 18, so that each multiplexer selects data held in a corresponding one of the seven registers, and outputs the selected data to a minimum value (MIN) processor 73. Note that the output terminals of the multiplexers 72a to 72h in an inactive state are set in an open state. The MIN processor 73 obtains a minimum value of the supplied grades, and supplies the obtained 8-bit minimum value data to a MAX processor 75 through a register 74. The MAX processor 75 obtains a maximum value to combine two or more labels of a THEN part to one according to a fuzzy rule, and stores the obtained maximum value data in a register 76. The 8-bit data held in the register 76 is output to the ω registers 23a, 23c, 23e, 23g, 23i, 23k, and 23m through a tristate buffer 77, and is also fed back to the MAX processor 75.

(4-2-B) The operation of the IF part processor 25 with the above-mentioned arrangement will be described below.

Each of the pattern generators 21a to 21g comprises eight banks for IF parts, and these generators output the grades of seven membership functions in units of variables according to variable values supplied from the CPU 1. The grades of the membership functions output from the pattern generators 21a to 21g are set in the register groups 71a to 71h in units of variables. In other words, seven outputs from the first banks are set in A1 to A7 registers of the register group 71a, seven outputs from the second banks are set in B1 to B7 registers of the register group 71b, . . . , seven outputs from the eighth banks are set in H1 to H7 registers of the register group 71h.

Assuming that the above-mentioned Fuzzy Rules 1 to 3 are designated by the CPU 1, a detailed explanation will be given below.

For example, the A1 to A7 registers respectively hold the grade of the membership function when a variable A1 is very small, the grade of the membership function when the variable A1 is small, the grade of the membership function when the variable A1 is medium small, the grade of the membership function when the variable A1 is medium, the grade of the membership function when the variable A1 is medium large, the grade of the membership function when the variable A1 is large, and the grade of the membership function when the variable A1 is very large. Similarly, the B1 to B7 registers respectively hold the grade of the membership function when a variable A2 is very small, . . . , the grade of the membership function when the variable A2 is very large. The C1 to H7 registers similarly hold corresponding grades.

When the grades are set in the register groups 71a to 71h, the controller 18 supplies a reset signal to the register 76, and then supplies a selection control signal to the multiplexers 72a to 72h according to the rules. The multiplexers 72a to 72h select the necessary grades in units of rules in response to the selection control signal, and output the selected grades to the MIN processor 73.

For example, as for the above-mentioned Rule 1, the multiplexer 72a selects the grade of the membership function when the variable A1 is small, which grade is held in the A2 register, the multiplexer 72b selects the grade of the membership function when the variable A2 is large, which grade is held in the B6 register, . . . , the multiplexer 72h selects the grade of the membership function when a variable A8 is large, which grade is held in the H6 register.

The MIN processor 73 obtains the minimum value of the supplied grades, and supplies the minimum value to the MAX processor 75 through the register 74. The other input terminal of the MAX processor 75 receives data "0" from the register 76 (since the value held in the register 76 is reset to "0" in response to the reset signal from the controller 18). The MAX processor 75 selects a larger one of the two input data. In this case, the MAX processor 75 compares the minimum value of the grades of the IF part associated with Rule 1 with "0", selects the minimum value supplied from the register 74, and sets the selected value in the register 76.

Meanwhile, Rules 1 and 3 includes the same THEN part. In a MAX-MIN processing method, the maximum value of THEN parts of Rules 1 and 3 is finally obtained. Thus, this circuit performs an operation for combining membership functions by obtaining a maximum value as for rules including the same THEN part at this time.

For this purpose, in order to perform MIN processing for Rule 3, the controller 18 controls the multiplexers 72a to 72h to supply the values held in the A7 register, B7 register, . . . , H3 register to the MIN processor 73.

The MIN processor 73 selects the minimum value of the input grades, and supplies it to the MAX processor 75 through the register 74. The other input terminal of the MAX processor 75 receives the minimum value of the grades for Rule 1 from the register 76. The MAX processor 75 compares the minimum value of the grades for Rule 3 from the register 74 with the minimum value of the grades for Rule 1 from the register 76, selects a larger one, and supplies it to the register shown in FIG. 3, e.g., the register 23a, through the register 76 and the tristate buffer 77.

When IF part processing for a rule having a different label of a THEN part from that of the processed rule is performed, the controller 18 supplies a clear signal to the register 76 to clear the content of the register 76. For example, the THEN part of Rule 2 is different from those of Rules 1 and 3. For this reason, upon completion of processing for Rules 1 and 3, the controller 18 resets the register 76, and then executes processing for Rule 2. Since there is no rule including the same THEN part as that of Rule 2, the minimum value of the grades associated with Rule 2 is held in the ω register shown in FIG. 3, e.g., the register 23c, through the register 74, the register 76, and the tristate buffer 77.

As described above, the IF part computation results are held in the ω registers 23a, 23c, 23e, 23g, 23i, 23k, and 23m shown in FIG. 3.

When fuzzy rules are stored in the rule memory 19, it is efficient to store rules including the same THEN part as one group.

Note that the arrangement shown in FIG. 21 need not always be used in the arrangement shown in FIG. 3, and may be used in combination with other fuzzy processors (e.g., circuits which are not integrated in one chip) so as to obtain the minimum value of the IF part membership function values.

(4-3) Details of multiplexer 22

(4-3-A) Arrangement of multiplexer 22

The detailed arrangement of the multiplexer 22 will be described below with reference to FIG. 22. The multiplexer 22 comprises an A register 81a to H register 81h, a program counter 82, and a multiplexer 83.

The A register 81a to H register 81h are registers for holding the 10-bit input variables x supplied from the CPU 1. Since there are eight variables, the A to H registers are prepared. With reference to the above-mentioned Rules 1 to 3, for example, the A register 81a stores an input value of the variable A1, the B register 81b stores an input value of the variable A2, . . . , the H register 81h stores an input value x of the variable A8.

The program counter 82 is a 10-bit counter, and is used for THEN part computations.

The multiplexer 83 selects, according to an instruction from the controller 18, an input value x held in one of the A register 81a to H register 81h in IF part computations, or a count value of the program counter 82 in THEN part computations, and outputs the selected value to the pattern generators 21a to 21g.

(4-3-B) The operation is as follows.

As has been described above with reference to FIG. 4B, in step Q1, the CPU 1 supplies variable values to the multiplexer 22 in turn through the CPU bus 11. The A register 81a to H register 81h fetch the corresponding variable values in response to fetch signals AW to GW supplied from the CPU 1 through a control bus in the CPU bus 11.

Thereafter, the controller 18 controls the multiplexer 83 to sequentially supply the values held in the A register 81a to H register 81h to the pattern generators 21a to 21g. In response to these inputs, the pattern generators 21a to 21g output grades for the corresponding variables.

In THEN part computations, the controller 18 sets an initial value in the counter 82, and supplies a start signal. Thereafter, the counter 82 sequentially updates an x-coordinate value. The controller 18 controls the multiplexer 83 to sequentially output the count value of the counter 82 to the pattern generators 21a to 21g. Thus, the pattern generators 21a to 21g continuously output grades.

Note that the arrangement shown in FIG. 22 need not always be used in the arrangement shown in FIG. 3, and may be used in combination with other fuzzy processors (e.g., circuits which are not integrated in one chip) so as to generate IF part membership function values, and THEN part membership functions.

(5) The present invention is not limited to the above embodiment, and various changes may be made. Modifications of the above embodiment will be described hereinafter.

(5-1) Modification of pattern generators 21a to 21g (5-1-A) Arrangement

A modification of the pattern generators 21a to 21g will be described below with reference to FIG. 23. This modification exemplifies a pattern generator exclusively used for THEN parts. In this modification, all the coordinate data are 10-bit data. An A register 92a stores y-coordinate data of a point A, a B register 92b stores x- and y-coordinate data of a point B, and a C register 92c stores x- and y-coordinate data of a point C. A D register 92d stores x- and y-coordinate data of a point D, an E register 92e stores x- and y-coordinate data of a point E, an F register 92f stores x- and y-coordinate data of a point F, and a G register 92g stores x- and y-coordinate data of a point G.

The y-coordinate data of the point A held in the A register 92a is supplied to a comparator 93a. The x- and y-coordinate data of the point B held in the B register 92b are supplied to the comparator 93a and a comparator 93b. The y-coordinate data of the point B held in the B register 92b is also supplied to a subtracter (SUB) 94a, and the x-coordinate data is supplied to a Bx comparator 95a. The x- and y-coordinate data of the point C held in the C register 92c are supplied to the comparator 93b and a comparator 93c. Furthermore, the y-coordinate of the point C held in the C register 92c is supplied to the subtracter 94a.

The x- and y-coordinate data of the point D held in the D register 92d are supplied to the comparator 93c, a comparator 93d, and a multiplexer (MUX) 96. Furthermore, the x-coordinate data of the point D held in the D register 92d is supplied to a Dx comparator 95b. The x-and y-coordinate data of the point E held in the E register 92e are supplied to the comparator 93d and a comparator 93e. Furthermore, the y-coordinate of the point E held in the E register 92e is supplied to a subtracter 94b, and the x-coordinate data is supplied to an Ex comparator 95c.

The x- and y-coordinate data of the point F held in the F register 92f are supplied to the comparator 93e and a comparator 93f, and the y-coordinate data is also supplied to the subtracter 94b. The x- and y-coordinate data of the point G held in the G register 92g are supplied to the comparator 93f, and the x-coordinate data is also supplied to a Gx comparator 95d.

The comparators 93a to 93f check if the input coordinate data are equal to each other, and output the check results to a control unit 97.

The subtracter 94a subtracts the coordinate data By from the coordinate data Cy, and outputs the difference data to a multiplexer 99 through a register 98. The subtracter 94b subtracts the coordinate data Ey from the coordinate data Fy, and outputs the difference data to a multiplexer 101 through a register 100.

The Bx comparator 95a, the Dx comparator 95b, the Ex comparator 95c, and the Gx comparator 95d receive a 10-bit input value from the multiplexer 22, and compare the input value with the 10-bit x-coordinate data. The comparison results are output the control unit 97. The input value is also supplied to an x comparator 95e. The x comparator 95e compares the input value with a constant "1,023=3FF(H)" as the maximum value of the input value, and outputs the comparison result to the control unit 97.

The multiplexer 99 selects one of the difference data supplied from the subtracter 94a through the register 98, and a constant "0" in correspondence with an instruction signal from the control unit 97, and outputs the selected data to an adder (ADD) 103. A multiplexer 104 selects one of the constant "0" and 8-bit sum data output from the adder 103 in correspondence with the instruction signal from the control unit 97, and supplies the selected data to the adder 103.

The adder 103 adds the two inputs from the multiplexers 99 and 104. The adder 103 outputs the sum data to a multiplexer 106 through a register 105, and also feeds it back to the multiplexer 104.

The multiplexer 101 selects one of the difference data supplied from the subtracter 94b through the register 100, and a constant "0" in correspondence with an instruction signal from the control unit 97, and outputs the selected data to a subtracter 107. The multiplexer 96 selects one of the coordinate data Dy from the D register 92d and 8-bit difference data output from the subtracter 107 in correspondence with an instruction signal from the control unit 97. The subtracter 107 subtracts the output from the multiplexer 101 from the output from the multiplexer 96. The subtracter 107 outputs the difference data to the multiplexer 106 through a register 108, and also feeds it back to the multiplexer 96.

The multiplexer 106 selects one of the two data supplied from the adder 103 and the subtracter 107 through the registers 105 and 108 in correspondence with an instruction signal supplied from the control unit 97 through a register 109, and outputs the selected data as a membership value.

(5-1-B) Operation

The operation of the pattern generator shown in FIG. 23 will be described below with reference to the flow chart shown in FIG. 24, and FIGS. 25 to 36, which show various patterns of membership functions. A difference between FIGS. 25 to 36 and FIGS. 6 to 17 is that in FIGS. 6 to 17, the x-coordinate of the point F has a value smaller than the x-coordinate of the point G by one, while in FIGS. 25 to 36, the x-coordinate of the point F has a value larger than the x-coordinate of the point E by one.

Figure 24:
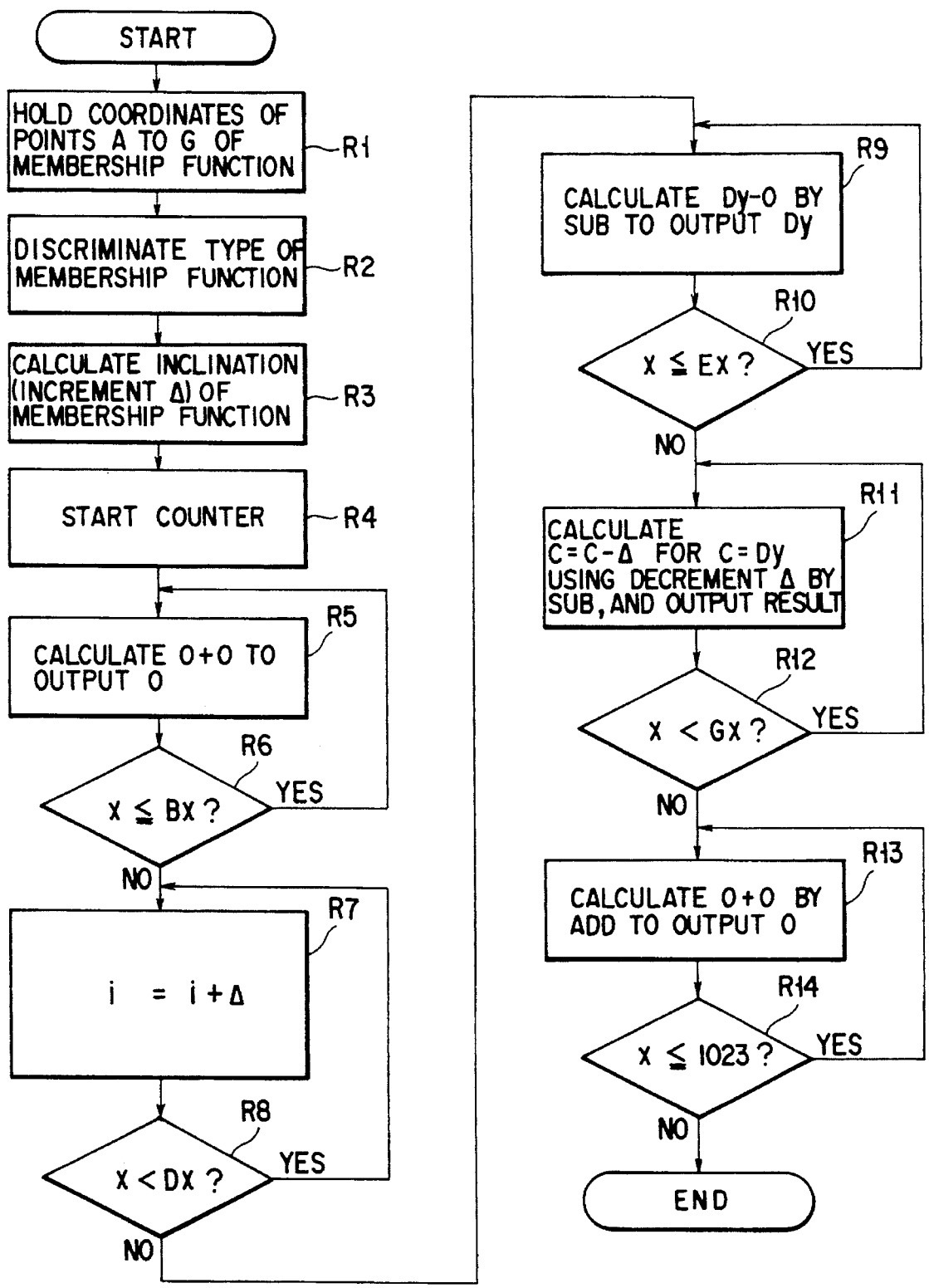
FIG. 24 is a flow chart for explaining the operation of the pattern generator shown in FIG. 23.

FIG. 24 shows the processing sequence when a THEN part membership function is generated, and operation control thereof is mainly made by the control unit 97.

At the beginning of an operation, coordinate data of seven coordinate points A to G for defining a type of membership function are supplied from the CPU 1 through the CPU bus 11, and are respectively held in the registers 92a to 92g (step R1).

FIGS. 25 to 36 show 12 types of membership functions together with the points A to G as feature points. Assuming that the membership function shown in FIG. 25 is a basic pattern of a membership function in which all the points A to G are independent from each other, other membership functions can be considered as membership functions in which two or more points in the membership function shown in FIG. 25 are common to each other.

Assume that the coordinate data of the points A to G of the membership function shown in FIG. 25 are held in the registers 92a to 92g. The coordinate data held in the registers 92a to 92g are directly supplied to the comparators 93a to 93f. The comparators 93a to 93f compare the coordinate data of each two adjacent points, i.e., the points A and B, the points B and C, the points C and D, the points D and E, the points E and F, and the point F and G to check if the two data coincide with each other, and output the comparison results to the control unit 97. The control unit 97 discriminates the type of membership function on the basis of the comparison results from the comparators 93a to 93f (step R2).

In this case, since all the points A to G are independent from each other, no coincidence is found from these data, and the control unit 97 determines based on the comparison results that the input coordinate data define a membership function shown in FIG. 25.

Figure 31:
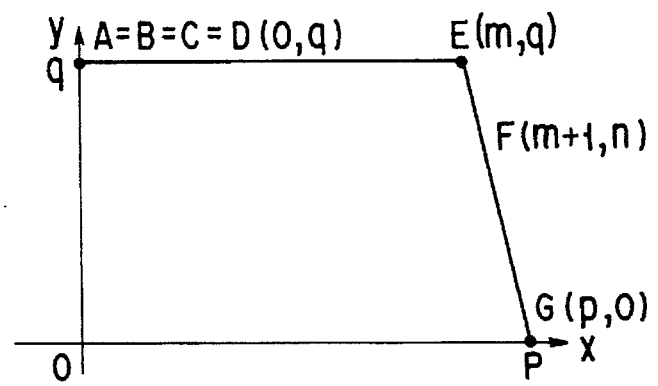
Figure 32:
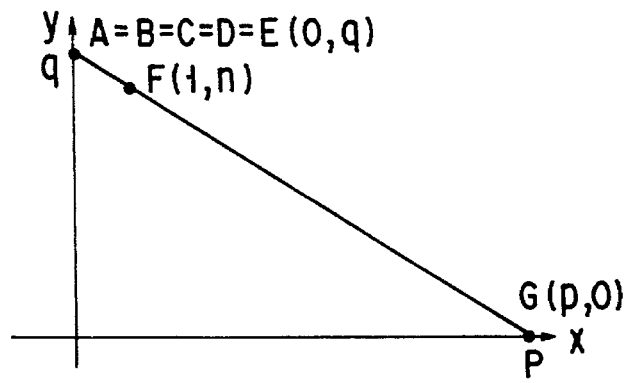
Figure 33:
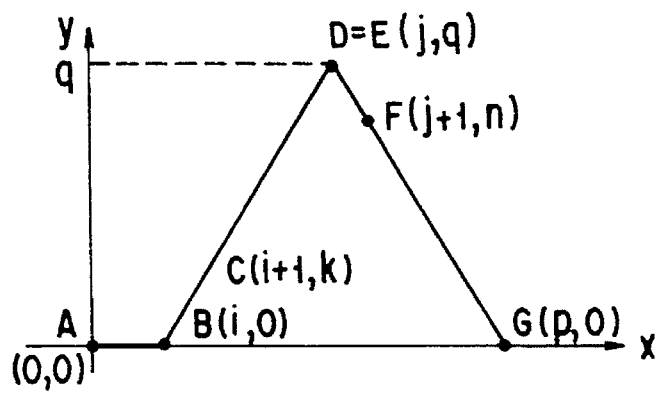

For example, assume that the coordinate data of a membership function shown in FIG. 31 are held in the registers 92a to 92g. The control unit 97 receives the comparison results indicating a coincidence between the two coordinate data from the comparators 93a, 93b, and 93c, and receives the comparison results indicating a non-coincidence between the two coordinate data from the comparators 93d to 93f. Therefore, the control unit 97 determines that the coordinate data held in the registers 92a to 92g define a membership function shown in FIG. 31.

Then, the control unit 97 causes the subtracters 94a and 94b to calculate the inclinations in increasing/decreasing range portions in the membership function (step R3). More specifically, the control unit 97 calculates increments (decrements) $\Delta$ of y-coordinates with respect to x-coordinates between the points B and D, and between the points E and G.

The subtracter 94a subtracts the y-coordinate data By of the point B from the y-coordinate data Cy of the point C as a position obtained by increasing the x-coordinate by "+1" from the point B, and stores difference data $\Delta$ (a value "k" in FIG. 25) in the register 98.

On the other hand, the subtracter 94b calculates the difference between the coordinate data Fy and Ey, also calculates an absolute value $\Delta$ (a value|n-g| in FIG. 25) of the difference, and stores it in the register 100.

The controller 18 causes the multiplexer 22 to output a count value of the internal counter (step R4).

In this case, assume that the count value of this counter is sequentially incremented from "0". During an interval until an output value x from the multiplexer 22 becomes equal to the x-coordinate data Bx of the point B, and a discrimination signal is output from the Bx comparator 95a, the control unit 97 causes the multiplexers 99 and 104 to select the constant "0", also causes the adder 103 to calculate "0+0", and stores the sum data "0" in the register 105. The control unit 97 supplies a control signal to the multiplexer 106 through the register 109 to select the value held in the register 105. For this reason, the multiplexer 106 keeps outputting "0" as a membership value (steps R5 and R6).

During an interval from a timing after the count value from the multiplexer 22 becomes equal to the x-coordinate data Bx of the point B until a timing immediately before it becomes equal to the x-coordinate data Dx of the point D, the control unit 97 causes the multiplexer 99 to select the value held in the register 98, and causes the multiplexer 104 to select the value held in the register 105. The adder 103 adds a value i (its initial value ="0") held in the register 105 to the increment data $\Delta$ calculated in step R3 to obtain "i+$\Delta$". The control unit 97 stores the obtained data "i+$\Delta$" in the register 105 as new "i". The control unit 97 causes the multiplexer 106 to select and output the value held in the register 105 as a membership value.

The sum data i held in the register 105 is fed back to the multiplexer 104, and is added to the increment data $\Delta$ by the adder 103 again. For this reason, the membership value is sequentially incremented by the increment data $\Delta$ (steps R7 and R8).

Thereafter, during an interval from when the count value from the multiplexer 22 becomes equal to the x-coordinate data Dx of the point D, and the discrimination signal from the Dx comparator 95b is input to the control unit 97 until the count value from the multiplexer 22 becomes equal to the x-coordinate data Ex of the point E, and the discrimination signal from the Ex comparator 95c is input to the control unit 97, the control unit 97 causes the multiplexer 96 to select the y-coordinate data Dy held in the D register 92d, and causes the multiplexer 101 to select the constant "0". Thus, the control unit 97 stores difference data "Dy (=Dy–0)" in the register 108. The control unit 97 supplies a control signal to the multiplexer 106 through the register 109 to select the value held in the register 108 and to output "Dy" as a membership value (steps R9 and R10).

During an interval from a timing after the count value from the multiplexer 22 exceeds the x-coordinate data Ex of the point E until a timing immediately before it becomes equal to the x-coordinate data Gx of the point G, the control unit 97 causes the multiplexer 101 to select the value held in the register 100, and causes the multiplexer 96 to select the value held in the register 108. Then, the control unit 97 controls to subtract the decrement data $\Delta$ (a value "ln-gl" in FIG. 25) calculated in step R3 from an output c (initial value "Dy") from the subtracter 107, and stores the difference data in the register 108. The control unit 97 causes the multiplexer 106 to select and output the output from the register 108 as a membership value. The difference data is fed back to the multiplexer 96 as a new output c, thus sequentially decrementing the membership value by the decrement data Δ (steps R11 and R12).

During an interval from when the count value from the multiplexer 22 becomes equal to the x-coordinate data Gx of the point G, and the discrimination signal from the Gx comparator 95d is input to the control unit 97 until the discrimination signal from the x comparator 95e is input to the control unit 97, the control unit 97 causes the multiplexers 99 and 104 to select the constant "0". Therefore, the adder 103 calculates "0+0", and stores the sum data "0" in the register 105. The control unit 97 causes the multiplexer 106 to select the value held in the register 105, so that "0" is kept output as a membership value (steps R13 and R14).

When the count value from the multiplexer 22 exceeds "1,023", this processing is ended.

In this modification, since membership functions need not be stored in a memory, the transfer data volume of the membership functions can be greatly decreased. A membership function generator, which can realize high-speed processing for generating membership functions with a small-scale circuit, and is used in fuzzy inference, can be provided.

Figure 23:
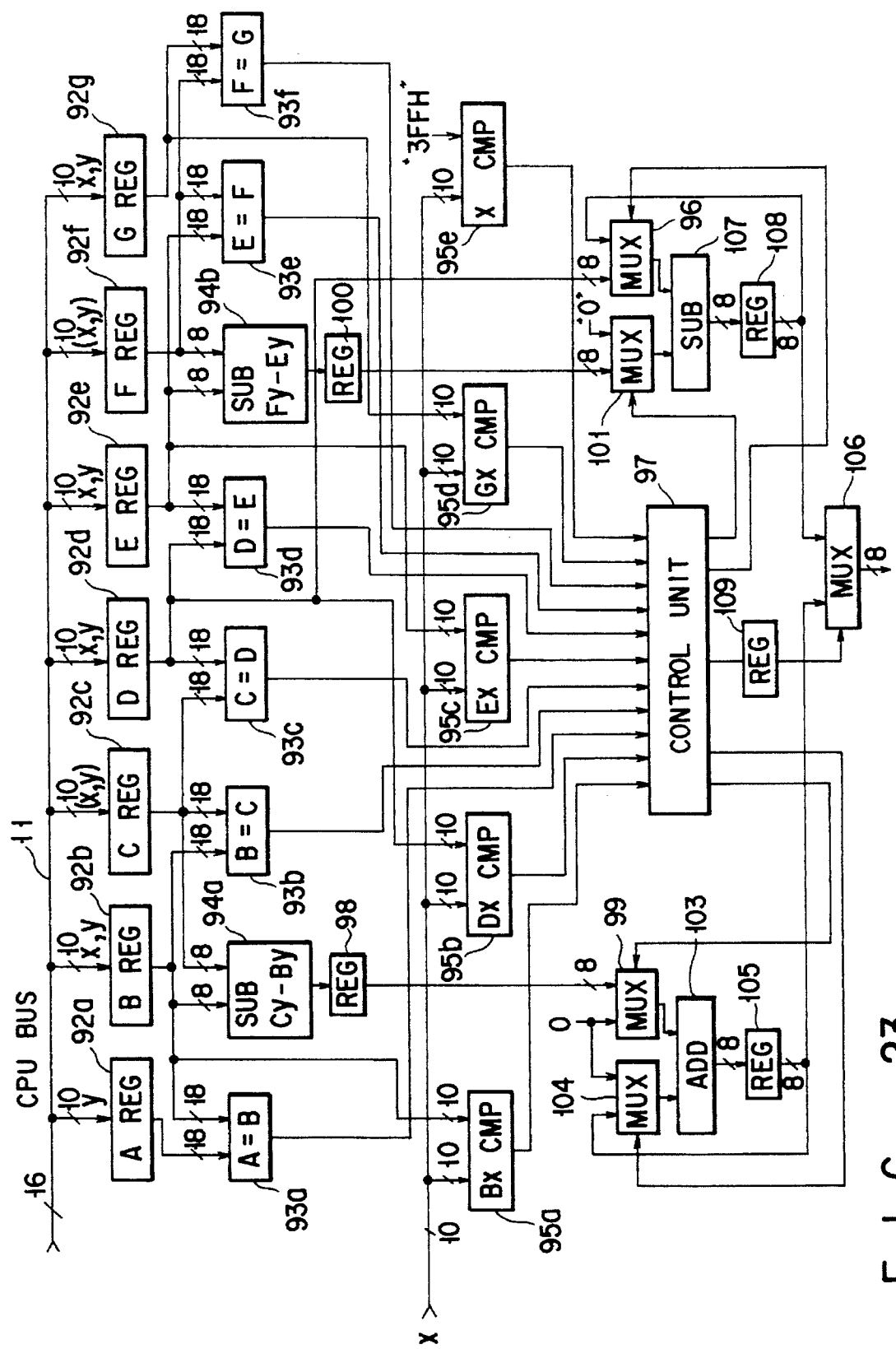
FIG. 23 is a block diagram showing another arrangement of the pattern generator.

In the arrangement shown in FIG. 23, the increment or decrement data Δ is sequentially added to the value i or c to obtain a membership value between the points B and D or between the points E and G. For this reason, the arrangement shown in FIG. 23 cannot be directly applied to a membership function generator for IF parts. However, when the arrangement shown in FIG. 23 (more specifically, an addition circuit (99 and 103 to 105) and a subtraction circuit (96, 101, 107, and 108)) is slightly modified, the circuit shown in FIG. 23 can be commonly used by IF and THEN parts. More specifically, the circuit is modified as follows. That is, when the input x-coordinate value falls within a range between the points B and D, the difference (distance) between the x-coordinate value of the point B and the coordinate value supplied from the multiplexer 22 is calculated, and is multiplied with the increment data Δ. The obtained value is added to the y-coordinate value of the point B. On the other hand, when the input x-coordinate value falls within a range between the points E and G, the difference between the x-coordinate value of the point G and the coordinate value supplied from the multiplexer 22 is calculated, and is multiplied with the decrement data Δ. The obtained value is subtracted from the y-coordinate value of the point E.

Note that the circuit shown in FIG. 23 need not always be used in the arrangement shown in FIG. 3, but may be used in other circuits.

(5-2) Modification of MIN processor in IF part processor

When the IF part processor 25 shown in FIG. 21 performs computations of fuzzy rules having a small number of input variables, some circuit portions are not used, and the computation time cannot be shortened although the computation amount is small.

An IF part processor improved in this respect will be described below.

(5-2-A) Arrangement

FIG. 37 is a detailed block diagram of the MIN processor 73 shown in FIG. 21.

Data FA and FB supplied from the register groups 71a and 71b through the multiplexers 72a and 72b are supplied to MIN processors M1 and M3. Data FC and FD read out from the register groups 71c and 71d through the multiplexers 72c and 72d are supplied to a MIN processor M2 and the MIN processor M3. Data FE and FF read out from the register groups 71e and 71f through the multiplexers 72e and 72f are supplied to MIN processors M4 and M6. Data FG and FH read out from the register groups 71g and 71h through the multiplexers 72g and 72h are supplied to a MIN processor M5 and the MIN processor M6.

The outputs from the MIN processors M1, M2, M4, and M5 are supplied to a MAX processor M7, and the outputs from the MIN processors M3 and M6 are supplied to a MAX processor M8 and a MIN processor M9. The outputs from the MAX processors M7 and M8, and the MIN processor M9 are supplied to a multiplexer M10.

(5-2-B) Operation

If the number of variables is eight, membership values for eight variables are written in the register groups 71a to 71h. The controller 18 causes the multiplexer M10 to select the output from the MIN processor M9 so as to select the minimum value of the membership values for the eight variables.

If the number of variables is four, membership values for four variables are commonly written in the register groups 71a to 71d and the register groups 71e to 71h. The controller 18 controls the multiplexers 72a to 72d according to a fuzzy rule to read out the membership values necessary for IF part computations from the register groups 71a to 71d. Upon the read operation of the membership value, when the THEN part of the current fuzzy rule is the same as that of a fuzzy to be processed next, the controller 18 controls the multiplexers 72e to 72h to simultaneously read out membership values for the next THEN part processing from the register groups 71e to 71h. The controller 18 causes the multiplexer M10 to select the output from the MAX processor M8. In this manner, the minimum values of the IF part membership function values of the two fuzzy rules, and the maximum value of the two minimum values can be obtained.

When a fuzzy rule to be processed next has a different THEN part from that of a fuzzy rule to be processed after the next fuzzy rule, the controller 18 controls the multiplexers 72a to 72d to read out membership values necessary for processing the fuzzy rule to be processed next from the register groups 71a to 71d. Furthermore, the controller 18 controls the multiplexers 72e to 72g to output data (FF) of all "1"s. Then, the controller 18 causes the multiplexer M10 to select the output from the MIN processor M9. Thereafter, the same operation as described above is repeated.

If the number of variables in an IF part is two, membership values for two variables are commonly written in the register groups 71a and 71b, 71c and 71d, 71e and 71f, and 71g and 71h. The controller 18 controls the multiplexers 72a to 72h according to a fuzzy rule to read out membership values from the register groups 71a to 71h. If four fuzzy rules to be processed next include the same THEN parts, the controller 18 controls the multiplexers 72a to 72h to simultaneously read out membership values necessary for processing the four fuzzy rules from the register groups 71a to 71h, and causes the multiplexer to select the output from the MAX processor M7. Thus, the minimum values of the IF part membership function values of the four fuzzy rules and the maximum value of the plurality of minimum values can be obtained.

On the other hand, when the THEN parts of four fuzzy rules to be processed next do not coincide with each other, the controller 18 controls the multiplexers 72a and 72b, and causes the non-selected multiplexers 72c to 72h to output data (FF) of all "1"s. The controller 18 then causes the multiplexer M10 to select the output from the MIN processor M9. Thereafter, the same operation as described above is repeated.

With the above arrangement, if the number of variables in an IF part is any of 2, 4, and 8, the IF part computations can be executed at high speed by effectively utilizing the register groups 71a to 71h.

Note that the circuit shown in FIG. 37 need not always be used in the arrangements shown in FIGS. 3 and 21, and may be used in other IF part processors.

(5-3) Modification of IF part processor 25

As described above, when the IF part processor 25 shown in FIG. 21 performs computations of fuzzy rules having a small number of input variables, some circuit portions are not used, and the computation time cannot be shortened although the computation amount is small. In view of this, an IF part processor which can eliminate this drawback will be described below.

(5-3-A) Arrangement

FIG. 38 shows a circuit arrangement of the second modification of the IF part processor 25. Since the basic arrangement is the same as that shown in FIG. 21, the same reference numerals in FIG. 38 denote the same parts as in FIG. 21.

Membership values selected by the multiplexers 72a and 72b are output to a MIN processor 73a, membership values selected by the multiplexers 72c and 72d are output to a MIN processor 73b, membership values selected by the multiplexers 72e and 72f are output to a MIN processor 73c, and membership values selected by the multiplexers 72g and 72h are output to a MIN processor 73d.

Each of the MIN processors 73a and 73b outputs smaller data of the two input membership values to a MIN processor 73e. The MIN processor 73e outputs small data of the two input membership values to a MAX processor 75a through a register 74a. The MAX processor 75a obtains maximum value data to combine two or more fuzzy rules including the same THEN part into one if any, and stores the obtained maximum value data in a register 76a. The 8-bit data stored in the register 76a is output to the next stage through the tristate buffer 77, and is also fed back to the MAX processor 75a.

Each of the MIN processors 73c and 73d outputs smaller data of the two input membership values to a MIN processor 73f. The MIN processor 73f supplies smaller data of the two membership functions input from the MIN processors 73c and 73d to a MAX processor 75b through a register 74b. The MAX processor 75b obtains maximum value data to combine two or more labels of THEN parts into one according to fuzzy rules, and stores the obtained maximum value data in a register 76b. The 8-bit data held in the register 76b is supplied to the MAX processor 75a through the register 74a, and is also fed back to the MAX processor 75b.

(5-3-B) Operation

In this modification, the number of variables used in practice is assumed to be four.

Membership values for the first four variables are sequentially written in the register groups 71a to 71d. The multiplexers 72a to 72d select membership values in correspondence with control signals from the controller according to a fuzzy rule, and output the selected membership values to the MIN processors 73a and 73b. Each of the MIN processors 73a and 73b obtains a smaller one of the two membership values, and outputs the selected value to the MIN processor 73e. The MIN processor 73e outputs a smaller one of the two membership values input from the MIN processors 73a and 73b to the MAX processor 75a through the register 74a. When there are a plurality of rules having the same label of the THEN part, the MAX processor 75a obtains maximum value data to combine a plurality of rules into one.

The IF part computation result obtained in this manner is held in the register 76a. The computation result held in the register 76a is output to a processing circuit of the next stage through the tristate buffer 77, and is also fed back to the MAX processor 75a.

When the THEN part of a rule to be executed next is different from that of the currently processed rule, the controller 18 supplies a clear signal to the register 76a to clear the content of the register 76a.

Membership values for the next four variables are sequentially written in the register groups 71e to 71h. The multiplexers 72e to 72h select membership values according to a fuzzy rule, and output them to the MIN processors 73c and 73d. Each of the MIN processors 73c and 73d selects a smaller one of the two membership values, and outputs the selected value to the MIN processor 73f. The MIN processor 73f outputs a smaller one of the two membership values from the MIN processors 73c and 73d to the MAX processor 75b through the register 74b.

When there are a plurality of rules having the same label of the THEN part, the MAX processor 75b obtains maximum value data to combine a plurality of rules into one.

The IF part computation result obtained in this manner is held in the register 76b. The computation result held in the register 76b is fed back to the MAX processor 75b, and is also output to the MAX processor 75a through the register 74a.

Every time membership values for four variables are input, they are alternately held in the register groups 71a to 71d and 71e to 71h, and the same operation as described above is repetitively executed, thus realizing parallel processing.

In this modification, parallel processing is performed in units of four variables. However, the present invention is not limited to this. Parallel processing can be properly executed according to the number of variables to be able to be input and the number of actually input variables to effectively utilize the circuit, thereby shortening the time required for computations.

Note that the IF part processor shown in FIG. 38 need not always be used in the arrangement shown in FIG. 3, but may be used in other fuzzy processors (e.g., circuits which are not integrated in one chip).

(5-4) Modification having self test function

Whether or not the fuzzy logic chip 10 normally operates can be determined in such a manner that proper membership functions are set in the pattern generators, proper coordinate values are supplied to the pattern generators, and it is checked whether the final output coincides with an expectation.

However, it is not efficient that this check operation is performed by the CPU 1 itself. When coordinate values are sequentially supplied to the pattern generators, this also results in poor efficiency.

Figure 39:
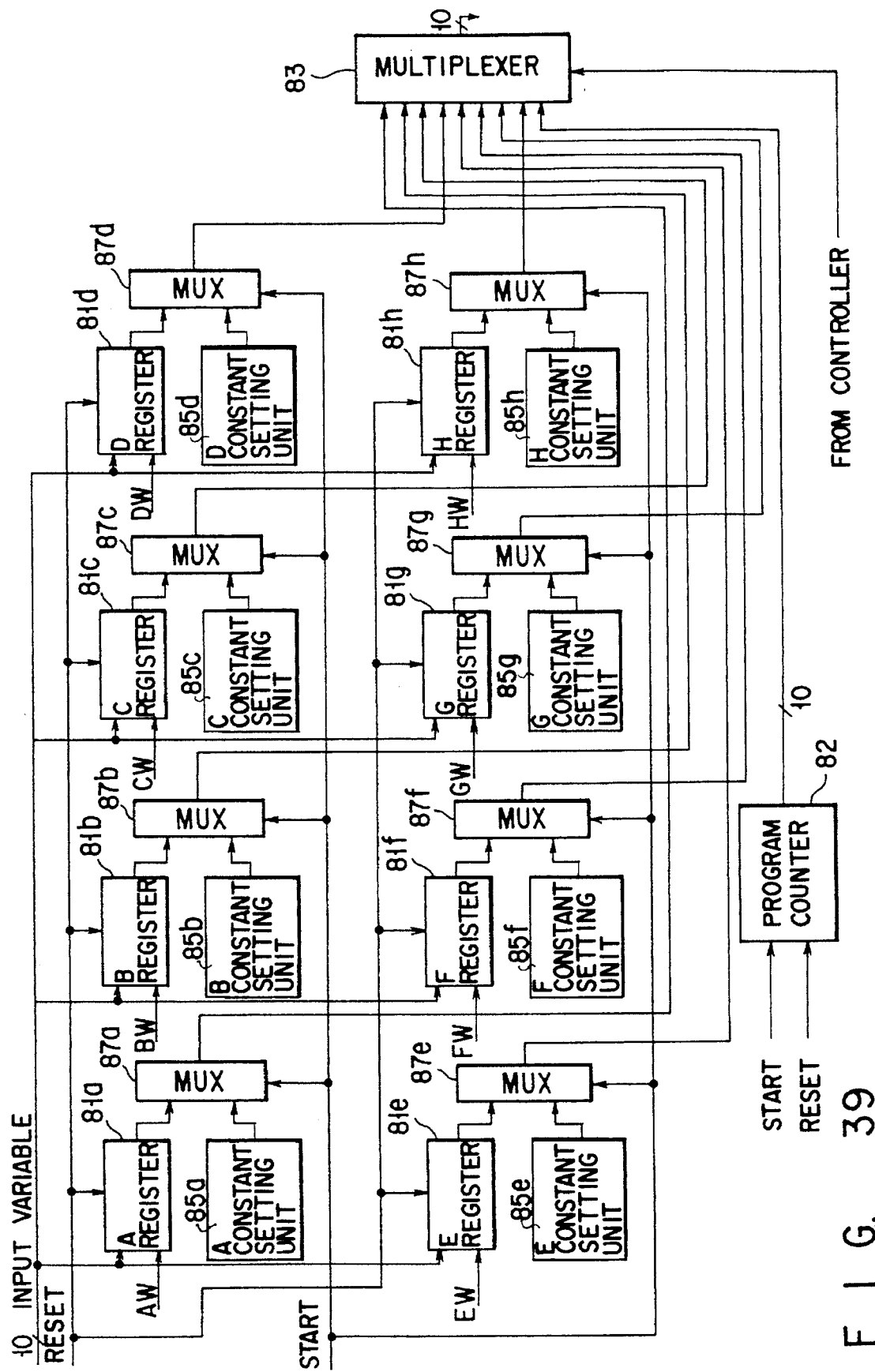
FIGS. 39 and 40 are block diagrams showing an arrangement for achieving a self test function.
Figure 40:
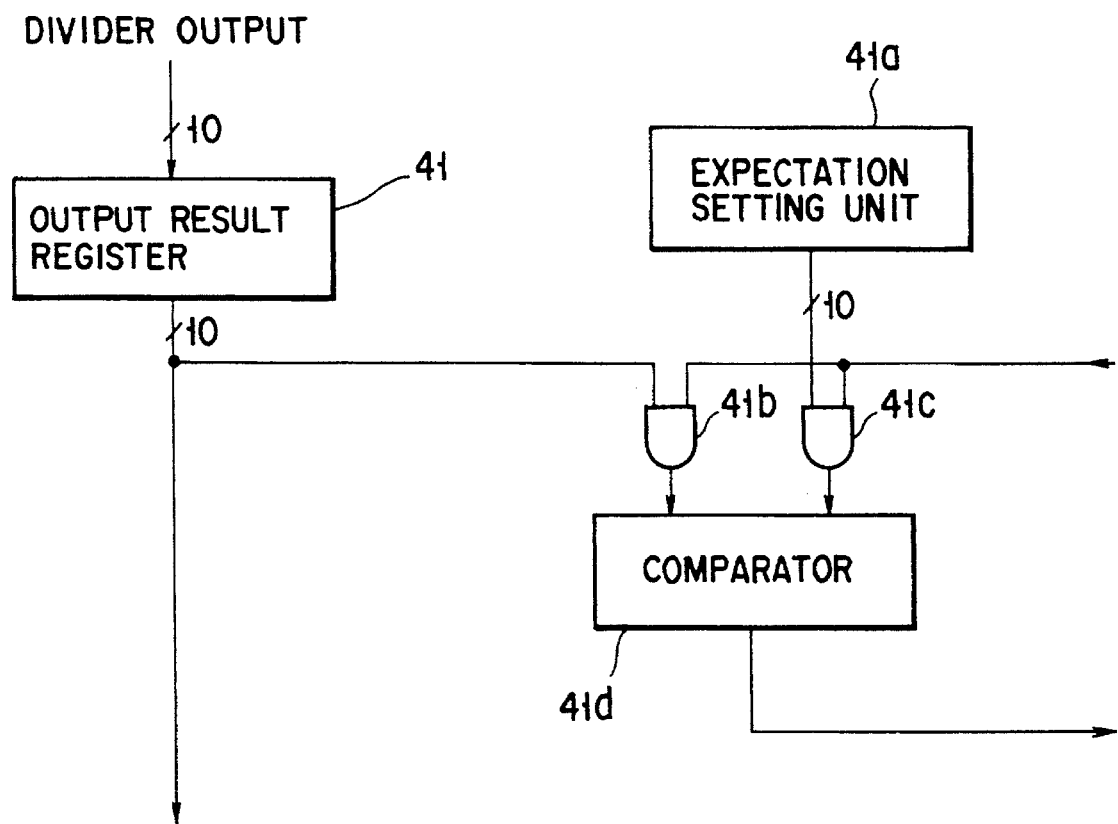

Thus, in this modification, the arrangement of the multiplexer 22 shown in FIG. 3 is modified as shown in FIG. 39, and the arrangement shown in FIG. 40 is added to the register 41 shown in FIG. 3 to facilitate the check operation of the fuzzy logic chip 10.

(5-4-A) Arrangement

The basic arrangement of FIG. 39 is similar to the arrangement shown in FIG. 22. Thus, the same reference numerals in FIG. 39 denote the same parts as in FIG. 22.

The multiplexer 22 is constituted by the A register 81a to H register 81h, the program counter 82, the multiplexer 83, an A constant setting unit 85a to H constant setting unit 85h, and multiplexers 87a to 87h.

10-bit input variables x held in the A register 81a to H register 81h are supplied to the multiplexer 83 through the multiplexers 87a to 87h. The multiplexers 87a to 87h also receive 10-bit test constants, which are set in advance in the A constant setting unit 85a to H constant setting unit 85h, and are used in a self diagnosis mode of fuzzy operations.

In FIG. 40, the register 41 holds 10-bit center of gravity data obtained by the divider 35 as a fuzzy inference result. The register 41 outputs this data to the CPU 1 through the CPU bus 11, and also outputs it to an AND gate 41b. The AND gate 41b is controlled by a start signal which goes to logic "1" in the self diagnosis mode. An expectation setting unit 41a is set with expectation data to be derived from fuzzy operations using the constants A to H set in the A constant setting unit 85a to H constant setting unit 85h. An AND gate 41c outputs expectation data from the expectation setting unit 41a when the start signal is "1". A comparator 41d compares the center of gravity data input from the register 41 through the AND gate 41b with the expectation data input from the expectation setting unit 41a through the AND gate 41c, and outputs the comparison result to the CPU 1.

(5-4-B) Operation

In the above arrangement, in a normal fuzzy operation mode, the multiplexers 87a to 87h select the 10-bit input variables x held in the A register 81a to H register 81h, and output the selected values to the multiplexer 83. In an IF part computation mode, the multiplexer 83 selects and outputs the input variables x held in the A register 81a to H register 81h. In a THEN part computation mode, the multiplexer 83 selects and outputs a count value of the program counter 82.

An operation in the self diagnosis mode will be described below.

When the CPU 1 supplies, to the controller 18, the start address of the rule memory 19 where rules for the self diagnosis test are stored, the controller 18 sequentially reads out operation-coded rule data for the self diagnosis test from the rule memory 19.

The controller 18 causes the multiplexers 87a to 87h and the multiplexer 83 to output eight constants A to H for the self diagnosis test, which are set in the A constant setting unit 85a to H constant setting unit 85h, thereby obtaining the grades of IF parts. Upon completion of IF part processing, the controller 18 starts the count operation of the program counter 82, and causes the multiplexer 83 to select the count value of the program counter 82, thus executing THEN part processing.

Finally, center of gravity data obtained in the register 41 is input to the comparator 41d through the AND gate 41b. The expectation setting unit 41a is set with expectation data to be derived from fuzzy operations using the constants A to H set in the A constant setting unit 85a to H constant setting unit 85h. The expectation setting unit 41a inputs the expectation data to the comparator 41d through the AND gate 41c. The comparator 41d compares the two data. If the two data are equal to each other, the comparator determines that the chip 10 is normal, and is set in a standby mode; otherwise, the comparator determines that the chip 10 is abnormal, and supplies an interrupt signal to the CPU 1.

Since the self diagnosis function is incorporated in the chip 10, the volume of data to be exchanged between the chip 10 and the CPU 1 upon diagnosis of fuzzy inference can be greatly decreased.

For example, assume that a fuzzy logic having no self diagnosis function requires nine data transfer operations for setting diagnosis data, and one data transfer operation for reading out a computation result. When a CPU comprises 8086 (available from Intel Corp.), 25 clocks are required per data transfer operation. Therefore, the number of clocks required for the above-mentioned data transfer operations are 250. Processing of a program for comparing the obtained value and an expectation requires at least 30 clocks. Therefore, a conventional system requires 280 clocks to diagnose the chip 10, and during this interval, the CPU cannot perform other jobs.

In contrast to this, when the arrangement having the self diagnosis function described above is employed, the time used by the CPU 1 for the self diagnosis need only be a 25-clock period required for transferring the start address, and the load on the CPU can be reduced.

Note that the self diagnosis function shown in FIGS. 39 and 40 need not always be used in the arrangement shown in FIG. 3, but may be used in combination with other fuzzy processors (e.g., circuits which are not integrated on one chip).

(5-5) Modification capable of outputting outputs from pattern generators outside chip In some cases, the function of the pattern generators 21a to 21g for generating membership functions must be tested in the fuzzy logic chip 10. However, in the above embodiment shown in FIG. 3, the outputs from the pattern generators 21a to 21g are supplied to only the ω registers 23b, 23d, 23f, 23h, 23j, 23l, and 23n, the multiplexer 24, and the IF part processor 25, and the pattern generators 21a to 21g cannot be directly tested by an external apparatus.

Thus, this modification provides a fuzzy logic chip, which can output generated membership functions outside the chip, as needed.

(5-5-A) Arrangement

Figure 41:
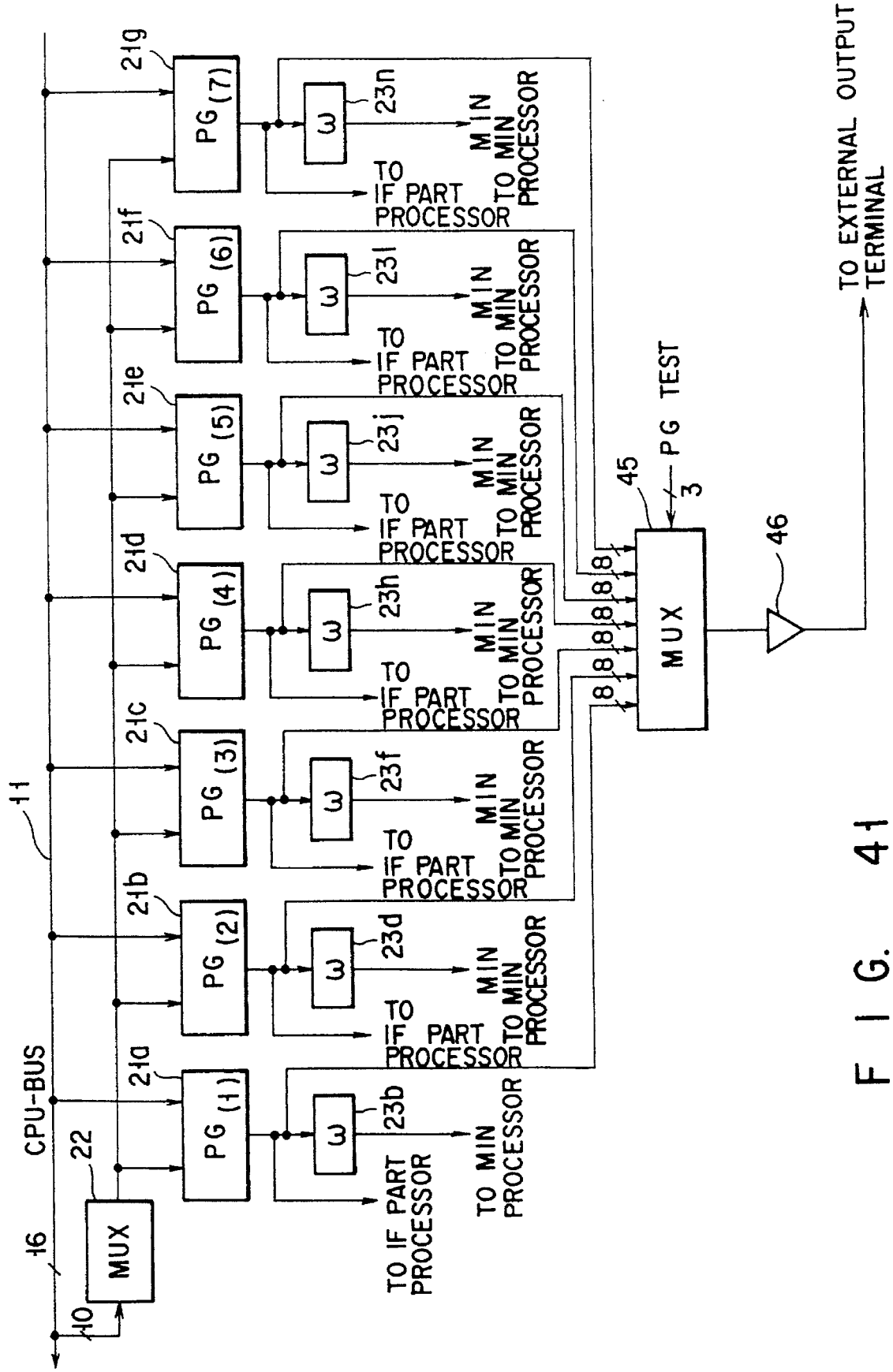
FIG. 41 is a block diagram showing an arrangement for outputting an output from the pattern generator outside the chip.

FIG. 41 is a block diagram showing the circuit arrangement of this modification, and the arrangement of a circuit for executing fuzzy inference is the same as that shown in FIG. 3.

In FIG. 41, the outputs from the pattern generators 21a to 21g are supplied to the ω registers 23b, 23d, 23f, 23h, 23j, 23l, and 23n, the multiplexer 24, and the IF part processor 25, and are also supplied to a multiplexer 45.

When the function of the pattern generators 21a to 21g is tested, the multiplexer 45 selects membership functions supplied according to a 3-bit PG test signal input from the controller 18, and outputs them to an external output terminal through a tristate buffer 46. FIG. 42 shows the circuit arrangement of the multiplexer 45. As shown in FIG. 42, the multiplexer 45 comprises a decoder 47 and multiplexers 48a to 48h. The decoder 47 decodes the 3-bit PG test signal to select one of the pattern generators 21a to 21g, and outputs the selection switching signal to the multiplexers 48a to 48h.

Each of the multiplexers 48a to 48h comprises seven AND gates and one OR gate.

The seven AND gates of the multiplexer 48a respectively receive the least significant bits (LSBs) (PG1(0) to PG7(0)) of membership function values from the pattern generators 21a to 21g, and also receive the selection switching signal from the decoder 47. The outputs from the AND gates are output as an output PGLT0 to an external terminal through the OR gate.

The seven AND gates of the multiplexer 48b respectively receive the second lower bits of the membership function values from the pattern generators 21a to 21g, and also receive the selection switching signal from the decoder 47. The AND outputs are output as an output PGLT1 to the external terminal through the OR gate.

Similarly, the AND gates of the multiplexers 48c to 48h receive the corresponding bit signals from the pattern generators 21a to 21g, and the selection switching signal from the decoder 47. The outputs from the AND gates are output as outputs PGLT2 to PGLT7 to the external terminal through the corresponding OR gates.

(5-5-B) Operation

An operation mainly controlled by the OS when the function test of the pattern generators 21a to 21g is performed will be described below.

Before execution of the function test, only a THEN part computation command is set in the rule memory 19 as test fuzzy rule data, and membership functions to be tested are respectively set in the pattern generators 21a to 21g.

In this state, for example, the OS sets the address of the rule memory 19, where the THEN part computation command for the test is stored, in the register 42 as the start address through the CPU bus 11. Then, the controller 18 accesses the rule memory 19 on the basis of the set address to load the THEN part computation command, thus executing the following operation.

The controller 18 operates the multiplexer 22 as a counter to output 10-bit data "0" to "1,023" to the pattern generators 21a to 21g. When the count values of the multiplexer 22 are input to the pattern generators 21a to 21g, the pattern generators 21a to 21g sequentially generate and output membership function values.

When the controller 18 supplies a PG test signal for selecting, e.g., the pattern generator 21a, to the multiplexer 45, the decoder 47 in the multiplexer 45 decodes this signal, and outputs a signal to the multiplexers 48a to 48h to select the output from the pattern generator 21a.

In each of the multiplexers 48a to 48h, the gate of the AND gate corresponding to the output from the pattern generator 21a is set in an open state. Thus, the bits of the membership function output from the pattern generator 21a are output as signals PGLT0 to PGLT7 to the external terminal through the AND gates and the OR gate. The membership function output from the external terminal can be checked to test the function of the pattern generator 21a.

Similarly, the controller 18 supplies PG test signals for sequentially selecting the pattern generators 21b to 21g to the multiplexer 45. In response to these signal, the multiplexer 45 sequentially outputs the membership functions (values) output from the pattern generators 21b to 21g from the external terminal. The membership functions output from the external terminal can be checked to test the functions of the pattern generators 21b to 21g.

(5-6) Modification capable of selectively outputting one of output from THEN part processor and output from center of gravity processor to circuit outside chip In the above embodiment, an output (a conclusive value by defuzzification) from the center of gravity processor 17 can be output outside the chip 10, and the fuzzy inference result as the base of calculation of this conclusive value (i.e., the output from the MAX processor 28) cannot be checked.

This modification provides a fuzzy logic chip, which can obtain a fuzzy inference result in a previous stage as well as a conclusive value such as the value of the center of gravity.

FIG. 43 shows the circuit arrangement of principal part of a fuzzy logic processor according to this modification, and other arrangements can be the same as those shown in FIG. 3.

The MAX processor 28 has the same arrangement as that shown in FIG. 3, and obtains the maximum value of the outputs from the MIN processors 26a to 26g to combine THEN part fuzzy functions, thus obtaining a fuzzy inference result. The obtained fuzzy inference result is output to a defuzzify circuit 78 and an external interface (I/F) circuit 79.

The defuzzify circuit 78 has the same arrangement as the circuit 17 shown in FIG. 3. The defuzzify circuit 78 defuzzifies the fuzzy inference result from the MAX processor 28 using, e.g., the height method, average height method, center of gravity method, or area method to obtain a conclusive value, and outputs the obtained conclusive value to the external I/F circuit 79.

The external I/F circuit 79 outputs one or both of the conclusive value from the defuzzify circuit 78 and the fuzzy inference result from the MAX processor 28 to a circuit outside the chip through the CPU bus 11 or a special-purpose external terminal in response to a control signal from the controller 18.

The external I/F circuit 78 comprises an arrangement shown in, e.g., one of FIGS. 44A to 44C.

In the arrangement shown in FIG. 44A, a multiplexer 551 selects and outputs one of the defuzzified conclusive value and the fuzzy inference result under the control of the controller 18. This output is output onto the CPU bus through a buffer 561.

In the arrangement shown in FIG. 44B, both the conclusive value and the fuzzy inference result are simultaneously output onto the CPU bus through registers 552 and 553, and buffers 562 and 563.

In the arrangement shown in FIG. 44C, both the conclusive value and the fuzzy inference result are simultaneously output onto the CPU bus through a register 554, a serial/parallel converter 555, and buffers 564 and 565. The serial/parallel converter 555 temporarily stores serial data as the fuzzy inference result, converts it into parallel data, and outputs the parallel data.

According to this modification, a value concluded by defuzzification, and a fuzzy inference result in a previous stage can be easily obtained as needed.

According to the present invention, a signal, which can be output outside the chip, is not limited to the signal of the above modification. For example, when some multiplexers are added to the arrangement shown in FIG. 3, arbitrary signals in the chip 10 can be output outside the chip as needed.

For example, in the arrangement shown in FIG. 3, when the outputs from the registers 29, 34, 40, and 41 are switched by multiplexers to be output outside the ship, a fuzzy inference value such as a moment, height, area, or center of gravity before defuzzification can be arbitrarily checked by an external circuit.

(6) Fuzzy rule-based system according to the second embodiment, in which all circuits are integrated on one chip In the above embodiment, various data are transferred between the fuzzy logic chip 10 and the external CPU 1 or the rule memory 19. For example, fuzzy rules are transferred from the rule memory 19 to the fuzzy logic chip 10. However, a data transfer operation between different chips requires a certain period of time.

This embodiment provides a fuzzy rule-based system, which can eliminate this drawback, and shortens the time required for a data transfer operation to execute high-speed fuzzy operations.

(6-A) Arrangement

Figure 45:
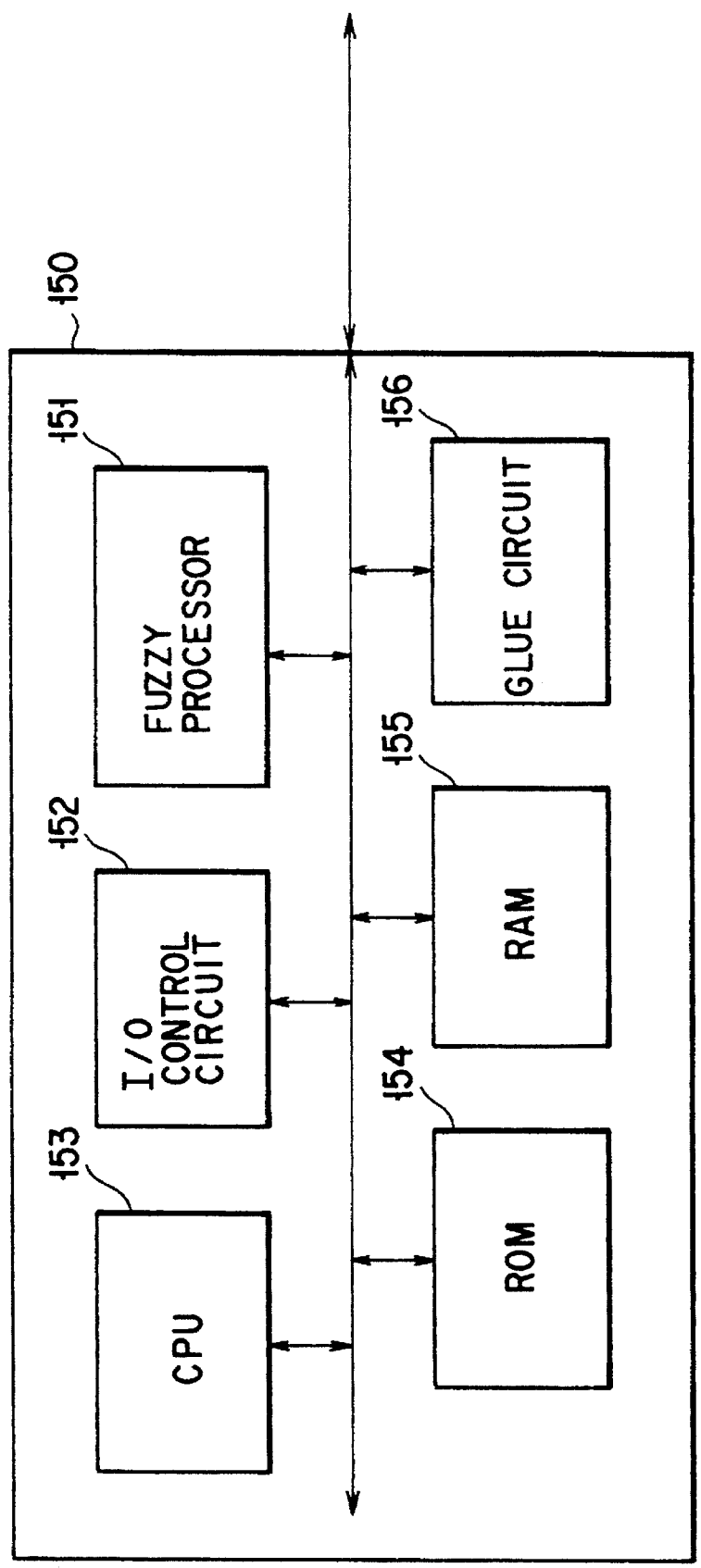
FIG. 45 is a block diagram showing an arrangement of a fuzzy rule-based system according to the second embodiment of the present invention.

FIG. 45 is a block diagram showing the overall circuit arrangement. A range denoted by 150 in FIG. 45 is integrated on one chip, and is constituted by, e.g., an ASIC or gate arrays. The chip 150 includes a fuzzy processor 151, an I/O control circuit 152, a CPU 153, a ROM 154, a RAM 155, and a glue circuit 156.

The arrangement of the fuzzy processor 151 is equivalent to the arrangement of the fuzzy logic chip 10 shown in FIGS. 2 and 3, and executes fuzzy operations under the control of the CPU 153. The I/O control circuit 152 controls data I/O operations with a circuit outside the chip 150. The ROM 154 stores a system program including a basic I/O system (BIOS). The RAM 155 is used as a shared memory, and a rule memory for storing rules for fuzzy operations. The CPU 153 controls operations of the respective circuits on the basis of the system program stored in the ROM 154. The glue circuit 156 is a circuit for connecting the fuzzy processor 151, the I/O control circuit 152, the CPU 153, the ROM 154, and the RAM 155, and comprises, e.g., logic circuits for controlling the BIOS.

Figure 46:
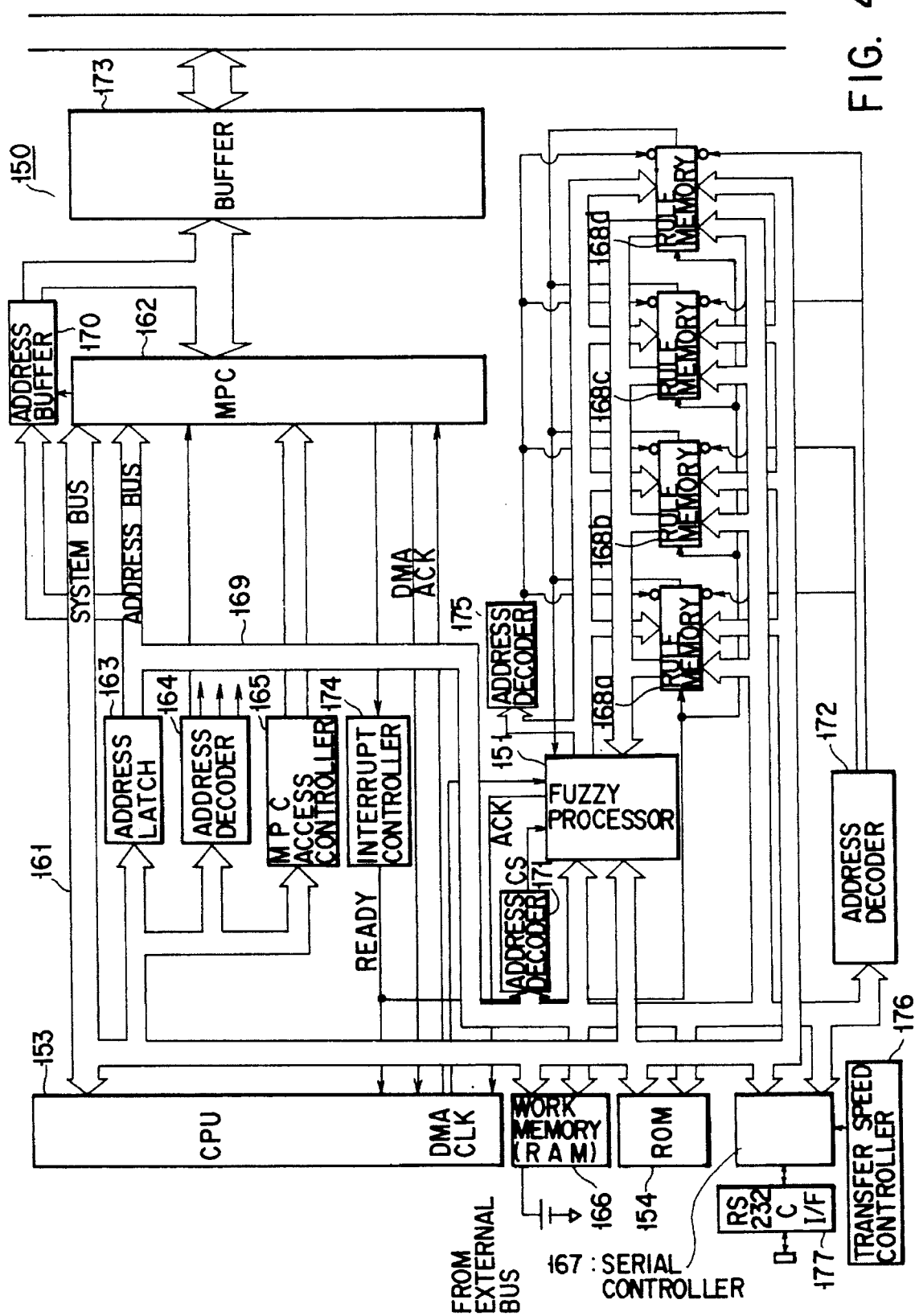
FIG. 46 is a block diagram showing the detailed arrangement of the fuzzy rule-based system shown in FIG. 45.

The detailed arrangement of the chip shown in FIG. 45 will be described below with reference to FIG. 46.

The CPU 153 is connected to an MPC (multi-bus parallel controller) 162, an address latch circuit 163, an address decoder 164, an MPC access controller 165, a work memory 166, the ROM 154, the fuzzy processor 151, a serial controller 167, and rule memories 168a to 168d through a local address-and-data bus 161.

The address latch circuit 163 latches an address supplied through the bus 161, and outputs it to an address buffer 170, an address decoder 171, the work memory 166, the fuzzy processor 151, the ROM 154, the rule memories 168a to 168d, the serial controller 167, and an address decoder 172 through an address bus 169. The address decoder 164 decodes an address input through the bus 161, and outputs a signal for selecting a memory, register, and I/O to the MPC 162. Furthermore, the address decoder 164 outputs the decode result to other circuits. The MPC access controller 165 controls an access of the MPC 162 upon reception of data from the bus 161.

The MPC 162 is an interface circuit for exchanging data between the chip 150 and external peripheral circuits. Under the control of the MPC access controller 165, the MPC 162 outputs an output signal to the address buffer 170, receives an address output from the address buffer 170, exchanges data with a buffer 173, outputs an interrupt request signal to an interrupt controller 174, and outputs a DMA signal to the CPU 153.

The buffer 173 is inserted between an external bus and the MPC 162, and exchanges data in units of blocks. The interrupt controller 174 supplies an interrupt preparation signal to the CPU 153 and the rule memories 168a to 168d on the basis of the interrupt request signal received from the MPC 162. The CPU 153 supplies an acknowledge (ACK) signal to the MPC 162 in response to the interrupt preparation signal.

The fuzzy processor 151 is enabled in response to a chip select signal from the address decoder 171, and outputs an ACK signal to the CPU 153. Thereafter, the processor 151 is operated according to operation clocks from the CPU 153. The processor 151 outputs a rule address to the rule memories 168a to 168d and an address decoder 175.

The address decoder 172 decodes a designated address input through the address bus 169 to obtain a signal for selecting one of the rule memories 168a to 168d, and supplies a fuzzy rule data write instruction signal to a selected one of the rule memories 168a to 168d. One of the rule memories 168a to 168d, which is selected by the signal from the address decoder 172 stores fuzzy rule data according to the address designated through the address bus 169, and data input through the bus 161.

The address decoder 175 decodes an address from the fuzzy processor 151 to obtain a signal for selecting one of the rule memories 168a to 168d, and supplies a read instruction signal to the selected rule memory. The rule memories 168a to 168d constitute the RAM 155 shown in FIG. 45 together with the work memory 166. One of the rule memories 168a to 168d, which is selected by the read instruction signal from the address decoder 175, outputs stored fuzzy rule data to the fuzzy processor 151 according to the address designated by the fuzzy processor 151.

The serial controller 167 constitutes the I/O control circuit 152 shown in FIG. 45 together with the buffer 173, and the like. The serial controller 167 performs data communications with devices outside the chip 150. Under the control of a transfer speed controller 176, the serial controller 167 converts data supplied through the bus 161 into serial data, and transmits the serial data to an external device through an RS232C interface 177, or converts serial data received from the external device through the RS232C interface 177 into parallel data, and supplies the parallel data onto the bus 161.

The work memory 166 is supplied with a back-up power from an external bus, and stores various processing data upon execution of fuzzy operation processing such as fuzzy rule data, membership functions, and the like.

(6-B) Operation

The operation of this embodiment will be described below with reference to FIG. 47. FIG. 47 shows processing contents from power-ON up to execution and end of fuzzy operations, and operation control is made by the CPU 153.

In an early power-ON state, the CPU 153 loads the BIOS stored in the ROM 154 (step S1). The CPU 153 loads parameters of the membership functions into the backed-up work memory 166 on the basis of the BIOS (step S2). The above processing is executed by the BIOS upon power-ON. Thereafter, the CPU 153 checks if a preparation signal is supplied from the external bus through the buffer 173, the MPC 162, and the controller 174, and waits until the preparation signal is supplied, i.e., until fuzzy operations are requested (step S3).

In response to the preparation signal supplied from the interrupt controller 174, the CPU 153 supplies a selection signal to the fuzzy processor 151 through the address latch circuit 163 and the address decoder 171. When the fuzzy processor 151 sends back an ACK signal to the CPU 153 in response to the selection signal (step S4), the CPU 153 loads the parameters of membership functions into the fuzzy processor 151 through the bus 161 (step S5).

The CPU 153 writes the start address of an area of the rule memories 168a to 168d, where desired fuzzy rules are stored, in the fuzzy processor 151. The fuzzy processor 151 starts computation processing in response to this start address (step S6).

The fuzzy processor 151 outputs the start address to one of the rule memories 168a to 168d, and reads out and fetches operation-coded fuzzy rule data from the area designated by the start address. The fuzzy processor 151 repeats this operation until the read operation of operation-coded fuzzy rule data is ended. Thereafter, the fuzzy processor 151 executes fuzzy operation processing according to the fetched fuzzy rules. Upon completion of the fuzzy operations, the fuzzy processor 151 interrupts the interrupt controller 174. The interrupt controller 174 outputs an interrupt request to the CPU 153 in response to the interrupt signal from the fuzzy processor 151.

If there are a plurality of membership functions, the CPU 153 does not determine the end of fuzzy operations until it receives the interrupt request (step S7), and repeats the processing in step S3 to S7 while temporarily storing intermediate computation result data in the rule memories 168a to 168d.

When the CPU 153 receives the interrupt request from the interrupt controller 174, it determines the end of fuzzy operations, and sends an ACK signal to the MPC 162. Furthermore, the CPU 153 executes an interrupt routine in the BIOS to read out a computation result of the fuzzy operations from the fuzzy processor 151, and outputs the result onto the external bus through the MPC 162 and the buffer 173. Thus, this processing is ended.

As described in detail above, according to this embodiment, fuzzy inference computations can be performed without performing a data transfer operation between the fuzzy logic chip and an external circuit. Therefore, the time required for computations can be greatly shortened.

(7) Fuzzy rule-based system according to the third embodiment, in which only IF part processor and THEN part membership function generator are integrated on one chip As shown in FIGS. 2 and 3, when a circuit for generating IF and THEN part membership functions, and a computation processing circuit for performing computation processing using the IF and THEN part membership functions are constituted by hardware, the circuit scale can be reduced, and the computation speed can be increased. However, since a fuzzy logic algorithm depends on only hardware, relatively limited processing can only be performed, and the degree of freedom is decreased. In particular, as for computations of THEN part membership functions, computations methods such as the average height method, the area method, the center of gravity method, and the like have unique features, i.e., respectively place importance on different points such as speed, accuracy, and the like. Thus, different computation methods must be employed according to objects to be controlled. For this reason, when the above-mentioned circuits are constituted by hardware together with other circuits, the application range of the system is limited.

In order to solve this problem, according to this embodiment, a fuzzy rule-based system, excluding a THEN part computation processing circuit, is arranged as hardware, so that the circuit scale can be reduced, and the computation speed of IF part computations can be increased, while THEN part computations can have a high degree of freedom.

(7-A) Arrangement

This embodiment will be described below with reference to FIG. 48.

In FIG. 48, reference numeral 211 denotes a one-chip IF part computation processor, which includes a register 212 and a counter 213, which are connected to a system bus SB, an IF part membership function generator 214, an IF part processor 215, and a THEN part membership function generator 216. The chip 211 is constituted by, e.g., an ASIC or gate arrays.

The register 212 holds parameters and numerical values for defining membership functions, which are sent through the system bus SB, and outputs the held values to the IF part membership function generator 214.

The IF part membership function generator 214 generates IF part membership functions according to the input variables, and outputs these functions to the IF part processor 215. The IF part processor 215 calculates the grades of the IF part membership functions generated by the IF part membership function generator 214, and also calculates the minimum value of the obtained grades. The processor 215 outputs a computation result to a THEN part computation processor 220 outside the IF part computation processor 211.

Figure 49:
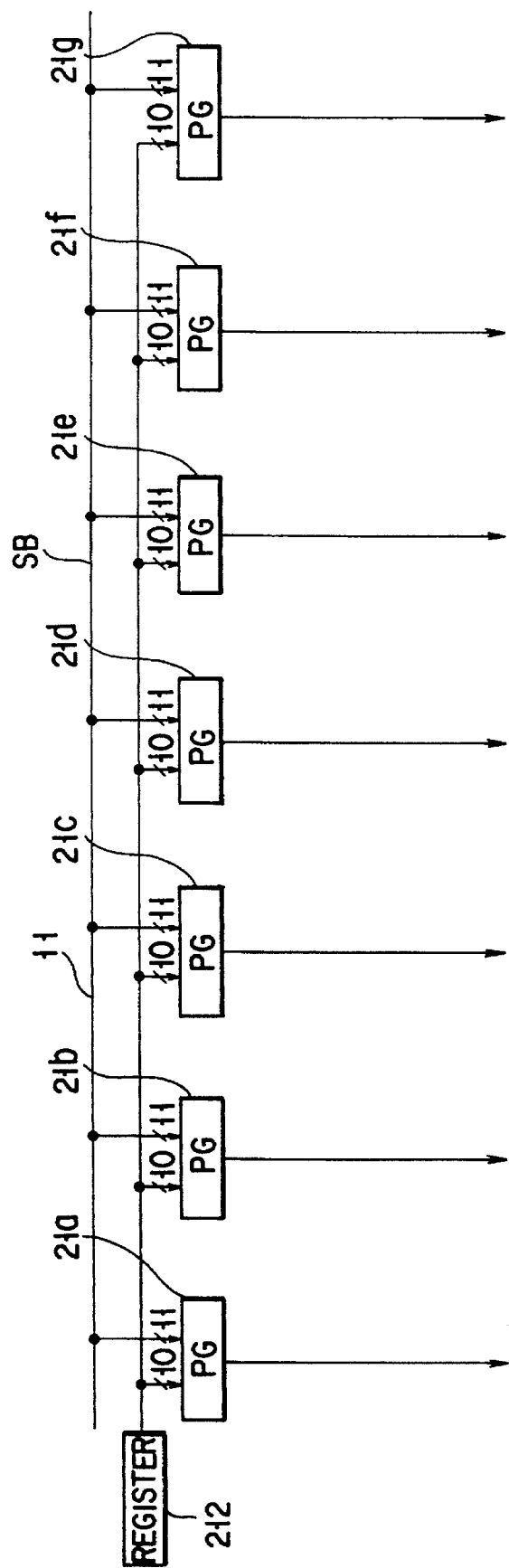
FIG. 49 is a block diagram showing an arrangement of a membership function generator shown in FIG. 48.

As the IF part membership function generator 214 and the IF part processor 215, as shown in, e.g., FIG. 49, the same arrangement as that of the pattern generators shown in FIG. 3 can be employed. In the arrangement shown in FIG. 49, a CPU (not shown) sets the parameters of membership functions in pattern generators 21a to 21g through the system bus SB, and the register 212 supplies variable values to the pattern generators 21a to 21g. The pattern generators 21a to 21g output corresponding membership function values.

The counter 213 sets numerical data supplied from the system bus SB as an initial value, and counts up or down the initial value in response to clock pulses. The count value of the counter 213 is output to the THEN part membership function generator 216. The THEN part membership function generator 216 continuously generates THEN part membership function values according to the count values from the counter 213, and directly outputs the values to the THEN part computation processor 220 outside the IF part computation processor 211. The THEN part membership function generator 216 also comprises the pattern generators shown in, e.g., FIG. 49.

The THEN part computation processor 220 executes THEN part computation processing based on an arbitrary computation method using the IF part computation results supplied from the IF part processor 215 in the IF part computation processor 211, and the THEN part membership functions supplied from the THEN part membership function generator 216, and outputs the obtained computation result to an object to be controlled (not shown).

(7-B) Operation

In the above-mentioned arrangement, when input variables are supplied to the register 212 and the counter 213 through the system bus SB, the register 212 holds the input variables, and outputs them to the IF part membership function generator 214. The IF part membership function generator 214 generates membership functions corresponding to the input variables on the basis of a plurality of coordinate data, which are set in advance, and outputs the functions to the IF part processor 215. The IF part processor 215 calculates the grades corresponding to the variable values supplied from the register 212 using the IF part membership functions from the IF part membership function generator 214, and outputs the obtained grades to the THEN part computation processor 220 outside the processor 211.

The counter 213 fetches numerical value data from the system bus SB, and sets it as an initial count value. Thereafter, the counter 213 updates the count value in response to external clock pulses, and outputs the updated count values to the THEN part membership function generator 216. The THEN part membership function generator 216 generates continuous THEN part membership function values according to the count values from the counter 213, and outputs the generated values to the THEN part computation processor 220.

The THEN part computation processor 220 realizes a THEN part computation method according to a requirement of an object to be controlled, e.g., a "height method" placing an importance on the computation speed, by software. More specifically, the THEN part computation processor 220 executes THEN part computations in a software manner on the basis of the IF part grades supplied from the IF part processor 215 and the grades of continuous THEN part membership functions supplied from the THEN part membership function generator 216, and outputs the obtained computation result to the object to be controlled.

According to the above arrangement, the circuit scale can be reduced, the computation speed for IF part computations can be increased, and THEN part computations can have a high degree of freedom.

(8) Fuzzy rule-based system according to the fourth embodiment, in which MAX-MIN processor, and center of gravity computation adder/multiplier are integrated on one chip As described above, when a circuit for generating IF and THEN part membership functions, and a computation processing circuit for performing computation processing using the IF and THEN part membership functions are constituted by hardware, the circuit scale can be reduced, and the computation speed can be increased. However, since a fuzzy logic algorithm depends on only hardware, relatively limited processing can only be performed, and the degree of freedom is decreased.

In order to solve this problem, in this embodiment, a MAX-MIN processor and an adder/multiplier for computing the center of gravity are integrated on one chip, so that IF part computations are performed outside the chip, and computation results of these circuits can be output outside the chip, thus assuring a desired degree of freedom.

(8-A) Arrangement

FIG. 50 shows a schematic circuit arrangement of this embodiment. In FIG. 50, reference numeral 311 denotes an LSI chip. In this LSI chip 311, a maximum/minimum (MAX-MIN) processor 312 and a center of gravity computation adder/multiplier 313, which are connected to a data bus DB, are formed. The LSI chip 311 is constituted by, e.g., an ASIC or gate arrays. The MAX-MIN processor 312 (i) obtains the grades of IF part membership functions in units of rules on the basis of variable values of membership functions supplied from a circuit outside the LSI chip 311, (ii) obtains the minimum values of the obtained grades in units of rules, (iii) modifies THEN part membership functions by the minimum values in units of rules, and (iv) obtains the maximum value of the modified membership functions to obtain a new membership function. The obtained new membership function is supplied to the center of gravity computation adder/multiplier 313. The center of gravity computation adder/multiplier 313 performs additions and multiplications in defuzzification computations using the new membership function from the MAX-MIN processor 312 to obtain area data and moment data, and outputs these data to an external circuit through the data bus DB.

The LSI chip 311 is connected, through the bus, to a CPU 301 for controlling the operation of the LSI chip 311, and a memory 303 for storing variable values (x-coordinate values) and grades (y-coordinate values) in units of membership functions in the form of a table.

Figure 51:
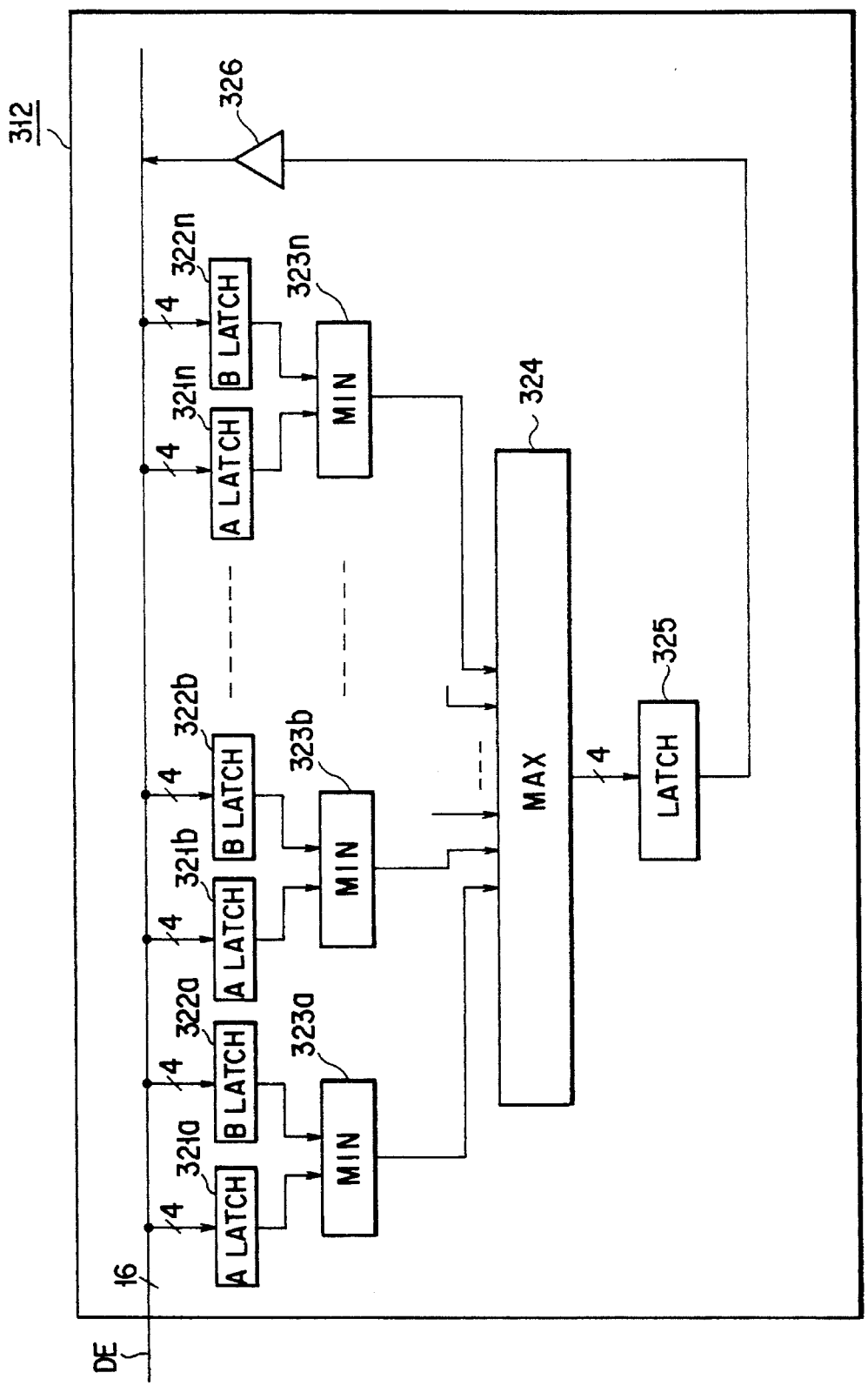
FIG. 51 is a block diagram showing an arrangement of a MAX-MIN processor shown in FIG. 50.

FIG. 51 shows a circuit arrangement of the MAX-MIN processor 312. Numerical data supplied through the data bus DB are latched by A latch circuits 321a to 321n and B latch circuits 322a to 322n. The contents of the A latch circuits 321a to 321n and the B latch circuits 322a to 322n are read out to MIN processors 323a to 323n. Each of the MIN processors 323a to 323n selects data having a smaller numerical value of the two input data. The outputs from the MIN processors 323a to 323n are supplied to a MAX processor 324. The MAX processor 324 selects the largest numerical value from the supplied data. The output from the MAX processor 324 is output onto the data bus DB through a latch circuit 325 and a tristate buffer 326.

FIG. 52 shows a circuit arrangement of the adder/multiplier 313. The output data supplied from the MAX-MIN processor 312 through the data bus DB is input to a latch circuit 331 and multiplexers 336 and 339. The latch circuit 331 latches data from the data bus DB, and outputs it to a multiplier (MUL) 333. The multiplier 333 also receives a count value from a counter 332, which is set with an initial value based on data from the data bus DB to execute a count operation. The multiplier 333 multiplies the two inputs, and outputs the product data to an adder 335.

The multiplexer 336 selects one of data from the data bus DB and sum data output from the adder 335, and outputs the selected data to a latch circuit 337. The latch circuit 337 latches the output from the multiplexer 336. The latch circuit 337 outputs the latched content to the data bus DB through a tristate buffer 338, and also outputs it to the adder 335. The adder 335 adds the product data from the multiplier 333 and the latched output from the latch circuit 337, and supplies the sum data to the multiplexer 336, as described above.

The multiplexer 339 selects one of data from the data bus DB and sum data output from an adder 334, and outputs the selected data to a latch circuit 340. The latch circuit 340 latches the output from the multiplexer 339. The latch circuit 340 outputs the latched content onto the data bus DB through a tristate buffer 341, and also outputs it to the adder 334. The adder 334 adds the output from the latch circuit 331, and the output from the latch circuit 340, and outputs the sum data to the multiplexer 339, as described above.

(8-B) Operation

Upon execution of fuzzy operations, the CPU 301 accesses the memory 303 by detection data (e.g., a temperature) from a sensor to read out the grades of corresponding membership functions.

The CPU 301 obtains minimum values of the readout grades in units of fuzzy rules. The CPU 301 causes the B latch circuits 322a to 322n to latch the minimum values obtained in units of fuzzy rules. For example, the CPU 301 causes the B latch circuit 322a to latch the minimum value of the grades of the IF part membership functions of Rule 1, and causes the B latch circuit 322b to latch the minimum value of the grades of the IF part membership functions of Rule 2.

The CPU 301 then starts a count operation, and addresses the memory 303 by a count value to obtain the grades of THEN parts in units of fuzzy rules. The CPU 301 supplies the obtained grades to the MAX-MIN processor 312 through the data bus DB. The grades are latched by the A latch circuits 321a to 321n. For example, the grade (function value) of the THEN part membership function of Rule 1 is latched by the A latch circuit 321a, and the grade of the THEN part membership function of Rule 2 is latched by the A latch circuit 321b.

Each of the MIN processors 323a to 323n selects the minimum value of the supplied data. This operation corresponds to processing for modifying the peak of a THEN part membership function using the minimum value of the function values of IF part membership functions. The outputs from the MIN processors 323a to 323n are supplied to the MAX processor 324.

The MAX processor 324 selects the maximum value of the supplied data. This operation corresponds to processing for combining THEN part membership functions. The computation result of the MAX processor 324 is supplied to the data bus DB through the latch circuit 325 and the tristate buffer 326. The CPU 301 fetches this data.

The CPU 301 then updates the count value to address the memory 303, thereby obtaining the function values of THEN part membership functions. The CPU 301 sets the obtained function values in the A latch circuits 321a to 321n. Thereafter, the same operation is repeated.

With the above operation, the maximum values (combined values) of the grades of the THEN part membership functions when, e.g., an x-coordinate is updated like 0, 1, 2, . . . , are sequentially output from the MAX processor 324 onto the data bus DB.

The output from the MAX processor 324 is also supplied to the adder/multiplier 313 through the data bus.

The latch circuit 331, the counter 332, the multiplier 333, the multiplexer 336, the latch circuit 337, and the adder 335 calculate moment data of the combined THEN part membership function, and the multiplexer 339, the latch circuit 340, and the adder 334 calculate area data of the combined THEN part membership function.

More specifically, the THEN part membership function value (height data) output from the MAX-MIN processor 312 is latched by the latch circuit 331. When the first membership function value is latched by the latch circuit 331, the counter 332 starts a count operation. The count value of the counter 332 is equal to a variable value (x-coordinate value) when the height data latched by the latch circuit 331 is obtained.

The multiplier 333 multiplies the membership function value (height) latched by the latch circuit 331 with the count value (x-coordinate value) of the counter 332. The adder 335 adds the output from the multiplier 333 to the value of the latch circuit 337 whose initial value is "0", and outputs the sum to the CPU 301 through the multiplexer 336, the latch circuit 337, and the data bus DB.

The adder 334 adds the height data held in the latch circuit 331 and the value of the latch circuit 340 whose initial value is "0", and outputs the sum to the CPU 301 through the multiplexer 339, the latch circuit 340, and the data bus DB.

When the next height data of a THEN part is output from the MAX-MIN processor 312, this data is latched by the latch circuit 331, and the counter 332 updates the count value. Thereafter, the same operation is repeated.

In this manner, the adder 335 calculates an accumulation value of the products of height data and coordinate value data, i.e., a moment, and the adder 334 calculates an accumulation value of height data, i.e., an area.

The CPU 301 may directly use the moment and area data supplied through the data bus as fuzzy inference results, or may divide the moment data with the area data, and may use the quotient data (i.e., center of gravity data) as a fuzzy inference result.

In this manner, in this embodiment, the LSI chip 311 comprises only the MAX-MIN processor 312 and the center of gravity computation adder/multiplier 313. Other processing operations necessary for fuzzy inference are executed outside the LSI chip 311, e.g., by software. Therefore, this embodiment can cope with a fuzzy controller whose specifications considerably change depending on fuzzy rules and membership functions, thus improving versatility.

In the above arrangement, the outputs from the MAX processor 324 are sequentially output onto the data bus DB, and intermediate results of moment and area data can be output onto the data bus DB by controlling the buffers 338 and 341. Therefore, these intermediate results may be checked during debugging or system evaluation. Thus, debugging or system evaluation can be easily and reliably performed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A one-chip fuzzy processing apparatus integrated on a one-chip semiconductor device, comprising:

a receiving circuit for receiving values of variables of IF part membership functions supplied from an external circuit;

a membership function generator for generating IF part membership function intermediate values and THEN part membership function intermediate values, and IF part membership function values and THEN part membership function values from the generated IF part membership function intermediate values and the THEN part membership function intermediate values, respectively;

an IF part grade calculator for receiving variables received by said receiving circuit and the IF part membership function values generated by said membership function generator and for calculating grades of said IF part membership function values corresponding to values of said variables received by said receiving circuit;

a feedback circuit to feedback an output of said IF part grade calculator to said membership function generator to cause said membership function generator to generate the THEN part membership function values;

combining circuit for modifying said THEN part membership function values using IF part grades calculated by said IF part grade calculator, and combining modified membership function values; and a defuzzifier for defuzzifying an output from said combining circuit.

2. The apparatus according to claim 1, wherein said combining circuit comprises a maximum/minimum processor including:

a circuit for calculating a minimum value of grades of IF part membership functions for each fuzzy rule;

a circuit for comparing an obtained minimum value with a THEN part membership function for each fuzzy rule to cut a peak of the THEN part membership function; and maximum processing circuit for performing maximum processing for combining the modified THEN part membership functions by calculating a maximum value of the modified THEN part membership functions.

3. The apparatus according to claim 1, wherein said defuzzify circuit includes a circuit for calculating at least one of an area, a center of gravity, a moment, an average height, and a maximum height of the membership function combined by said combining circuit.

4. The apparatus according to claim 1, wherein said membership function generator comprises:

a counter for sequentially outputting count values; and a circuit for sequentially outputting grades of THEN part membership functions using the count values from said counter as x-coordinate values.

5. The apparatus according to claim 4, wherein said combining circuit comprises a maximum/minimum processor including:

IF part processor for calculating minimum values of grades of IF part membership functions in units of fuzzy rules;

minimum value selector for comparing the minimum values calculated by said IF part processor with the grades of the corresponding THEN part membership functions, and selecting and outputting smaller grades; and maximum value selector for selecting and outputting maximum values of the grades output form said minimum value selector.

6. The apparatus according to claim 5, wherein said defuzzifier comprises:

moment calculator including a counter for outputting a value equal to a value obtained by delaying the count value of said counter by a predetermined period of time, a multiplier for multiplying an output from said counter with an output from said maximum value selector, and an accumulator for accumulating outputs from said multiplier;

area calculator including an accumulator for accumulating outputs from said maximum value selector; and a divider for dividing a moment calculated by said moment calculator with an area calculated by said area calculator to obtain a quotient.

7. The apparatus according to claim 1, wherein said one-chip semiconductor device further comprises:

a receiver for receiving an external instruction signal, and reading out fuzzy rules from a rule memory arranged outside said one-chip semiconductor device; and a controller for controlling operations of said combining circuit and said defuzzifier in response to the readout fuzzy rules.

8. The apparatus according to claim 1, further comprising a gate circuit for outputting at least one of outputs from said IF part grade calculator, said membership function generator, and said combining circuit to a circuit outside said one-chip semiconductor device.

9. A one-chip fuzzy processing apparatus integrated on a one-chip semiconductor device, comprising:

a receiver for receiving values of IF part membership functions supplied from an external circuit;

a membership function generator for generating IF part membership function intermediate values and THEN part membership function intermediate values, and IF part membership function values and THEN part membership function values from the generated IF part membership function intermediate values, respectively, the membership function generator including a counter for sequentially outputting current values; and a circuit for sequentially outputting grades of THEN part membership functions using the count values from the counter as x-coordinate values;

IF part grade calculator for receiving variables received by the receiver and the IF part membership function values generated by the membership function generator and for calculating grades of the IF part membership function values corresponding to values of the variables received by the receiver;

a combining circuit for modifying the THEN part membership function values using IF part grades calculated by the IF part grade calculator, and combining modified membership function values; and a defuzzifier for defuzzifying the modified membership function values from the combining circuit by using the IF part membership function intermediate values and THEN part membership function intermediate values.

10. A one-chip fuzzy processing apparatus integrated on a one-chip semiconductor device, comprising:

a receiving circuit for receiving values of variables of IF part membership functions supplied from an external circuit;

a membership function generator for generating IF part membership function intermediate values and THEN part membership function intermediate values, and IF part membership function values and THEN part membership function values from the generated IF part membership function intermediate values and the THEN part membership function intermediate values, respectively;

an IF part grade calculator for receiving variables received by said receiving circuit and the IF part membership function values generated by said membership function generator and for calculating grades of said IF part membership function values corresponding to values of said variables received by said receiving circuit;

a feedback circuit to feedback an output of said IF part grade calculator to said membership function generator to cause said membership function generator to generate the THEN part membership function values;

a combining circuit for modifying said THEN part membership function values using IF part grades calculated by said IF part grade calculator, and combining modified membership function values; and a defuzzifier for defuzzifying an output from said combining circuit by calculating at least one of a center of gravity and an average height of the membership function combined by the combining circuit.

* * * * *